United States Patent
Yamaguchi et al.

(10) Patent No.: US 7,636,387 B2
(45) Date of Patent: *Dec. 22, 2009

(54) MEASURING APPARATUS AND MEASURING METHOD

(75) Inventors: Takahiro Yamaguchi, Tokyo (JP);
Masahiro Ishida, Tokyo (JP); Mani Soma, Seattle, WA (US); Hirobumi Musha, Tokyo (JP)

(73) Assignee: Advantest Corporation, Tokyo (JP)

( * ) Notice: Subject to any disclaimer, the term of this patent is extended or adjusted under 35 U.S.C. 154(b) by 983 days.

This patent is subject to a terminal disclaimer.

(21) Appl. No.: 10/776,926

(22) Filed: Feb. 11, 2004

(65) Prior Publication Data
US 2005/0031029 A1 Feb. 10, 2005

Related U.S. Application Data

(63) Continuation of application No. PCT/IB03/01997, filed on Feb. 26, 2003, which is a continuation of application No. 10/265,349, filed on Oct. 4, 2002, now abandoned, which is a continuation-in-part of application No. PCT/US02/05901, filed on Feb. 26, 2002.

(51) Int. Cl.
*H04B 3/46* (2006.01)
(52) U.S. Cl. .................. 375/224; 375/371; 375/226
(58) Field of Classification Search .................. 375/224, 375/226, 227, 294, 327, 326, 371, 373, 375, 375/376, 324; 324/761.9
See application file for complete search history.

(56) References Cited

U.S. PATENT DOCUMENTS

| | | | | |
|---|---|---|---|---|
| 5,036,298 | A | * | 7/1991 | Bulzachelli .................. 331/23 |
| 5,115,452 | A | * | 5/1992 | Cupo .......................... 375/232 |
| 5,418,789 | A | | 5/1995 | Gersbach et al. ............ 371/5.2 |
| 5,512,860 | A | * | 4/1996 | Huscroft et al. ............. 331/1 A |
| 5,796,231 | A | * | 8/1998 | Kyodo ......................... 318/608 |
| 5,835,501 | A | * | 11/1998 | Dalmia et al. ............... 714/704 |

(Continued)

FOREIGN PATENT DOCUMENTS

JP          05-316474          11/1993

(Continued)

OTHER PUBLICATIONS

Digital Line Systems Based on the Synchronous Digital hierarchy for Use on Optical Fibre Cables, ITU-T Recommendation G-958, dated Nov. 1994, 26 pages.

(Continued)

*Primary Examiner*—Emmanuel Bayard
(74) *Attorney, Agent, or Firm*—Osha • Liang LLP

(57) ABSTRACT

A measuring apparatus including a timing jitter estimator which estimates an output timing jitter sequence which indicates the output timing jitter of an output signal based on an output signal output from a DUT in response to an input signal input to the DUT, and a jitter transfer function estimator which estimates a jitter transfer function in the DUT based on the output timing jitter sequence. The jitter transfer function estimator includes an instantaneous phase noise estimator which estimates an instant phase noise of the output signal based on an output signal, and a resampler which generates the output timing jitter sequence by resampling the instantaneous phase noise at predetermined timing.

53 Claims, 58 Drawing Sheets

U.S. PATENT DOCUMENTS

| | | | | |
|---|---|---|---|---|
| 5,872,819 | A * | 2/1999 | Carsello et al. | 375/355 |
| 6,137,830 | A * | 10/2000 | Schneider et al. | 375/224 |
| 6,356,129 | B1 * | 3/2002 | O'Brien et al. | 327/175 |
| 6,664,828 | B2 * | 12/2003 | Gauthier et al. | 327/157 |
| 6,697,445 | B1 * | 2/2004 | Wong | 375/376 |
| 6,735,259 | B1 * | 5/2004 | Roberts et al. | 375/316 |
| 6,754,613 | B2 * | 6/2004 | Tabatabaei et al. | 702/189 |
| 6,768,954 | B2 * | 7/2004 | Niijima | 702/69 |
| 6,782,404 | B2 * | 8/2004 | Choudhary | 708/300 |
| 7,012,982 | B1 | 3/2006 | Basch et al. | |
| 7,054,358 | B2 * | 5/2006 | Yamaguchi et al. | 375/226 |
| 7,227,913 | B1 * | 6/2007 | Hein et al. | 375/327 |
| 7,305,025 | B2 * | 12/2007 | Yamaguchi et al. | 375/226 |
| 2003/0063701 | A1 * | 4/2003 | Eubanks | 375/376 |
| 2008/0212730 | A1 * | 9/2008 | Tang et al. | 375/376 |

FOREIGN PATENT DOCUMENTS

| | | |
|---|---|---|
| JP | 8-50156 A | 2/1996 |
| JP | 8-248078 A | 9/1996 |
| JP | 11-83924 A | 3/1999 |
| WO | 00/46606 | 8/2000 |
| WO | 01/069328 | 9/2001 |

OTHER PUBLICATIONS

Jitter and wander measruing equpipment for digital systems which are abased on the synchronous digital hierarchy (SDH), ITU-T Recommendation 0.172, dated Mar. 1999, 38 pages.

SONET OC-192 Transport system Generic Criteria, GR-1377-CORE, Issue 5, dated Dec. 1998, 104 pages.

The control of jitter and wander within digital networks which are based on the synchronous digital hierarchy (SDH) ITU-Trecommendation G.825, dated Mar. 2000, 22 pages.

E.A. Lee and D.G. Messerschmitt, Digital Communication, 2nd Edition, 5 pages, 1994.

International Search Report, dtaed Oct. 1, 2003, 3 pages.

Miller, C.M. et al., "Jitter Analysis of High-Speed Digital Systems", Hewlett-Packard Journal, Hewlett-Packard Co., Palo Alto, US, vol. 46, No. 1, Feb. 1, 1995, pp. 49-56.

Yamaguchi, T.J. et al., "Extraction of peak-to-peak and RMS sinusoidal jitter using an analytic signal method"; VSLI TestSymposium 2000. Proceedings. 18th IEEE Montreal, Que., Canada Apr. 30-May 4, 2000, Los Alamitos, CA, USA, IEEE Comput. SOC, US Apr. 30, 2000, pp. 395-402.

Baldini J.J. et al. "Jitter in digital transmission systems—characteristics and measurement techniques" Global Telecommunications Conference. Miami, Nov. 29-Dec. 2, 1982, New York, I.E.E.E., US vol. 2 conf. 1982, Nov. 1982 pp. 658-664.

Yamaguchi, T.J. et al. "Jitter measurements of a power-pc microprocessor using an analytic signal method", International Test Conference 2000, Oct. 3-5, 2000 5 pages.

International Search Report dated May 20, 2003 (1 page).

Office Action dated Dec. 9, 2008 issued by the Japanese Patent Office in Application No. 2003/572235, with English translation, 14 pages.

English language abstract of Japanese Publication No. 05-316474 dated Nov. 26, 1993, esp@cenet, 1 page.

Office Action dated Oct. 14, 2008 issued by the German Patent & Trademark Office in corresponding Application No. 2959526, 12 pages.

Yamaguchi, T.J., et al, "Extraction of Peak-to-Peak and RMS Sinusoidal Jitter Using an Analytic Signal Method" 18th IEEE VLSI Test Symposium 2000, Montreal Apr. 30, 2000, 8 pages.

Miller, C.M., et al., "Jitter Analysis of High-Speed Digital Systems" Hewlett-Packard Journal, vol. 46, Feb. 1995, 8 pages.

Baldini, J.J., et al., Jitter in Digital Transmission Systems—Characteristics and Measure Techniques, IEEE Global Telecommunication Conference, Miami, New York: IEEE, vol. 23 CONF., Nov. 1982, 7 pages.

Co, Ramon S., Mulligan, J. H.; Optimization of Phase-Locked Loop Performance in Data Recovery Systems, IEEE Journal of Solid-State Circuits, vol. 29, No. 9, Sep. 1994; pp. 1022-1054.

Hajimiri, Ali, Limotyrakis, Sotirios, and Lee, Thomas H.; Jitter and Phase Noise in Ring Oscillators; IEEE Journal of Solid-State Circuits, vol. 34, No. 6, Jun. 1999; pp. 790-804.

* cited by examiner

FIG. 27

```
xⱼ(t) → ANALYTIC SIGNAL TRANSFORMER (701) → INSTANT. PHASE ESTIMATOR (702) → LINEAR TREND REMOVER (704) → LOW FREQ. COMPONENT REMOVER (1901) → RESAMPLER (901) → TIMING JITTER SEQUENCE
                                                                  ↓
                                                          LINEAR PHASE ESTIMATOR (703) → (to 704)
```

(700: inner dotted block; TIMING JITTER ESTIMATOR 501: outer dashed block)

$$BER = \frac{\text{NUMBER OF BITS DETECTED IN ERROR IN A TIME INTERVAL}}{\text{TOTAL NUMBER OF BITS TRANSMITTED IN A TIME INTERVAL}}$$

|  | CONVENTIONAL (BERT-BASED) | Δφ METHOD |
|---|---|---|
| # OF MEASUREMENTS | 20 | 4 |
| TIME PER MEASUREMENTS | 1sec | 0.5sec |
| TOTAL TESTING TIME | 20sec | 2sec |

```
DATA A  1 1 0 0 0 1 1 0 : 0 1 1 0 1 0 0 1 : 0 0 1 0 1 0 1 1 : 0 ···
DATA B  1 1 0 0 1 0 0 1 : 0 0 1 1 1 0 0 1 : 1 0 1 1 0 1 1 1 : 0 ···
DATA C  1 1 1 1 1 1 1 1 : 0 0 0 0 0 0 0 0 : 1 1 1 1 1 1 1 1 : 0 ···
```

MEASURING APPARATUS AND MEASURING METHOD

The present application is a continuation application of PCT/IB03/01997 filed on Feb. 26, 2003 which claims priority from PCT/US02/05901 filed on Feb. 26, 2002 and U.S. patent application Ser. No. 10/265,349 filed on Oct. 4, 2002, the contents of which are incorporated herein by reference.

BACKGROUND OF THE INVENTION

1. Field of the Invention

The present invention relates to a measuring apparatus and a measuring method for measuring an electronic device. More particularly, the present invention relates to a measuring apparatus and a measuring method that measure a jitter transfer function, a bit error rate and jitter tolerance of the electronic device under test.

2. Related Art

Jitter testing is an important item to a serial-deserial communication device. For example, Recommendations and Requirements from International Telecommunication Union and Bellcore ((1) ITU-T, Recommendation G.958: Digital Line Systems Based on the Synchronous Digital Hierarchy for Use on Optical Fibre Cables, November 1994, (2) ITU-T, Recommendation O.172: Jitter and Wander Measuring Equipment for Digital Systems Which are Based on the Synchronous Digital Hierarchy (SDH), March 1999, (3) Bellcore, Generic Requirements GR-1377-Core: SONET OC-192 Transport System Genetic Criteria, December 1998) define A recovered clock in the recovered data output from the deserializer is compared to a reference clock in phase by being mixed with the reference clock.

The network analyzer measures the jitter transfer function of the deserializer based on phase noise spectra in the digital signal input to the deserializer and phase noise spectra in the recovered data. In a case of measuring the jitter transfer function based on a ratio of the phase noise spectra, however, the phase noises in a region other than the edges of the waveform are included. These phase noises prevent the high-precision measurement of the jitter transfer function.

FIG. 75 explains a case of measuring the jitter transfer function of the deserializer by means of a jitter analyzer. The jitter analyzer generates a clock having a predetermined frequency. A synthesizer modulates this clock. A clock source supplies the clock phase modulated by the sinusoid generated by the synthesizer to a pattern generator. The pattern generator supplies data and clock to the deserializer in accordance with the received clock. The deserializer outputs output data and recovered clock in accordance with the received data. The jitter analyzer receives the input clock and the output recovered clock of the deserializer and samples the input clock and output recovered clock. Note that the band-pass filter eliminates both clock and high frequency jitter components (e.g. see Recommendation G.825).

Next, discuss the measurement problem associated with periodic sampling. The jitter analyzer samples one sample per M periods of the input data. The jitter analyzer also performs each sampling at a timing shifted by a small phase. That is, assuming the period of the input data to be T, the sampling period of the jitter analyzer is $MT+T_{ES}$. Since both the input data measurements of jitter tolerance, jitter generation and jitter transfer function.

Therefore, VLSIs for serial communication have to satisfy the values described in the above specifications. Especially, in the jitter tolerance measurement of a deserializer, (a) a sinusoidal jitter is added to zero-crossings of an input bit stream, then (b) the deserializer samples the serial bit stream at times in the vicinity of decision boundaries (sampling instants) and outputs the serial bit stream as parallel data. (c) one port is connected to a Bit Error Rate Tester and its error rate is calculated. (d) This decision boundary or sampling instant has to be obtained from a recovered clock or a clock extracted from the data stream, in which the zero-crossings have jitter. Thus, it is apparent from the above that the jitter tolerance measurement is one of the most difficult measurements.

First, a conventional measuring apparatus that measures a jitter transfer function of the device under test is described. FIG. 74 explains a case of measuring the jitter transfer function by using a network analyzer. The network analyzer measures the jitter transfer function of the deserializer as the device under test. A signal generator generates a sinewave (reference carrier) having frequency $f_a$ supplied to the deserializer. The network analyzer phase modulates the reference carrier by a sinusoid having $f_b$. The modulated carrier clocks a pulse pattern generator. The pulse pattern generator supplies a bit stream to the deserializer.

The deserializer performs serial-parallel conversion for input serial bit stream so as to output the converted data as recovered data of a plurality of bits. The data clock of the pattern is subjected to phase modulation by the sinusoidal wave supplied from the network analyzer, and the output data are periodic waveforms having a period of multiples of T, the result of the sampling are substantially equivalent to that obtained in a case of sampling at a sampling period $T_{ES}$.

The jitter analyzer calculates a ratio of the instantaneous phase spectra of the input data to the instantaneous phase spectra of the output data based on the sampling result and then measures the jitter transfer function of the deserializer based on the thus calculated spectra ratio. However, the jitter analyzer performs the sampling at the sampling period of $MT+T_{ES}$ and extracts data equivalent to the data of one period. Thus, it takes much time to measure the jitter transfer function.

Moreover, the jitter analyzer generates the waveform equivalent to one period data from approximately $MT/T_{ES}$ samples. Therefore; it is difficult to measure the fluctuation of the period between adjacent edges in the waveform of the input data or the output data. The period fluctuation in the waveform generated by the sampling is a mean value of the period fluctuations between the adjacent edges in M periods of the input data or the output data. Therefore, the jitter analyzer cannot precisely measure the instantaneous phases of the input data and the output data, so that it is difficult to precisely measure the jitter transfer function.

Next, a conventional method for measuring the bit error rate and a conventional method for measuring the jitter tolerance are described. According to an eye-diagram measurement, the performance of the communication device can be tested easily. FIG. 76 shows an eye diagram. The horizontal eye opening provides a peak-to-peak value of the timing jitter, while the vertical eye opening provides noise immunity or a signal-to-noise ratio (Edward A. Lee and David G. Messerschmitt, Digital Communication, 2nd ed., pp. 192, Kluwer Academic Publishers, 1994). In the measurement of the jitter tolerance, however, the zero-crossings of an input bit stream are caused to fluctuate by the timing jitter having a peak-to-peak value of 1 UI(Unit Interval, 1 UI is equal to the bit period $T_b$) or more. (For example, Recommendation (1) defines 1.5 $UI_{PP}$.) As a result, the eye-diagram measurement can measure only a closed eye pattern. Therefore, it is found that the eye diagram cannot be applied to the jitter tolerance measurement.

The jitter tolerance measurement is an extension of the bit error rate test. FIG. 77 shows the arrangement of the jitter tolerance measurement of the deserializer. The deserializer performs serial-parallel conversion for the input serial bit stream, and outputs the resultant data as, for example, 16-bit recovered data. The instantaneous phase $\Delta\theta[nT]$ of the input bit stream to the deserializer to be measured is made to fluctuate by the sinusoidal jitter. Please note that T is a data rate. A bit error rate tester delays the output recovered clock with an appropriate time delay so as to obtain the optimum timing instants, and samples the output recovered data at those instants. By comparing the sampled values of the recovered data and expected values corresponding thereto, the bit error rate of the deserialized data is obtained. However, since the output recovered clock is extracted from the serial bit stream in which edges fluctuate, it becomes difficult to sample the output recovered data at the optimum sampling instants under the condition of the large amplitude of the applied jitter. On the other hand, according to the method in which the clock is extracted from the recovered data stream, the bit error rate tester has to include a high-performance clock recovery unit. This is because the clock recovery unit, which has larger jitter tolerance than that of the clock recovery unit included in the deserializer under test, is required for measuring the jitter tolerance of the deserializer under test. In other words, in the jitter tolerance measurement using the bit error rate tester, it is likely to underestimate the jitter tolerance. Therefore, in order to perform the measurement with excellent repeatability, high measurement skill or know-how is required.

Moreover, in the jitter tolerance measurement, while the applied jitter amount is increased with the jitter frequency $f_J$ fixed, the minimum applied jitter amount that causes the occurrence of the bit error is obtained. For example, in order to perform the bit error rate test for a 2.5 Gbps serial communication device by using a pseudo-random binary sequence having a pattern length of $2^{23}-1$, the test time of 1 sec is required. Therefore, in order to measure the jitter tolerance by changing the jitter amplitude to be supplied 20 times, the test time of 20 sec is required.

Timing degradation of the input bit stream as well as amplitude degradation increases the bit error rate. The timing degradation corresponds to the horizontal eye opening in the eye-diagram measurement, while the amplitude degradation corresponds to the vertical eye opening. Therefore, by measuring the degrees of the timing degradation and amplitude degradation, the bit error rate can be calculated. Please note that the jitter tolerance measurement corresponds to the horizontal eye opening in the eye-diagram measurement. For example, degradation of the amplitude of the received signal of $\Delta A=10\%$ corresponds to the reduction of the signal-to-noise ratio of $20\log10(100-10)/100=0.9$ dB. Therefore, the bit error rate increases by 0.9 dB. As for the timing degradation $\Delta T$, the similar calculation can be performed. Please note that the % value of the ratio and the dB value are relative values, not absolute values. In order to obtain an accurate value of the bit error rate, calibration is required. Here, the definition of $\Delta A$ and $\Delta T$ by J. E. Gersbach (John E. Gersbach, Ilya I. Novof, Joseph K. Lee, "Fast Communication Link Bit Error Rate Estimator," U.S. Pat. No. 5,418,789, May 23, 1995) is used. The apparatus disclosed in the above patent uses the following equation $$BER = 10^{\left(\frac{-K}{\frac{\Delta T}{T}+\frac{\Delta A}{A}}\right)}$$

to calculate an instantaneous bit error rate from $\Delta A$, $\Delta T$, a local clock period T and the maximum value A of the samples at the optimum sampling instants. However, the aforementioned apparatus merely provides a method for estimating the bit error rate by measuring the timing degradation by a Gaussian noise jitter. The apparatus described in the aforementioned patent obtains a histogram of data edges, performs a threshold operation and obtains $\Delta T$. This operation is effective to the Gaussian noise jitter having a single peak. The sinusoidal jitter used in the jitter tolerance test has two peaks at both ends of the distribution. Therefore, $\Delta T$ cannot be obtained only by performing the simple threshold operation. Moreover, in the jitter tolerance measurement, the zero-crossings are caused to fluctuate by the timing jitter of 1 $UI_{PP}$ or more. As a result, the histogram has the distribution in which the probability density functions of adjacent edges overlap each other. From such a histogram, it is difficult to obtain $\Delta T$. It is known that this histogram operation cannot secure a sufficient measurement precision unless about 10000 samples or more are obtained (T. J. Yamaguchi, M. Soma, D. Halter, J. Nissen, R. Raina, M. Ishida, and T. Watanabe, "Jitter Measurements of a PowerPC™ Microprocessor Using an Analytic Signal Method," Proc. IEEE International Test Conference, Atlantic City, N.J., Oct. 3-5, 2000). Therefore, it is hard to reduce the measurement time. Moreover, K in the above equation does not have an ideal value. Therefore, by calibrating the instantaneous bit error rate with the actual bit error rate, the initial value for K has to be given. Also, a correction value $\Delta K$ has to be calculated from the difference between the long-term mean value of the instantaneous bit error rate and the actual bit error rate. Therefore, the conventional apparatus is poor in efficiency, requiring the longer test time.

SUMMARY OF THE INVENTION

Therefore, it is an object of the present invention to provide a measuring apparatus and a measuring method which are capable of overcoming the above drawbacks accompanying the conventional art. The above and other objects can be achieved by combinations described in the independent claims. The dependent claims define further advantageous and exemplary combinations of the present invention.

To solve the foregoing problem, according to the first aspect of the present invention, there is provided a measuring apparatus for measuring jitter transfer function of an electronic device. The measuring apparatus includes: a timing jitter estimator operable to calculate an output timing jitter sequence of an output signal based on the output signal output from the electronic device; and a jitter transfer function estimator operable to calculate jitter transfer function of the electronic device based on the output timing jitter sequence.

The timing jitter estimator may include: an instantaneous phase noise estimator operable to calculate an instantaneous phase noise of the output signal based on the output signal; and a resampler operable to generate the output timing jitter sequence obtained by resampling the instantaneous phase noise at predetermined timings.

The resampler may resample the instantaneous phase noise at timings approximately same as zero-crossing timings of the output signal.

The electronic device may receive a plurality of input signals having different jitter amounts and may output a plurality of the output signals respectively corresponding to the plurality of input signals, the timing jitter estimator may calculate the output timing jitter sequences corresponding to the output signals respectively, and the jitter transfer function estimator may calculate the jitter transfer function further based on the information indicating a plurality of input timing jitter sequences corresponding to the plurality of input signals.

The electronic device may receive a plurality of input signals having different jitter amounts one after another and may output a plurality of the output signals respectively corresponding to the plurality of input signals, the timing jitter estimator may receive the plurality of input signals one after another and may calculate a plurality of input timing jitter sequences of the plurality of input signals, and may receive the plurality of output signals one after another, and may calculate the output timing jitter sequences of the output signals respectively, and the jitter transfer function estimator may calculate the jitter transfer function further based on the input timing jitter sequences.

The measuring apparatus may further include a frequency-domain transformer operable to transform the input timing jitter sequences and the output timing jitter sequences to frequency domain signals.

The jitter transfer function estimator may include a jitter gain estimator operable to calculate a gain $|H_J(f_J)|$ of the jitter transfer function based on the following Equation:

$$|H_J(f_J)| = \left|\frac{\Delta\Phi[f_J]}{\Delta\Theta[f_J]}\right| \text{ or } |H_J(f_J)| = \left|\frac{\Delta\Phi(f_J)}{\Delta\Theta(f_J)}\right|$$

The jitter transfer function estimator may also include a phase estimator operable to calculate a phase $\angle H_J(f_J)$ of the jitter transfer function based on the following Equation:

$$\angle H_J(f_J) = \tan^{-1}\frac{\text{Im}[H_J(f_J)]}{\text{Re}[H_J(f_J)]}$$

where $\Delta\Phi[f_J]$ is an output timing jitter spectra of the output signal; $\Delta\Theta[f_J]$ is an input timing jitter spectra of the input signal; $\Delta\Theta(f_J)$ is a phase noise spectra of the output signal; and $\Delta\Theta(f_J)$ is a phase noise spectra of the input signal.

The jitter transfer function estimator may include a jitter gain estimator operable to calculate a gain of the jitter transfer function based on the plurality of input timing jitter sequences and the plurality of output timing jitter sequences.

The jitter gain estimator may calculate the gain of the jitter transfer function based on a result of linear fitting of a relationship between a peak-to-peak value of an input timing jitter of the plurality of input timing jitter sequences and a peak-to-peak value of an output timing jitter of the plurality of output timing jitter sequences, or a root-mean-square (RMS) value of the output timing jitter of the output timing jitter sequences and a root-mean-square value of an input timing jitter of the plurality of input timing jitter sequences.

The jitter transfer function estimator may estimate the phase of the jitter transfer function based on the input timing jitter sequence and the output timing jitter sequence.

The measuring apparatus may further include a jitter applying unit operable to supply a signal, which is obtained by applying the desired input timing jitter to the input signal, to the electronic device, and the jitter gain estimator may estimate the gain of the jitter transfer function based on the input timing jitter applied to the input signal by the jitter applying unit and the output timing jitter in the output signal.

The jitter applying unit may apply a sinusoidal jitter to the input signal as the input timing jitter.

The jitter applying unit may apply the input timing jitter by modulating a phase of the input signal.

The jitter applying unit may apply the input timing jitter by modulating a frequency of the input signal.

The measuring apparatus may further include a clock recovery unit operable to generate a recovered clock signal of the output signal based on the output signal, and the timing jitter estimator may estimate the output timing jitter based on the recovered clock signal.

The timing jitter estimator may include: an analytic signal transformer operable to transform the output signal to a complex analytic signal; an instantaneous phase estimator operable to estimate an instantaneous phase of the analytic signal based on said analytic signal; a linear instantaneous phase estimator operable to estimate a linear instantaneous phase of the output signal based on an instantaneous of the analytic signal; a linear trend remover operable to calculate an instantaneous phase noise obtained by removing the linear instantaneous phase from the instantaneous phase based on the instantaneous phase and the linear instantaneous phase; and a resampler operable to receive the instantaneous phase noise, resample the instantaneous phase noise, and calculate a timing jitter sequence of the output signal.

The timing jitter estimator may further include a low frequency phase noise remover operable to receive the instantaneous phase noise, may remove low frequency components of the instantaneous phase noise, and may supply the instantaneous phase noise with no low frequency component to the resampler.

The timing jitter estimator may further include an analog-to-digital converter operable to convert the output signal to a digital signal and may supply the digital signal to the analytic signal transformer, and the analytic signal transformer may generate the analytic signal based on the digital signal.

The resampler may resample only data of the instantaneous phase noise close to zero-crossing timings of the received signal, to which the instantaneous phase noise inputs.

The timing jitter estimator may estimate input data clock signal for generating input data signal given to the electronic device, and the timing jitter sequence of the output data signal output from the electronic device in response to the input data signal. The jitter transfer function estimator may estimate the jitter transfer function between the input data clock signal and the output data signal based on the timing jitter sequence estimated by the timing jitter estimator.

The timing jitter estimator may estimate a timing jitter sequence of an input data signal given to the electronic device and an output data signal output from the electronic device in response to the input data signal, and the jitter transfer function measuring apparatus may measure a jitter transfer function between the input data signal and the output data signal based on the timing jitter sequence estimated by the timing jitter estimator.

The electronic device may receive serial data as the input data signal, and may output a parallel data as the output data signal from output pins, the number of output pins being predetermined, the timing jitter estimator may estimate the output timing jitter sequence of the output data signal according to data output from a certain output pin out of the output pins, and the input unit may supply the input data signal to the electronic device, in which a bit of the pattern data corresponding to the certain output pin out of the output pins repeats 1 (high) and 0 (low) by turns.

The input unit may supply the input data signal to the electronic device, in which bits of the pattern data repeats 1 and 0 every bits same number as the output pins.

According to the second aspect of the present invention, there is provided a measuring apparatus for measuring a bit error rate of an electronic device. The measuring apparatus includes a bit error rate estimator operable to estimate the bit error rate of the electronic device based on a gain of jitter transfer function of the electronic device.

The bit error rate estimator may estimate the bit error rate further based on a phase of the jitter transfer function.

According to the third aspect of the present invention, there is provided a measuring apparatus for measuring jitter tolerance of an electronic device. The measuring apparatus includes a jitter tolerance estimator operable to estimate the jitter tolerance of the electronic device based on a gain of jitter transfer function of the electronic device.

The jitter tolerance estimator may estimate the jitter tolerance further based on a phase of the jitter transfer function.

The jitter tolerance estimator may estimate a coarse value of the jitter tolerance based on the gain estimate of the jitter transfer function. The measuring apparatus may further include a signal input means operable to input into the electronic device the plurality of input signals to which timing jitter having different amplitudes in the vicinity of an amplitude value in accordance with the coarse value of the jitter tolerance are applied one after another, and a bit error detector operable to detect bit error in the output signal by comparing each bit of a reference signal, which the electronic device is to output in response to the input signal to which the timing jitter is applied, with each bit of the output signal which the electronic device outputs in accordance with the input signal. The jitter tolerance estimator may estimate peak-to-peak value of the input timing jitter, above which the bit error detector start to detect the bit error in the output signal. This input timing jitter corresponds to the jitter tolerance.

The bit error detector may sample data signal output from the electronic device at the rising edge of the clock signal output from the electronic device, may convert the data signal into a logic valued sequence (data sequence), and may compare each bit of the detected data sequence with each bit of the given reference signal.

The measuring apparatus may further include a jitter applying unit operable to supply a first check signal, to which a timing jitter is applied, to the electronic device, the timing jitter having amplitude according to the jitter tolerance estimated by the jitter tolerance estimator; a jitter distortion estimator operable to estimate jitter distortion of an output timing jitter of the output signal output from the electronic device according to the first check signal, against an ideal timing jitter of the output signal which the electronic device is to output according to the first check signal; and a judging unit operable to judge whether the jitter tolerance is a right value based on the jitter distortion.

When the judging unit judges that the jitter tolerance estimated by the jitter tolerance estimator is not a right value, the jitter applying unit may supply a second check signal, to which a timing jitter is applied, to the electronic device, the timing jitter having smaller amplitude than the first check signal; the jitter distortion estimator may estimate jitter distortion of an output timing jitter of the output signal output from the electronic device according to the second check signal, against an ideal timing jitter of the output signal which the electronic device is to output according to the second check signal; and the judging unit may newly estimate the jitter tolerance based on the jitter distortion, estimated by the jitter distortion estimator, and corresponding to the second check signal.

According to the fourth aspect of the present invention, there is provided a measuring apparatus for measuring a bit error rate of an electronic device. The measuring apparatus includes: a timing estimator operable to estimate an input timing sequence of an input signal for testing the electronic device and an output timing sequence of an output signal output from the electronic device in response to the input signal; a timing difference estimator operable to calculate timing differences between the input timing sequence and the output timing sequence; and a bit error rate estimator operable to estimate the bit error rate of the electronic device based on the timing differences.

The timing estimator may estimate the input timing sequence and the output timing sequence based on a zero-crossing timing sequence of rising edges or falling edges of the input signal and the output signal.

The timing estimator may include: an analytic signal transformer operable to transform the input signal and the output signal into complex analytic signals; an instantaneous phase estimator operable to calculate instantaneous phases of the analytic signals; and a resampler operable to resample the instantaneous phase to generate timing sequences of the input signal and the output signal.

According to the fifth aspect of the present invention, there is provided a measuring method for measuring jitter transfer function of an electronic device. The measuring apparatus includes: a timing jitter estimation step of calculating an output timing jitter sequence, which indicates a plurality of output timing jitter of an output signal, based on the output signal output from the electronic device; and a jitter transfer function estimation step of calculating jitter transfer function of the electronic device based on the output timing jitter sequence.

According to the sixth aspect of the present invention, there is provided a measuring method for measuring a bit error rate of an electronic device. The measuring method includes a bit error rate estimation step of estimating the bit error rate of the electronic device based on a gain of jitter transfer function of the electronic device.

According to the seventh aspect of the present invention, there is provided a measuring method for measuring jitter tolerance of an electronic device. The measuring method includes a jitter tolerance estimation step of estimating the jitter tolerance of the electronic device based on a gain of jitter transfer function of the electronic device.

According to the eighth aspect of the present invention, there is provided a measuring method for measuring a bit error rate of an electronic device. The measuring method includes: estimating an input timing sequence of an input signal for testing the electronic device and an output timing sequence of an output signal output from the electronic device in response to the input signal; calculating timing differences between the input timing sequence and the output timing sequence; and estimating the bit error rate of the electronic device based on the timing differences.

According to the ninth aspect of the present invention, there is provided a measuring apparatus for measuring reliability of an electronic device against jitter. The measuring apparatus includes: a timing jitter estimator operable to estimate an output timing jitter sequence of an output signal based on the output signal output from the electronic device in response to an input signal to which an input timing jitter is applied; a jitter distortion estimator operable to estimate jitter distortion of an output timing jitter of the output signal output from the electronic device in response to the input signal, against an ideal timing jitter of the output signal which the electronic device is to output in response to the input signal based on the output timing jitter sequence; and a jitter related transmission penalty estimator operable to estimate the reliability of the electronic device against jitter based on the jitter distortion.

The measuring apparatus may further include a jitter applying unit operable to apply the input timing jitter, having a desired amplitude, to the input signal, and to supply the input signal to the electronic device, and the jitter related transmission penalty estimator may estimate the reliability of the electronic device against jitter about amplitude of the input timing jitter.

The jitter applying unit may supply the plurality of input signals, having different amplitudes of the input timing jitter, to the electronic device, and the jitter related transmission penalty estimator may estimate jitter tolerance of the electronic device based on jitter distortion of each of the output timing jitter against the plurality of input signals.

The jitter tolerance estimator may estimate a coarse value of the jitter tolerance based on jitter distortion of the output timing jitter. The measuring apparatus further includes a signal input means operable to input into the electronic device the input signals to which timing jitter having different amplitudes in the vicinity of an amplitude value in accordance with the coarse value of the jitter tolerance are applied one after another, and a bit error detector operable to detect bit error in the output signal by comparing each bit of a reference signal, which the electronic device is to output in response to the input signal to which the timing jitter is applied, with each bit of the output signal which the electronic device outputs in accordance with the input signal. The jitter tolerance estimator may estimate peak-to-peak value of the input timing jitter, above which the bit error detector starts to detect the bit error in the output signal. This input timing jitter corresponds to the jitter tolerance.

The measuring apparatus may further include a signal input means operable to apply an input timing jitter to the input signal and a bit error detector operable to detect bit error in the output signal by comparing each bit of a reference signal, which the electronic device is to output in response to the input signal to which the timing jitter is applied, with each bit of the output signal which the electronic device outputs in accordance with the input signal. The jitter related transmission penalty estimator may selectively change an amplitude of the input timing jitter until the bit error detector detects the bit error, and may estimate peak-to-peak value of the input timing jitter, above which the bit error detector starts to detect the bit error. This input timing jitter gives the jitter tolerance. Alternatively, the jitter related transmission penalty estimator may selectively calculate the jitter tolerance based on the jitter distortion of the output timing jitter.

The bit error detector samples data signal output from the electronic device at the rising edge of the clock signal output from the electronic device, may convert the data signal into a logic valued sequence (data sequence), and may compare each bit of the detected data sequence with each bit of the given reference pattern signal.

The jitter applying unit may apply a sinusoidal jitter to the input signal, and the jitter distortion estimator may generate a jitter histogram of the output timing jitter sequence, and may calculate jitter distortion of the output timing jitter based on the jitter histogram.

The jitter applying unit may apply a sinusoidal jitter to the input signal, and the jitter distortion estimator may estimate a jitter spectrum of the output timing jitter sequence, and may calculate jitter distortion of the output timing jitter based on the jitter spectrum.

The jitter distortion estimator may estimate jitter distortion of the output timing jitter based on ratio of fundamental frequency content of the jitter spectrum, having the same frequency as the sinusoidal jitter, and harmonic content of the fundamental frequency content in the jitter spectrum.

The jitter distortion estimator may estimate amplitude of the output timing jitter against the plurality of sinusoidal jitters having different amplitude, and the jitter related transmission penalty estimator may estimate the jitter tolerance based on amplitude of the sinusoidal jitter, where the amplitude of the output timing jitter, in response to amplitude of the sinusoidal jitter, becomes nonlinear.

The jitter applying unit may supply the input signal to the electronic device, where the plurality of sinusoidal jitters having different frequency are applied to the input signal, and the jitter related transmission penalty estimator may estimate the reliability of the electronic device against jitter about every frequency of the sinusoidal jitter.

The timing jitter estimator may include a period jitter estimator operable to estimate period jitter sequence of the output signal, an ideal edge timing estimator operable to estimate average period of the period jitter sequence, and an edge timing error estimation unit operable to estimate the output timing jitter sequence based on the average period of the period jitter sequence and the period jitter sequence.

According to the tenth aspect of the present invention, there is provided a measuring method for measuring reliability of an electronic device against jitter. The measuring method includes: a timing jitter estimation step for estimating an output timing jitter sequence of an output signal based on the output signal output from the electronic device in response to an input signal to which an input timing jitter is applied; a jitter distortion estimation step for estimating jitter distortion of an output timing jitter of the output signal output from the electronic device in response to the input signal, against an ideal timing jitter of the output signal which the electronic device is to output in response to the input signal based on the output timing jitter sequence; and a jitter related transmission penalty estimation step for estimating the reliability of the electronic device against jitter based on the jitter distortion.

The summary of the invention does not necessarily describe all necessary features of the present invention. The present invention may also be a sub-combination of the features described above.

BRIEF DESCRIPTION OF THE INVENTION

FIG. 27 shows still example of the other structure of the timing jitter estimator 501.

Figure 74:
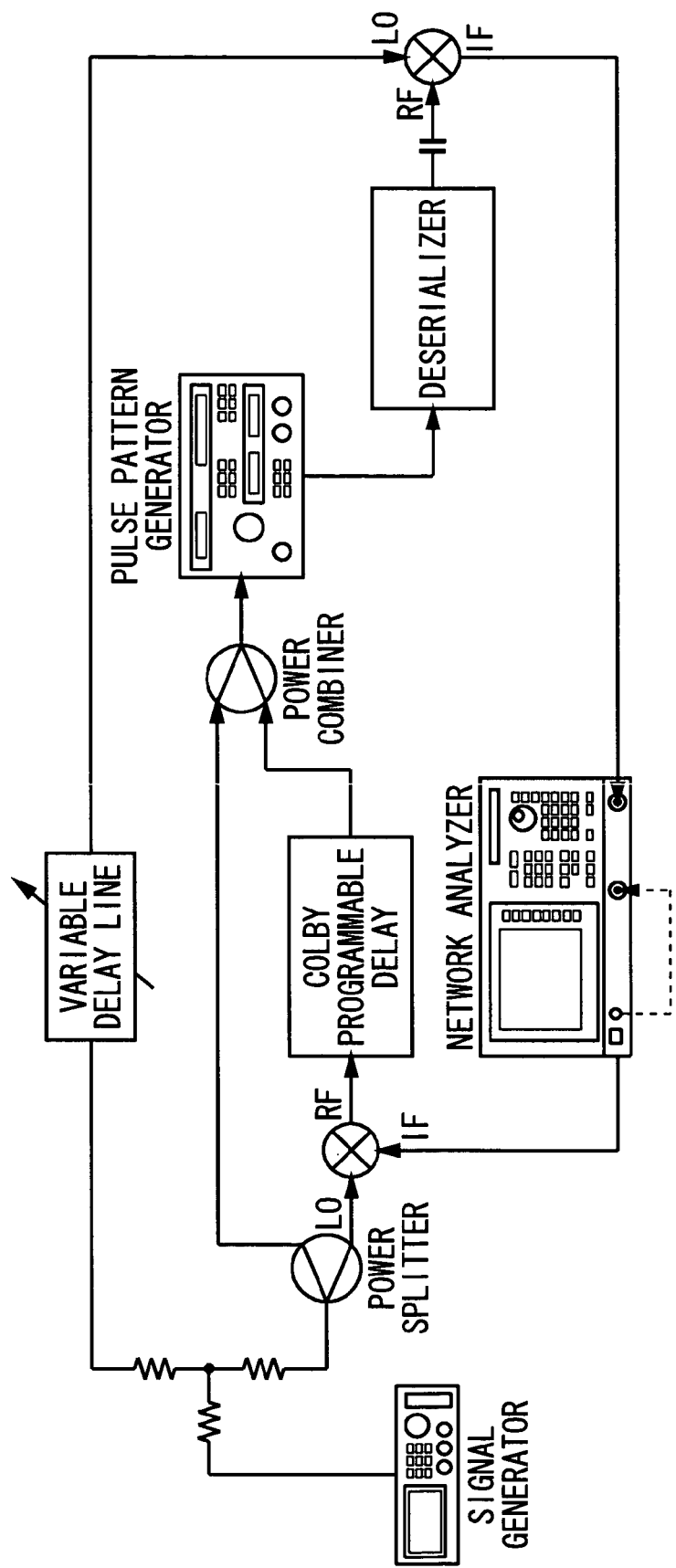

FIG. 74 explains a case of measuring the jitter transfer function by using a network analyzer.

Figure 75:
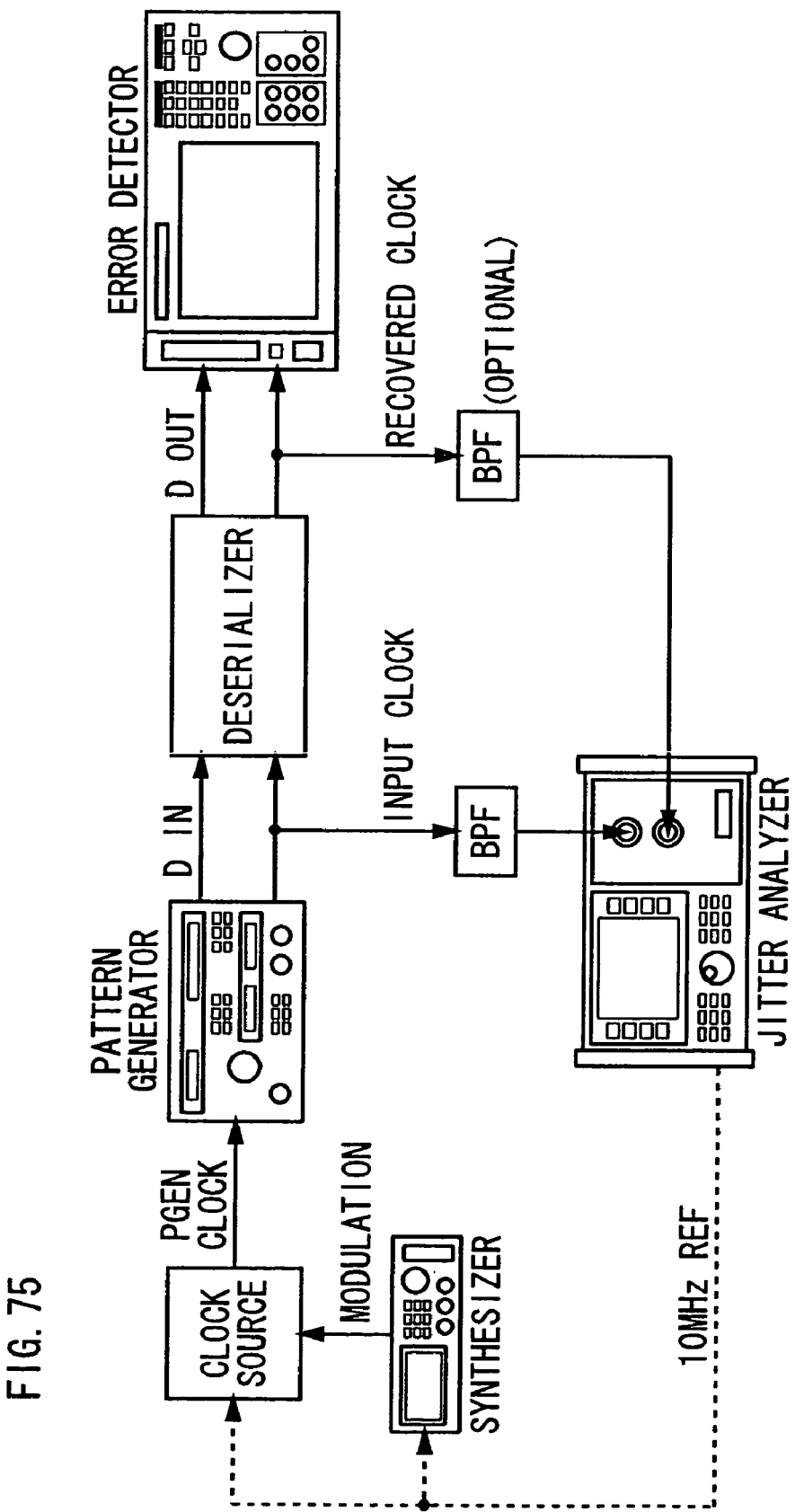

FIG. 75 explains a case of measuring the jitter transfer function of the deserializer by means of a jitter analyzer.

Figure 76:
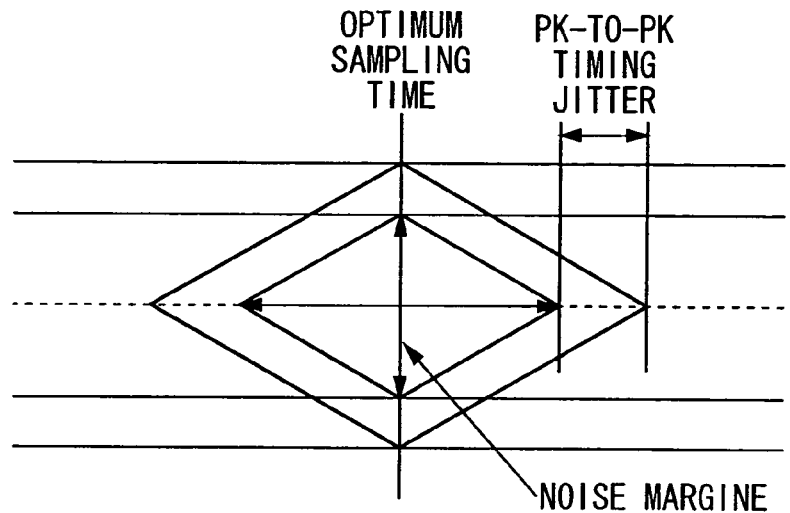

FIG. 76 shows an eye diagram.

Figure 77:
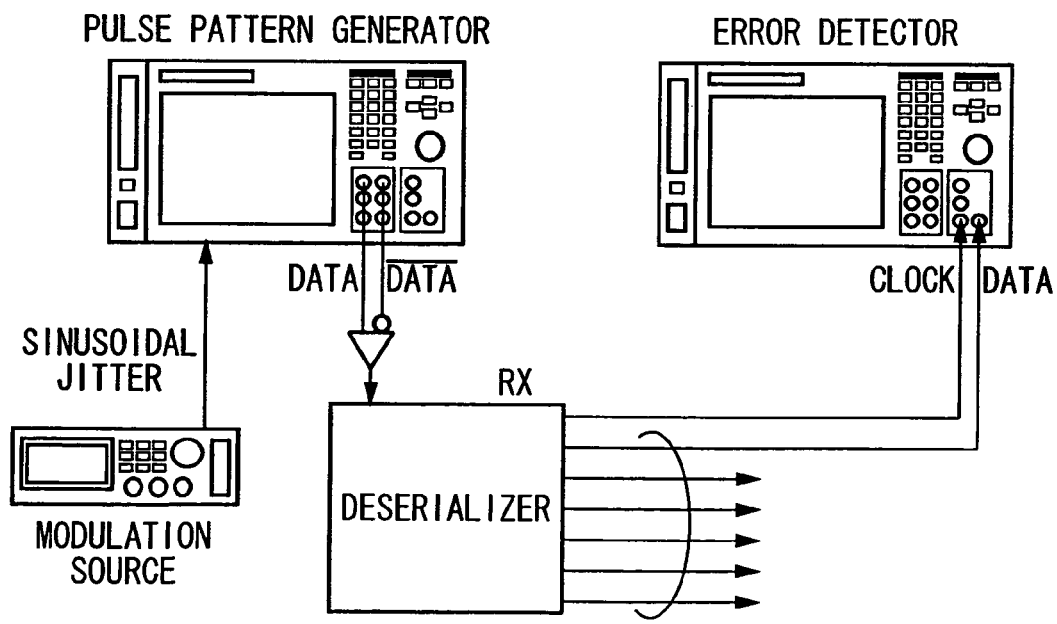

FIG. 77 shows the arrangement of the jitter tolerance measurement of the deserializer.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
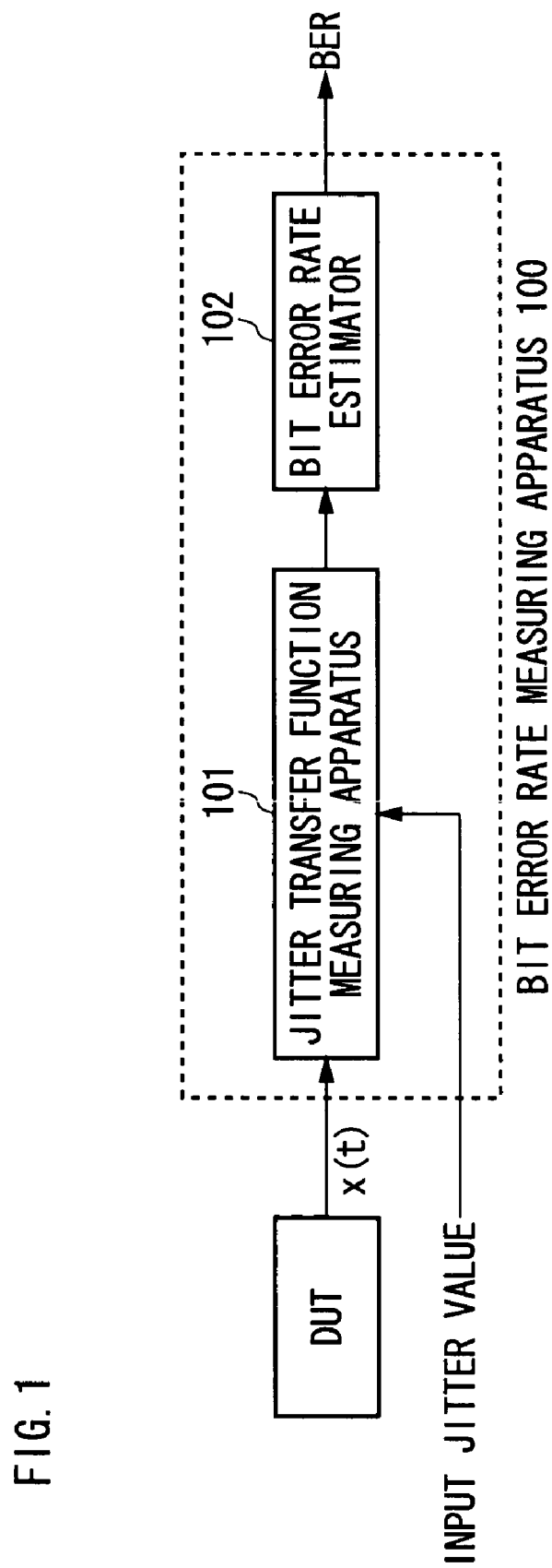
FIG. 1 illustrates an exemplary structure of a measuring apparatus 100 according to the present invention.

FIG. 1 illustrates an exemplary structure of a measuring apparatus 100 according to the present invention. The measuring apparatus 100 calculates a bit error rate of a circuit, electronic device or system under test (hereinafter, simply referred to as DUT). The measuring apparatus 100 includes a jitter transfer function measuring apparatus 101 operable to measure jitter transfer function of the DUT, and a bit error rate estimator 102 operable to estimate the bit error rate of the DUT based on the jitter transfer function measured by the jitter transfer function measuring apparatus 101. The bit error rate estimator 102 estimates the bit error rate of the DUT based on the gain of the jitter transfer function, for example. The bit error rate estimator 102 may estimate the bit error rate of the DUT further based on the phase of the jitter transfer function or further based on the internal noise of the DUT.

Figure 2:
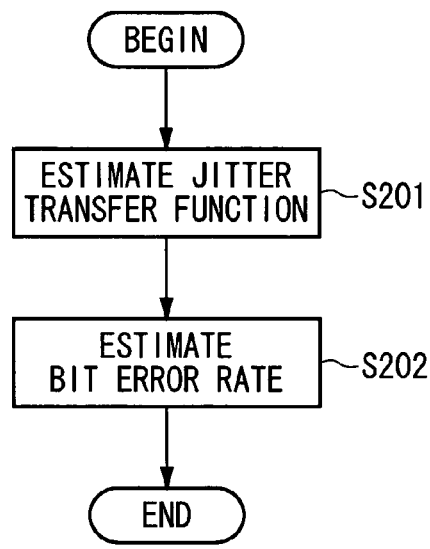
FIG. 2 is a flowchart showing an exemplary measuring method according to the present invention.

FIG. 2 is a flowchart showing an exemplary measuring method according to the present invention. First, the jitter transfer function of the DUT is estimated in jitter transfer function estimation step S201. Step S201 has the same or similar function as/to the jitter transfer function measuring apparatus 101 described referring to FIG. 1. Step S201 may be performed by using the jitter transfer function measuring apparatus 101. Then, the bit error rate of the DUT is estimated based on the jitter transfer function of the DUT in bit error rate estimation step S202. Step S202 has the same or similar function as/to the bit error rate estimator 102 described referring to FIG. 1. Step S202 may be performed by using the bit error rate estimator 102.

Figure 3:
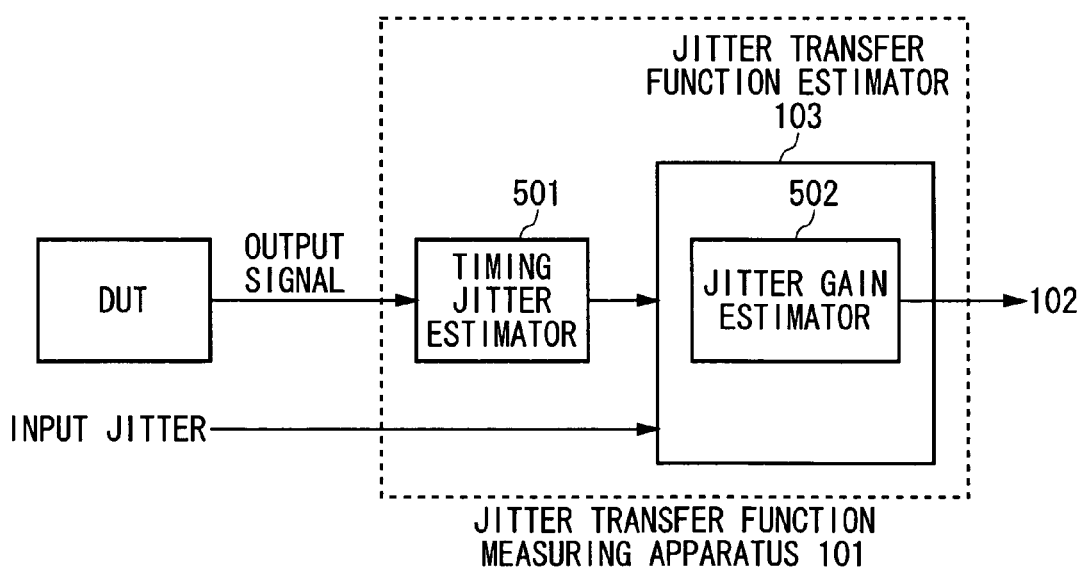
FIG. 3 shows an exemplary structure of the jitter transfer function measuring apparatus 101.

FIG. 3 shows an exemplary structure of the jitter transfer function measuring apparatus 101. The jitter transfer function measuring apparatus 101 includes a timing jitter estimator 501 that calculates an output timing jitter sequence indicating the output timing jitter of an output signal output from the DUT in response to an input signal input to the DUT, and a jitter transfer function estimator 103 that calculates the jitter transfer function of the DUT based on the output timing jitter sequence. The timing jitter estimator 501 may receive a recovered clock signal corresponding to the output signal of the DUT, as the output signal of the DUT. The details of the timing jitter estimator 501 are described later. Moreover, the timing jitter estimator 501 may calculate an output instantaneous phase noise of the output signal based on the output signal. Even in this case, the jitter transfer function measuring apparatus 101 can calculate the jitter transfer function using the output instantaneous phase noise instead of the output timing jitter sequence.

Moreover, the jitter transfer function estimator 103 has the jitter gain estimator 502 that estimates the gain of the jitter transfer function based on the output timing jitter sequence. In this example, the bit error rate estimator 102 calculates the bit error rate of the DUT based on the gain of the jitter transfer function. A method for calculating the gain of the jitter transfer function is described later.

The jitter gain estimator 502 estimates the gain of the jitter transfer function of the DUT based on a timing jitter in the input signal and a timing jitter in the output signal. The jitter gain estimator 502, for example, receives information indicative of the input timing jitter in the input signal, and the output timing jitter sequence calculated by the timing jitter estimator 501.

The jitter gain estimator 502 estimates the gain of the jitter transfer function of the DUT based on the received information indicative of the input timing jitter and the thus estimated output timing jitter sequence. In this case, the jitter gain estimator 502 calculates the output timing jitter value from the timing jitter sequence of the output signal. For example, the jitter gain estimator 502 calculates peak values or RMS values of the output timing jitter as the output timing jitter values based on the output timing jitter sequences. Alternatively, the jitter gain estimator 502 may receive the timing jitter sequence of the input signal and the timing jitter sequence of the output signal, and estimate gain of the jitter transfer function. In this case, the jitter gain estimator 502 may calculate the input timing jitter values from the input timing jitter sequences and may calculate the output timing jitter values from the output timing jitter sequences.

Figure 4:
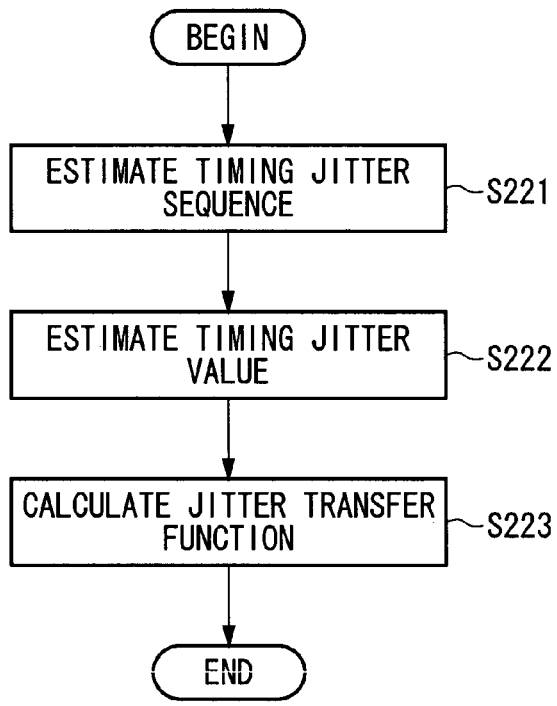
FIG. 4 is a flowchart of an example of jitter transfer function estimation step S201.

FIG. 4 is a flowchart of an example of jitter transfer function estimation step S201. Step S201 calculates the timing jitter sequence of the output signal in timing jitter estimation step S221. Step S221 have the same or similar function as/to the timing jitter estimator 501 described referring to FIG. 3, and may be performed by the timing jitter estimator 501. Step S221 may calculate the timing jitter sequence of the input signal.

Then, in step of calculating a timing jitter value S222, the timing jitter value is calculated based on the timing jitter sequence. Step S222 may calculate the timing jitter values based on the output timing jitter sequences, or may calculate both the timing jitter values of the output signal and the timing jitter values of the input signal based on the input timing sequences and the output timing jitter sequences. For example, step S222 may calculate the root-mean-square value or the peak-to-peak value of the timing jitter sequence as the timing jitter value.

Then, in jitter transfer function estimation step S223, the jitter transfer function is calculated. Step S223 have the same or similar function as/to the jitter transfer function estimator 103 described referring to FIG. 3, and may be performed by the jitter transfer function estimator 103.

Figure 5:
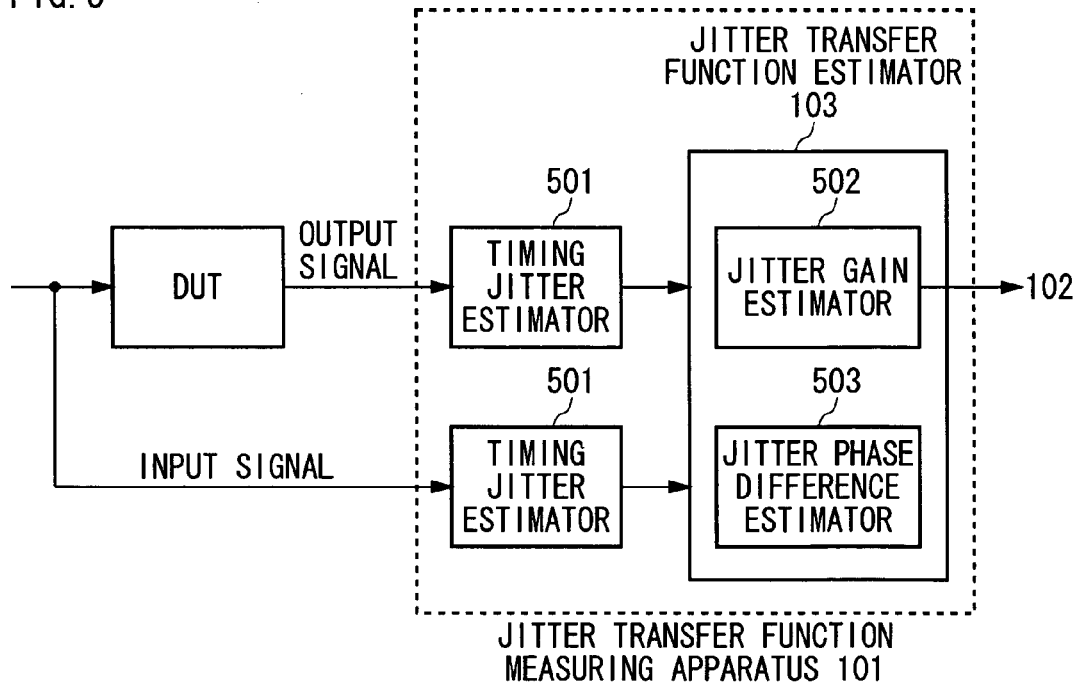
FIG. 5 illustrates another exemplary structure of the jitter transfer function measuring apparatus 101.

FIG. 5 illustrates another exemplary structure of the jitter transfer function measuring apparatus 101. In the jitter transfer function measuring apparatus 101 of this example, the jitter transfer function estimator 103 includes the structure of that described referring to FIG. 3 and a jitter phase difference estimator 503. Moreover, the jitter transfer function measuring apparatus 101 includes a plurality of timing jitter estimators 501. One timing jitter estimator 501 calculates the input timing jitter sequence of the input signal, while the other timing jitter estimators 501 calculate the output timing jitter sequences.

The jitter phase difference estimator 503 calculates the phase difference between the input timing jitter and the output timing jitter based on the input timing jitter sequence and the output timing jitter sequence. That is, the jitter phase difference estimator 503 calculates the phase of the jitter transfer function. For example, the jitter phase difference estimator 503 calculates the phase of the jitter transfer function based on the following equation.

$$\angle H_J(f_J) = \tan^{-1} \frac{\text{Im}[H_J(f_J)]}{\text{Re}[H_J(f_J)]}$$

The bit error rate estimator 102 calculates the bit error rate of the DUT further based on the phase of the jitter transfer function. The method of calculating the bit error rate based on the phase of the jitter transfer function is described later.

In the measuring apparatus 100 using jitter transfer function measuring apparatus 101 of this example, the bit error rate estimator 102 calculates the bit error rate of the DUT based on the gain and phase of the jitter transfer function.

Figure 6:
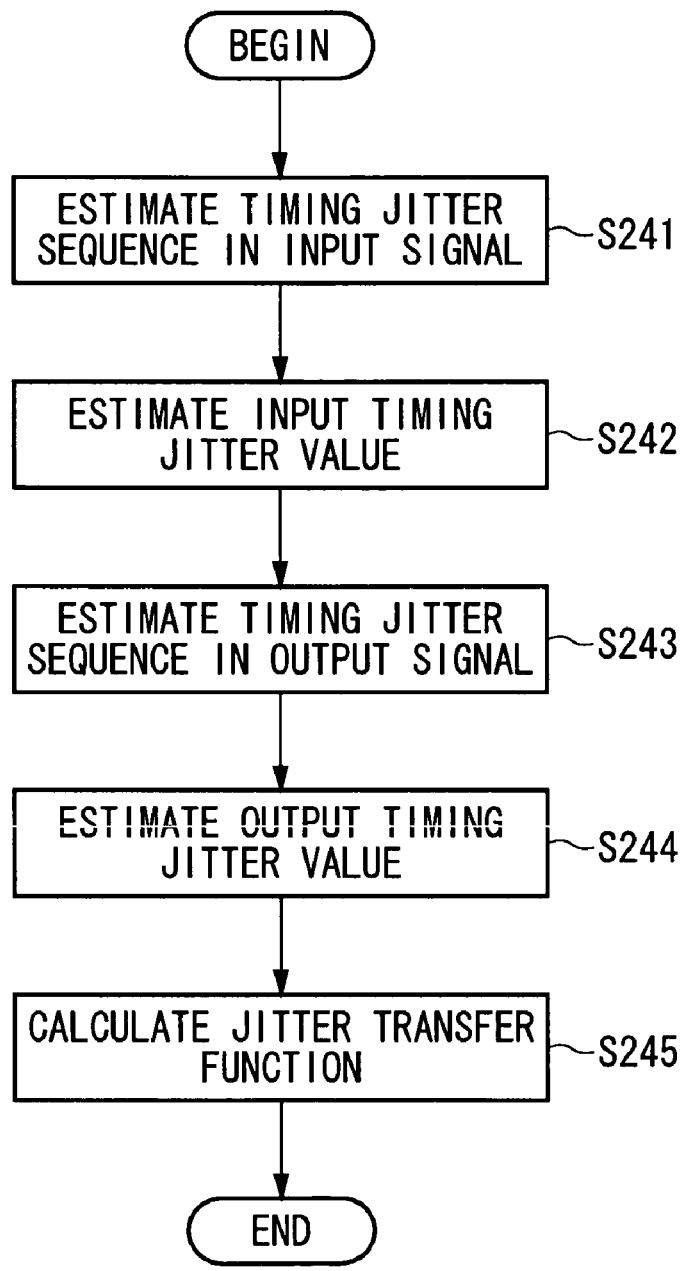
FIG. 6 is a flowchart of another example of jitter transfer function estimation step S201.

FIG. 6 is a flowchart of another example of jitter transfer function estimation step S201. Step S201 calculates the input timing jitter sequence in input timing jitter sequence estimation step S241. Then, in step of calculating the input timing jitter value, S242, the input timing jitter value is calculated. Then, the output timing jitter sequence is calculated in output timing jitter sequence estimation step S243 and thereafter the output timing jitter value is calculated in output timing jitter value calculation step S244. Then, in jitter transfer function estimation step S245, the jitter transfer function is estimated. Steps S241 and S243 calculate the timing jitter sequences in a similar manner to timing jitter estimation step S221 described referring to FIG. 4. Moreover, steps S242 and S244 calculate the timing jitter values in a similar manner to timing jitter value calculation step S222 described referring to FIG. 4. Furthermore, step S245 calculates the jitter transfer function in a similar manner to jitter transfer function estimation step S223 described referring to FIG. 4.

Figure 7:
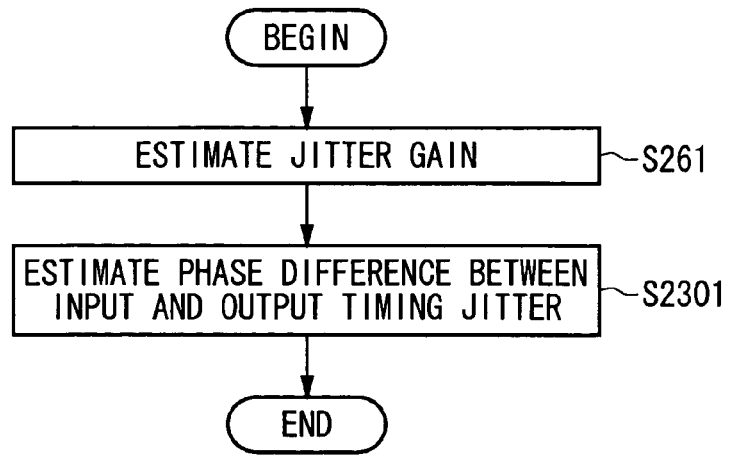
FIG. 7 shows a flow chart of a example of jitter transfer function estimation step S223.

FIG. 7 shows a flow chart of an example of jitter transfer function estimation step S223. In jitter gain estimation step S261, the gain of the jitter transfer is calculated based on the input timing jitter sequence and the output timing jitter sequence. Step S261 calculates the gain of the jitter transfer function by using the same or similar method as/to the jitter gain estimator 502 described in FIG. 5. Step S261 may be performed by the jitter gain estimator 502.

Moreover, in phase difference estimation step S2301, phase of the jitter transfer function is calculated based on the input timing jitter sequence and the output timing jitter sequence. Step S2301 calculates the phase of the jitter transfer function by using the same or similar method as/to the jitter phase difference estimator 503 described in FIG. 5. Step S2301 may be performed by the jitter phase difference estimator 503.

Moreover, in the jitter transfer function estimation step S223, either of the jitter gain estimation step S261 and the phase difference estimation step S2301 may be performed prior to the other, or may be performed simultaneously.

Figure 8:
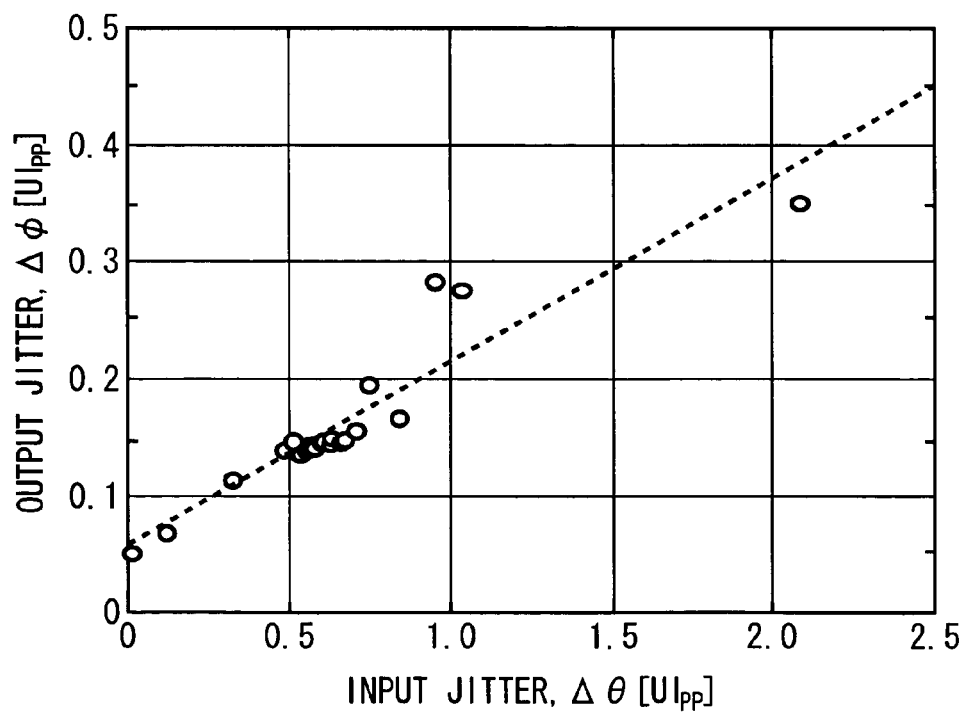
FIG. 8 shows an example of the relationship between the input timing jitter value and the output timing jitter value.

FIG. 8 shows an example of the relationship between the input timing jitter value and the output timing litter value. The jitter gain estimator 502 calculates a plurality of input timing jitter values and a plurality of output timing jitter values based on input timing jitter sequences of a plurality of input signals respectively having different jitter amounts and the output timing jitter sequence in the output signal corresponding to the respective input signal. For example, the jitter gain estimator 502 calculates the root-mean-square value or peak-to-peak value of the timing jitter sequence as the timing jitter value.

The jitter gain estimator 502 estimates the gain of the jitter transfer function. More specifically, input signals having different jitter amounts are supplied to the DUT one after another, and the jitter gain estimator 502 estimates the gain of the jitter transfer function based on the input timing jitter sequence of each input signal and the output timing jitter sequence corresponding to that input signal.

The jitter gain estimator 502 performs linear fitting for the relationship between a plurality of input timing jitter values and the output timing jitter values, as shown in FIG. 8, and then calculates a slope of the straight line as the gain of the jitter transfer function of the DUT, given a linear relationship between the two. In the following description, the jitter transfer function of the DUT is described.

When an input instantaneous phase noise of the input signal $\Delta\theta(nT_S)$ and an output instantaneous phase noise of the output signal $\Delta\theta(nT_S)$ are transformed into the frequency domain by Fourier transform, the following phase noise spectra is obtained.

$$\Delta\Theta(f_J) = \frac{1}{L}\sum_{k=0}^{L}\Delta\theta(kT_S)\exp\left(-j\frac{2\pi f_J k}{L}\right) \quad (1)$$

$$\Delta\Phi(f_J) = \frac{1}{L}\sum_{k=0}^{L}\Delta\phi(kT_S)\exp\left(-j\frac{2\pi f_J k}{L}\right) \quad (2)$$

where $f_J$ is a jitter frequency (frequency offset from the clock frequency), and $T_S$ is a sampling period.

In a case where the sampling period $T_S$ is made equal to the clock period T of the clock recovery unit of the DUT and the instantaneous phase noises in the vicinity of the zero-crossings (rising edges or falling edges) are sampled, the input timing jitter $\Delta\theta[nT]$ and the output timing jitter $\Delta\theta[nT]$ are obtained. When $\Delta\theta[nT]$ and $\Delta\theta[nT]$ are transformed into the frequency domain by using Fourier transform, the following timing jitter spectra $$\Delta\Theta[f_J] = \frac{1}{L}\sum_{k=0}^{L}\Delta\theta(kT)\exp\left(-j\frac{2\pi f_J k}{L}\right) \quad (3)$$

$$\Delta\Phi[f_J] = \frac{1}{L}\sum_{k=0}^{L}\Delta\theta(kT)\exp\left(-j\frac{2\pi f_J k}{L}\right) \quad (4)$$

are obtained. Since the timing jitter is wide-sense cyclostationary with a period T, the timing jitter spectra is more effective to analysis of a modulation noise source than phase noise spectra. However, when the timing jitter is made to pass through a narrow band-pass filter, the wide-sense cyclostationary signal can be transformed to a stationary signal, $$\Delta\Theta(f_J) \approx \Delta\Theta[f_J] \quad (5)$$

$$\Delta\Phi(f_J) \approx \Delta\phi[f_J] \quad (6)$$

are satisfied. That is, by using the narrow band-pass filter, sampling jitter signal at its zero-crossings (i.e., the time-dependent operation associated with the wide-sense cyclostationary signal) can be avoided.

The jitter transfer function of the DUT is defined as follows:

$$H_J(f_J) = |H_j(f_J)|\exp(-j\Delta\Psi(f_J)) \quad (7)$$

$$|H_J(f_J)| = \left|\frac{\Delta\Phi[f_J]}{\Delta\Theta[f_J]}\right| \approx \left|\frac{\Delta\Phi(f_J)}{\Delta\Theta(f_J)}\right| \quad (8)$$

$$\Delta\Psi(f_J) = \angle\Delta\Phi[f_J] - \angle\Delta\Theta(f_J) \approx \angle\Delta\Phi(f_J) - \angle\Delta\Theta(f_J) \quad (9)$$

The jitter transfer function is given as a frequency response function of a constant-parameter linear system. The output timing jitter spectra of the clock recovery unit of the DUT is represented by using the jitter transfer function as follows:

$$\Delta\Phi[f_J] = H_J(f_J)\Delta\Theta[f_J] \quad (10)$$

From the assumption of the linearity, a peak-to-peak value of the input timing jitter is also amplified by the gain of the jitter transfer function, so that the resultant value is given as a peak-to-peak value of the output timing jitter. Next, a method for measuring the gain of the jitter transfer function in frequency domain and time domain is discussed.

When $|\Delta\Theta(f_J)|$ is not zero, the gains corresponding to the peak jitter and the RMS jitter can be estimated in frequency domain by the following equations, respectively.

$$[|H_J(f_J)|^2] = \frac{\text{Worst}\lfloor|\Delta\Phi[f_J]|^2\rfloor}{\max[|\Delta\Theta[f_J]|^2]} = \frac{\max\lfloor|\Delta\Phi[f_J]|^2\rfloor}{\max[|\Delta\Theta[f_J]|^2]} \quad (11)$$

$$[|H_J(f_J)|^2] = \frac{\text{average}\lfloor|\Delta\Phi[f_J]|^2\rfloor}{\text{average}\lfloor|\Delta\Theta[f_J]|^2\rfloor} \quad (12)$$

Since the jitter transfer function is given as the frequency response function of the constant-parameter linear system, the jitter transfer function is not a function of the applied input amplitude. Based on this fact, the procedure in which the jitter transfer function is estimated in time domain is described. First, the peak-to-peak value of the input timing jitter is set in a segment in which the operation of the DUT is linear, and then the input/output relationship between $\Delta\theta[nT]$ and $\Delta\phi[nT]$ are measured for plural times. Thereafter, the input/output relationship between $\Delta\theta[nT]$ and $\Delta\phi[nT]$ shown in FIG. 8 is subjected to a least squares fit of a straight line. The gains of the jitter transfer function are estimated from the slope of the straight line.

$$\sqrt{[|H_J(f_J)|^2]} \approx \frac{d(\Delta\phi_{PP})}{d(\Delta\theta_{PP})}\bigg|_{LinearOperation} \quad (13)$$

$$\sqrt{[|H_J(f_J)|^2]} \approx \frac{d(\Delta\sigma_{\Delta\phi})}{d(\Delta\sigma_{\Delta\theta})}\bigg|_{LinearOperation} \quad (14)$$

Please note that the worst-case value in a certain time period corresponds to the peak-to-peak value (the peak value in frequency domain).

From the assumption of the linearity, a peak-to-peak value of the input jitter is amplified by the gain $|H_J(f_J)|$ of the jitter transfer function, so as to provide a peak-to-peak value of the timing jitter of the recovered clock. The jitter transfer function can be estimated from a ratio of the peak values or mean values of the input and output jitters. Next, a method for measuring the gain of the jitter transfer function in frequency domain and time domain is discussed.

When $|\Theta(f_J)|$ is not zero, the gain of the jitter transfer function can be estimated in frequency domain from the peak values or mean values of the timing jitter spectra (phase noise spectra) as follows:

$$[|H_J(f_J)|^2] = \frac{\max\lfloor|\Delta\Phi[f_J]|^2\rfloor}{\max[|\Delta\Theta[f_J]|^2]} \quad (15)$$

$$[|H_J(f_J)|^2] = \frac{\text{average}\lfloor|\Delta\Phi[f_J]|^2\rfloor}{\text{average}\lfloor|\Delta\Theta[f_J]|^2\rfloor} \quad (16)$$

Since the jitter transfer function is given as the frequency response function of the constant-parameter linear system, the jitter transfer function is not a function of the applied input amplitude to the system. Based on this fact, the procedure in which the jitter transfer function is estimated in time domain is described. First, the peak-to-peak value of the input timing jitter is set in a region in which the operation of the clock recovery device under test is a linear operation, and then the input/output relationship between $\Delta\theta[nT]$ and $\Delta\phi[nT]$ are measured for plural times. Thereafter, when the input/output relationship of the peak-to-peak jitter or the RMS jitter between $\Delta\theta[nT]$ and $\Delta\phi[nT]$ is subjected to linear fitting, as shown in FIG. 8, the gain of the jitter transfer function is obtained from the slope of the line as follows:

$$\sqrt{[|H_J(f_J)|^2]} \approx \frac{d(\Delta\phi_{PP})}{d(\Delta\theta_{PP})}\bigg|_{LinearOperation} \quad (17)$$

$$\sqrt{[|H_J(f_J)|^2]} \approx \frac{d(\Delta\sigma_{\Delta\phi})}{d(\Delta\sigma_{\Delta\theta})}\bigg|_{LinearOperation} \quad (18)$$

For example, in order to obtain the gain of the jitter transfer function by linear fitting, the measuring apparatus 100 may measure the input/output relationship between the input timing jitter sequence $\Delta\theta[nT]$ and the output timing jitter sequence $\Delta\phi[nT]$ about four times.

Figure 9:
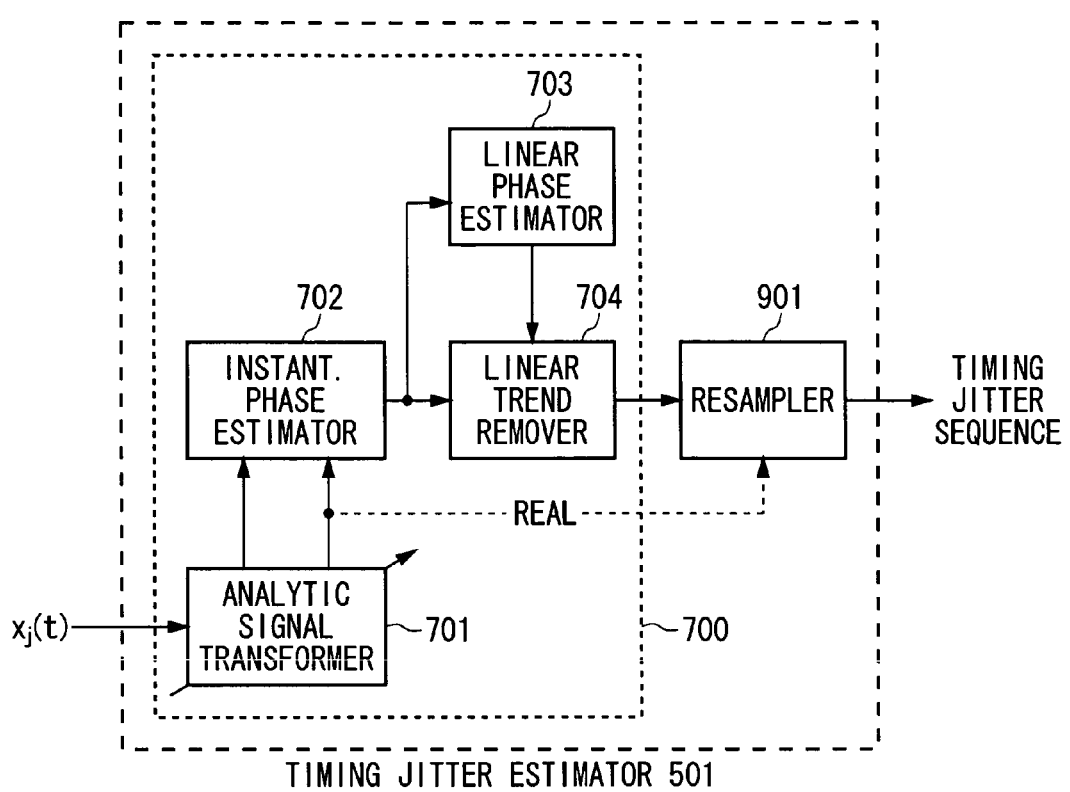
FIG. 9 shows an example of the structure of the timing jitter estimator 501.

FIG. 9 illustrates an exemplary structure of the timing jitter estimator 501. The timing jitter estimator 501 includes the instantaneous phase noise estimator 700 and the resampler 901. The instantaneous phase noise estimator 700 includes an analytic signal transformer 701 that transforms the received signal to an analytic signal, that is a complex signal, an instantaneous phase estimator 702 that estimates the instantaneous phase of the analytic signal based on the analytic signal, a linear phase estimator 703 that estimates an instantaneous linear phase of the signal received by the analytic signal transformer 701 based on the instantaneous phase of the analytic signal, and a linear trend remover 704 that calculates an instantaneous phase noise by removing the linear instantaneous phase from the instantaneous phase based on the instantaneous phase and the linear instantaneous phase. The instantaneous phase noise estimator 700 may calculate the instantaneous phase noise in the output signal of the DUT, or may calculate both the instantaneous phase noise in the output signal of the DUT and the instantaneous phase noise in the input signal to the DUT. The timing jitter estimator 501 may calculate the output timing jitter in the output signal of the DUT, or may calculate the output timing jitter sequence in the output signal of the DUT and the input timing jitter sequence in the input signal to the DUT. Moreover, the analytic signal transformer 701 may generate the analytic signal based on predetermined frequency components of the received signal.

Figure 16:
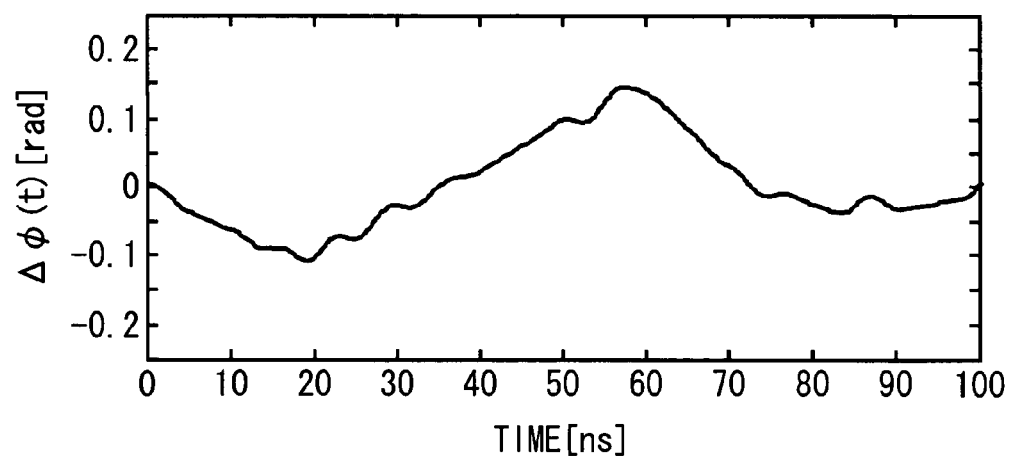
FIG. 16 shows an example of the instantaneous phase noise Δφ(t).
Figure 17:
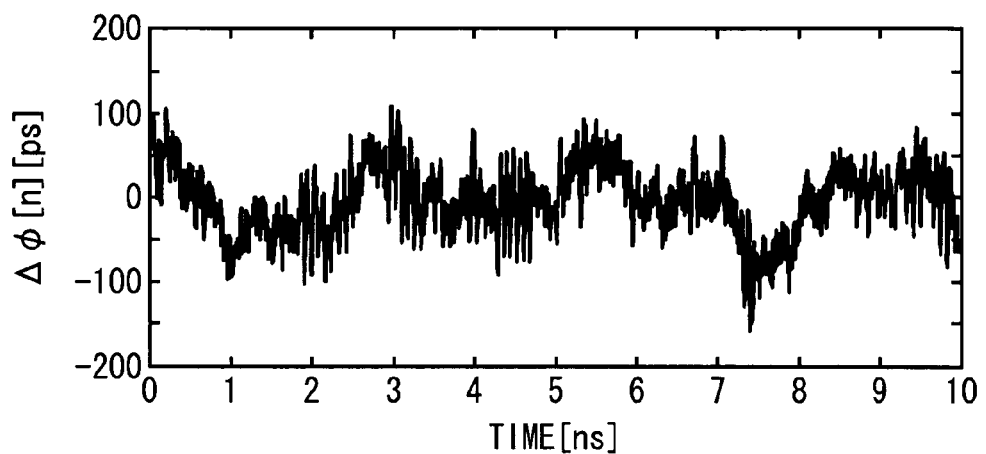
FIG. 17 shows an example of the timing jitter sequence Δφ[n].

Referring to FIGS. 16 and 17, the resampler 901 outputs the timing jitter sequence that was obtained by sampling of the instantaneous phase noise generated by the linear trend remover 704 at the zero-crossing timings. By sampling the instantaneous phase noise at the zero-cross timings, the phase noise at the edges of the signal can be detected. Thus, the gain of the jitter transfer function can be calculated with high precision.

Figure 10:
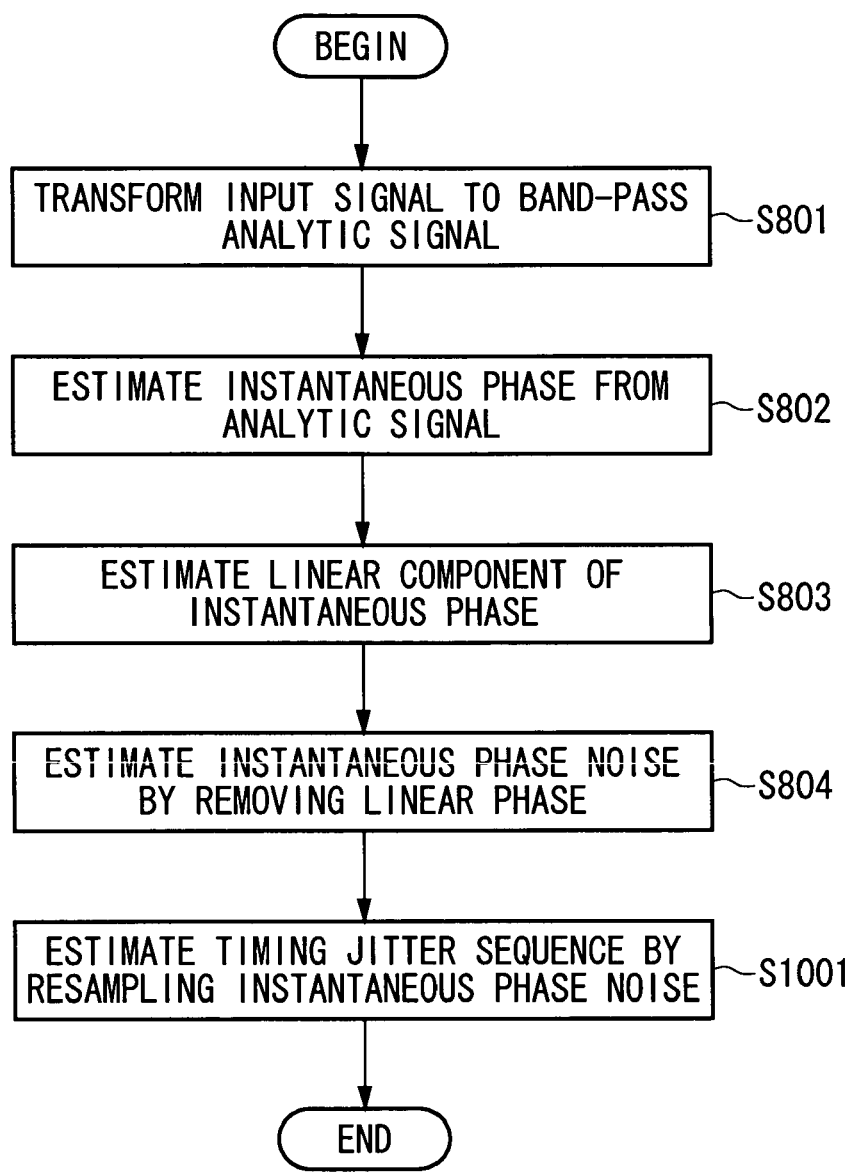
FIG. 10 is a flowchart of an example of step of timing jitter estimation S221.

FIG. 10 is a flowchart of an example of step of timing jitter estimation S221. Timing jitter estimation step S221 transforms the signal received to the analytic signal in analytic signal transforming step S801. Step S801 performs the transform in a similar manner to the analytic transformer 701 described referring to FIG. 9. Step S801 may be performed by using the analytic signal transformer 701.

Next, step of instantaneous phase estimation S802 estimates the instantaneous phase of the analytic signal. Step S802 performs the estimation in the similar manner to the instantaneous phase estimator 702 described referring to FIG. 9, and may be performed by using the instantaneous phase estimator 702.

Next, step of linear instantaneous phase estimator S803 estimates the linear component of the instantaneous phase of the signal received in step S801. Step S803 estimates the linear component of the instantaneous phase of the received signal in a similar manner to the linear phase estimator 703 described referring to FIG. 9. Step S803 may be performed by using the linear phase estimator 703.

Next, linear trend removal step S804 removes the linear component from the instantaneous phase so as to calculate the instantaneous phase noise. Step S804 performs the calculation in a similar manner to the linear trend remover 704 described referring to FIG. 9. Step S804 may be performed by using the linear trend remover 704.

Next, Resampling step S1001 generates the timing jitter sequence obtained by sampling of the instantaneous phase noise. Step S1001 generates the timing jitter sequence in a similar manner to that of the resampler 901 described referring to FIG. 9. Moreover, step S1001 may be performed by using the resampler 901.

Figure 11:
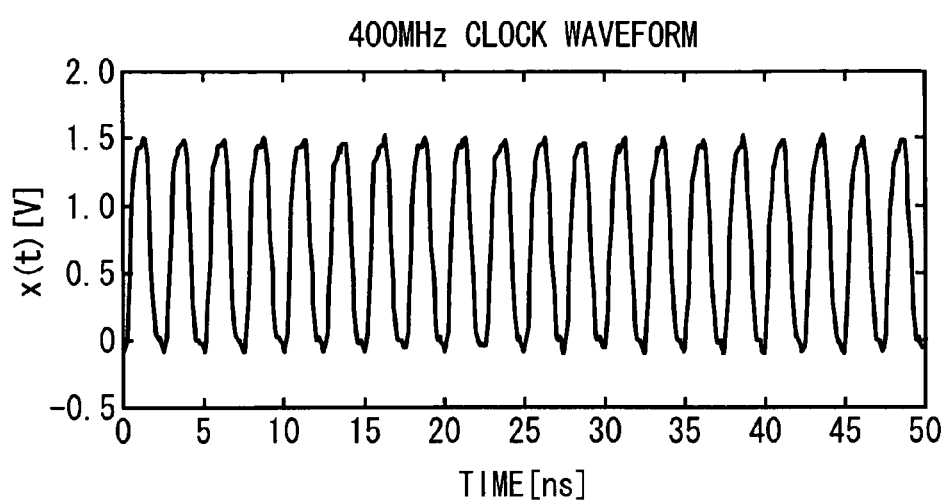
FIG. 11 shows an example of the output signal x(t) output from the DUT.

FIG. 11 shows an example of the output signal x(t) output from the DUT. In the present example, the timing jitter estimator 501 estimates the output timing jitter sequence of the output signal. The output signal is jittery. The analytic signal transformer 701 transforms the output signal to a complex analytic signal. In this example, the analytic signal transformer 701 performs such transform by using Hilbert transform that is described later.

Figure 12:
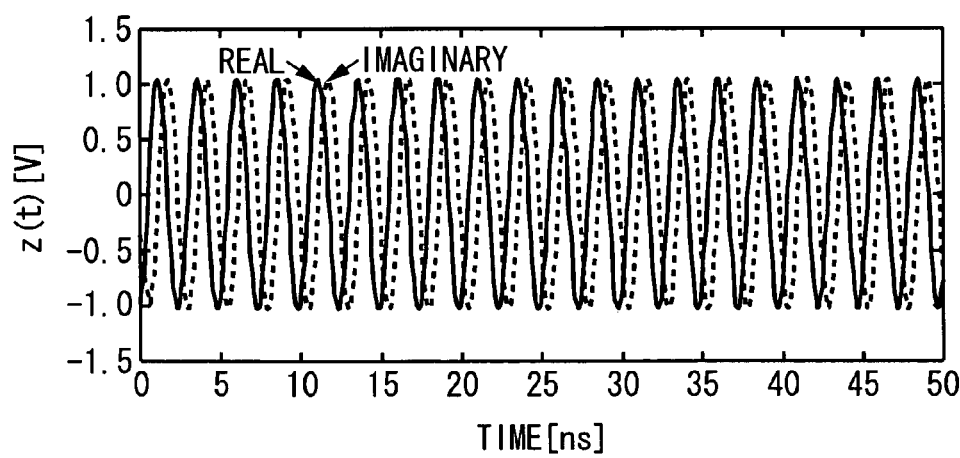
FIG. 12 shows an example of the analytic signal z(t) generated by the analytic signal transformer 701.

FIG. 12 shows an example of the analytic signal z(t) generated by the analytic signal transformer 701 which generates an analytic signal having a real part and an imaginary part by using Hilbert transform. In FIG. 12, the real part of the analytic signal is shown with a solid line while the imaginary part is shown with a broken line. The instantaneous phase estimator 702 calculates the instantaneous phase of the analytic signal. The details of the calculation of the instantaneous phase are described later.

Figure 13:
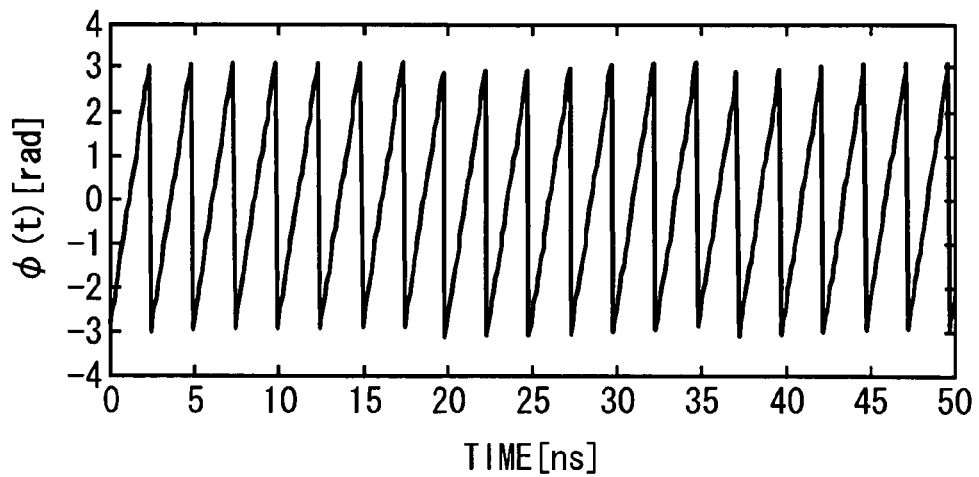
FIG. 13 shows an example of the instantaneous phase φ(t) calculated by the instantaneous phase estimator 702.

FIG. 13 shows an example of the instantaneous phase φ(t) calculated by the instantaneous phase estimator 702. The instantaneous phase estimator 702 unwraps the instantaneous phases to remove discontinuities from it and get a continuous phase.

Figure 14:
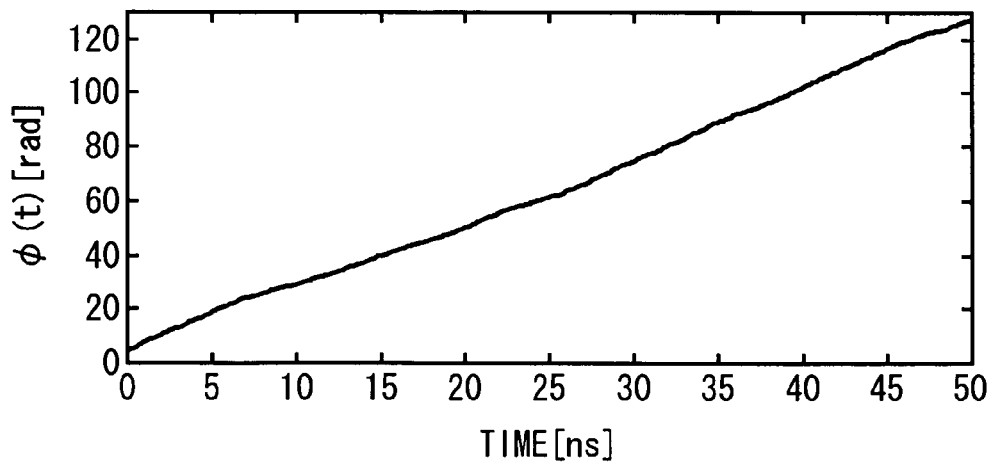
FIG. 14 shows an example of the unwrapped instantaneous phase φ(t).

FIG. 14 shows an example of the unwrapped instantaneous phase φ(t). The linear phase estimator 703 calculates the linear component of the instantaneous phase of the signal received by the timing jitter estimator 501, based on the unwrapped instantaneous phase. The linear phase estimator 703 performs a least squares fit of a straight line to the unwrapped instantaneous phase to get the linear instantaneous phase.

Figure 15:
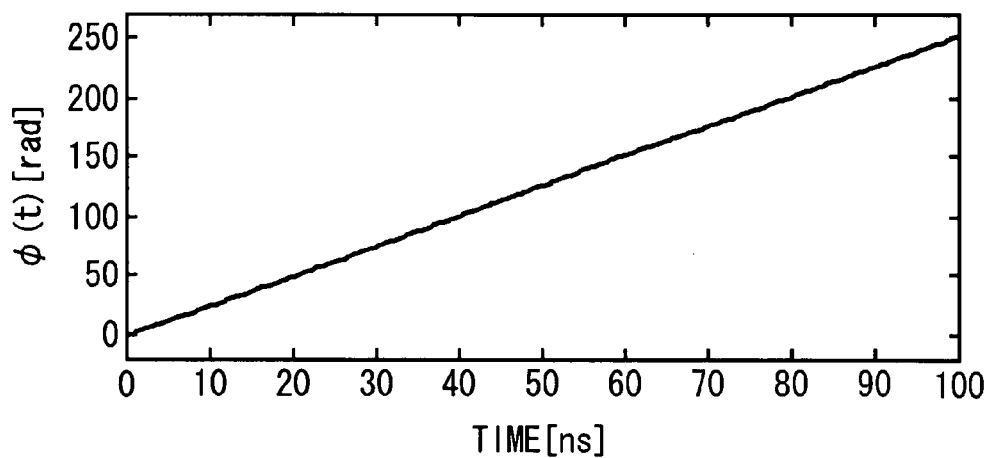
FIG. 15 shows an example of the instantaneous linear phase φ(t).

FIG. 15 shows an example of the instantaneous linear phase φ(t). The linear trend remover 704 calculates the instantaneous phase noise by removing the linear component from the unwrapped instantaneous phase. That is, the linear trend remover 704 calculates the difference between the unwrapped instantaneous phase shown in FIG. 14 and that of the instantaneous linear phase shown in FIG. 15 as the instantaneous phase noise.

FIG. 16 shows an example of the instantaneous phase noise Δφ(t). The resampler 901 calculates the timing jitter values of the signal received by the timing jitter estimator 501 based on the instantaneous phase noise. The resampler 901 performs sampling of the instantaneous phase noise waveform Δφ(t) at the closest timings to the respective zero-crossings of the real part x(t) of the analytic signal z(t), that are called as approximated zero-crossing timings, so as to calculate the instantaneous phase noise at the zero-crossing timing $nT_0$, i.e., the timing jitter sequence Δφ[n] (=Δφ($nT_0$)). By estimating the gain of the jitter transfer function from timing jitter sequences (the instantaneous phase noises at the zero-cross timings), the gain of the jitter transfer function can be calculated precisely.

FIG. 17 shows an example of the timing jitter sequence Δφ[n]. The jitter gain estimator 502 calculates the RMS value and peak-to-peak value of the timing jitter based on the timing jitter sequence. The RMS timing jitter $Δφ_{RMS}$ is the mean square value of the timing jitter sequence Δφ[n] and is calculated by the jitter gain estimator 502 in accordance with the following equation.

$$\Delta\phi_{RMS} = \sqrt{\frac{1}{N}\sum_{k=1}^{N}\Delta\phi^2[k]} \quad [rad] \tag{19}$$

N is the number of samples of the timing jitter that were measured. On the other hand, the peak-to-peak timing jitter $Δφ_{PP}$ is the difference between the maximum value and the minimum value of Δφ[n] and is calculated by the jitter gain estimator 502 based on the following equation.

$$\Delta\phi_{PP} = \max_{k}(\Delta\phi[k]) - \min_{k}(\Delta\phi[k]) \quad [rad] \tag{20}$$

Next, the detection of the zero-crossings is described.

Figure 18:
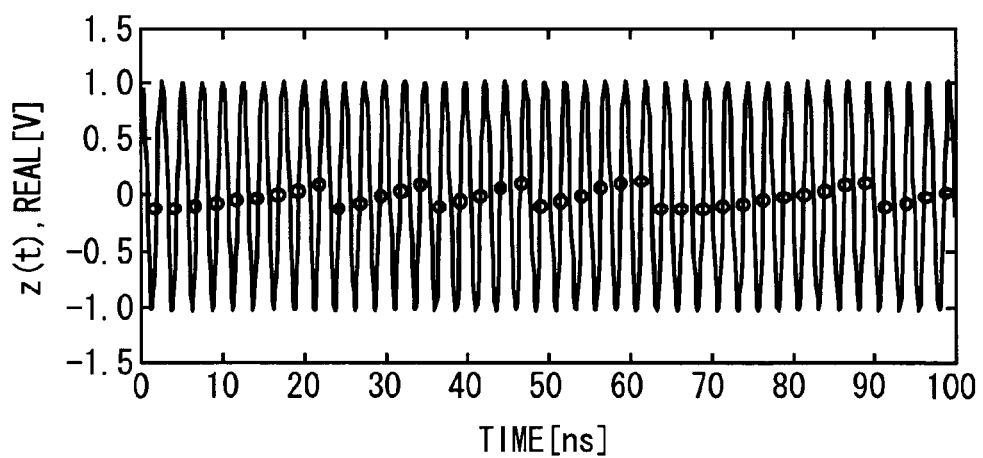
FIG. 18 shows an exemplary real part of the analytic signal z(t).

FIG. 18 shows an exemplary real part of the analytic signal z(t). First, where the maximum value and the minimum value of the real part of the analytic signal of the input signal to be measured are assumed to be 100% level and 0% level, respectively. Thus a 50% level value $V_{50\%}$ can be calculated. Then, the difference between each of the adjacent sampled values of the real part of the analytic signal and the 50% level value $V_{50\%}$, (x(j−1)−$V_{50\%}$) and (x(j)−$V_{50\%}$) is obtained, and thereafter the product of the thus obtained values, (x(j−1)−$V_{50\%}$)×(x(j)−$V_{50\%}$) is calculated. When x(t) crosses the 50% level, that is, the zero-crossing level, the signs of the adjacent sampled values (x(j−1)−$V_{50\%}$) and (x(j)−$V_{50\%}$) change from negative to positive or from positive to negative. Thus, when the above product value is negative, it is determined that x(t) has crossed the zero-crossing level. Therefore, the time j−1 or j that corresponds to one of the sampled values (x(j−1)−$V_{50\%}$) and (x(j)−$V_{50\%}$). Thus, x(j−1) or x(j) that has the smaller absolute value than the other is determined as the approximated zero-crossing. In FIG. 18, circles respectively represent the closest points to the rising zero-crossings, i.e., the approximated zero-crossings, that were detected.

The jitter gain estimator 502 described referring to FIG. 3 calculates the gain of the jitter transfer function of the above-described DUT based on the RMS value or the peak-to-peak value of the input and output timing jitter described above. Moreover, jitter phase difference estimator 503 described referring to FIG. 5 calculates the phase of the jitter transfer function of the above-described DUT from the input timing jitter sequence and the output timing jitter sequence. Next, the calculation of the bit error rate, which the bit error rate estimator 102 described referring to FIG. 1 calculates based on the gain of the jitter transfer function, is described.

Figure 19:
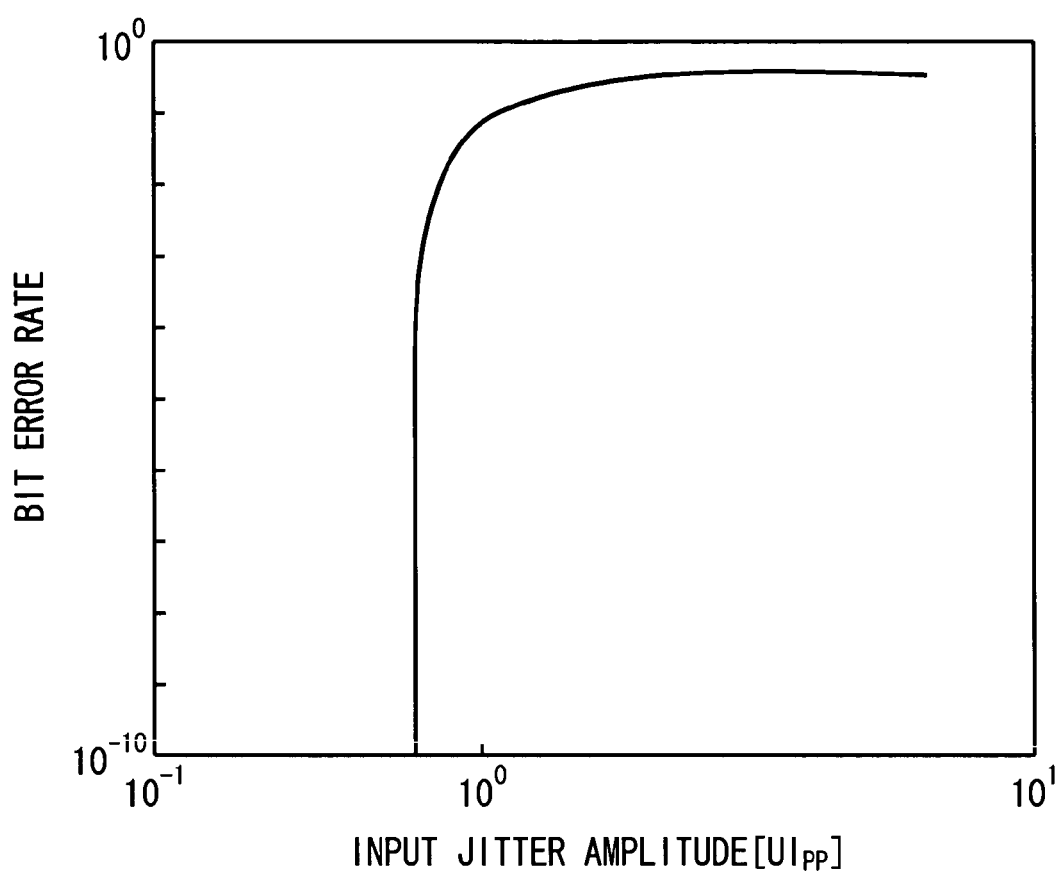
FIG. 19 shows an example of the bit error rate calculated by the bit error rate estimator 102.

FIG. 19 shows an example of the bit error rate calculated by the bit error rate estimator 102. In FIG. 19, the horizontal axis represents the peak-to-peak value of the input timing jitter while the vertical axis represents the bit error rate. In the shown example, a sinusoidal jitter is used to fluctuate the clock of the input bit stream to be supplied to the DUT.

The instantaneous phase $\Delta\theta[nT]$ of the bit clock is modulated by a sine wave $\cos(2\pi f_{PM} t)$. The data stream input to the DUT has the following timing jitter.

$$\Delta\theta[nT]=K_i \cos(2\pi f_{PM}t)|_{t=nT} \quad (21)$$

In this equation, $2K_i$ is the peak-to-peak value of the input jitter, while $f_{PM}$ is the phase modulation frequency. When the sinusoidal jitter that is sufficiently larger than the internal jitter generated by the DUT itself is applied to the DUT, the output timing of the recovered clock becomes $$\Delta\phi[nT]=K_i|H_J(f_{PM})|\exp(-j\angle H_J(f_{PM}))\cos(2\pi f_{PM}t)|_{t=nT} \quad (22)$$

Where $H_J(f_{PM})$ is the jitter transfer function of the DUT.

The DUT has a clock recovery unit, and $H_J(f_{PM})$ corresponds to the jitter transfer function of the clock recovery unit. From Equations (21) and (22), the peak-to-peak values of the sinusoidal jitter are bounded, namely, $$\Delta\theta_{PP}<M_1, \Delta\phi_{PP}<M_2 \quad (23)$$

The jitter frequency $f_J$ is represented by the phase modulation frequency $f_{PM}$.

$$f_J=f_{PM} \quad (24)$$

Thus, the worst-case value and the mean value of the peak jitter at the jitter frequency $f_J$ are obtained as follows:

$$\text{Worst } \lfloor |\Delta\Phi[f_J]|^2 \rfloor = \lfloor |H_J(f_J)|^2 \rfloor \max \lfloor |\Delta\Theta[f_J]|^2 \rfloor \quad (25)$$

$$\text{mean } \lfloor |\Delta\Phi[f_J]|^2 \rfloor = \quad (26)$$
$$\lfloor |H_J(f_J)|^2 \rfloor \text{ mean } \lfloor |\Delta\Theta[f_J]|^2 \rfloor \approx \text{average}[|H_J(f_J)\Delta\Theta[f_J]|^2] = \frac{1}{n_d}\sum_1^{n_d}|H_J(f_J)\Delta\Theta[f_J]|^2$$

Moreover, the peak-to-peak jitter value and the RMS value in time domain are obtained as follows:

$$\Delta\phi_{PP}=\max\{(\text{Worst }[|\Delta\Phi[f_J]|^2])^{0.5}\exp(j2\pi f_J k)\} - \min\{(\text{Worst }[|\Delta\Phi[f_J]|^2])^{0.5}\exp(j2\pi f_J k)\} \quad (27)$$

$$\sigma_{\Delta\phi} = \sqrt{\frac{1}{L}\{(\text{mean}[|\Delta\Phi[f_J]|^2)^{0.5}\exp(j2\pi f_J k)\}^2} \quad (28)$$

In the above equations, $|X|^2$ or $(|X|^2)^{0.5}$ can be calculated as $|X|$. From the above equations, when the sinusoidal jitter is applied to the input signal, the sinusoidal jitter provides deterministic jitter to the DUT. Moreover, the probability density function of the sinusoidal jitter corresponds to the worst case. The details of the sinusoidal jitter are described later.

Next, a bit error rate equation is derived considering the fluctuation of the rising edges of the input data stream due to the applied input jitter. When the timings $t_{zero-crossing}$ of the adjacent rising edges cross $t_{decision}$, respectively, the preceding bit or the next bit is discriminated at $t_{decision}$. That is, an erroneous decoding occurs. Since the probability of error for the preceding bit is equal to that for the next bit, the bit error rate is given as follows:

$$BER = f(\Delta align_{PP}) = \quad (29)$$
$$\frac{1}{2}P_e(t_{decision}<t_{zero-crossing})+\frac{1}{2}P_e(t_{zero-crossing}<t_{decision})$$

For simplification, $t_{decision}$ is regarded as the optimum sampling instant and the timing fluctuation $\Delta\phi[nT]$ at this optimum sampling instant can be incorporated into the fluctuation of the input data stream, $\Delta\theta[nT]$. It follows that only calculating the bit error rate caused by the alignment jitter is sufficient to get the desired estimates. Moreover, due to the symmetry of sinusoidal jitter distribution, Equation (29) can be re-written as:

$$BER=f(\Delta align_{PP})=P_e(t_{decision}<t_{zero-crossing}) \quad (30)$$

Here, an alignment jitter is described. The alignment jitter is defined by P. R. Trischitta, and represents an alignment error between the timing jitter of the input signal and the timing jitter of the output signal (recovered clock). The alignment jitter is defined by the following equation.

$$\Delta align[nT]=|(\Delta\phi[nT]-\Delta\theta[nT])| \quad (31)$$

$\Delta\theta[nT]$ is the timing jitter of the input signal to the DUT and $\Delta\phi[nT]$ is the timing jitter of the output signal input.

From Equation (31), when the probability density function of the alignment jitter is obtained by substituting Equations (21) and (22) for terms in Equation (31), the following equation is obtained.

$$\Delta align[nT]=|K_i\{|H_J(f_{PM})|\exp(-j\angle H_J(f_{PM}))-1\}\cos(2\pi f_{PM}t)|_{t=nT} \quad (32)$$

When a certain value is given as the phase modulation frequency $f_{PM}$, $K_i\{|H_J(f_{PM})|\exp(-j\angle H_J(f_{PM})-1)\}$ becomes constant. Therefore, in the case of the sinusoidal jitter input, the probability density function of the alignment jitter follows a sinusoidal distribution.

$$p(x) = \begin{cases} \dfrac{1}{\pi\sqrt{X^2-x^2}} & |x|<X \\ 0 & |x|\geq X \end{cases} \quad (33)$$

Here, $X=K_i\{|H_J(f_{PM})|-1\}$. For simplification, the above sinusoidal distribution is approximated as a uniform distribution.

$$p(x) = \begin{cases} \dfrac{1}{2X} & |x|<X \\ 0 & |x|\geq X \end{cases} \quad (34)$$

where $X=\Delta\phi_P=\Delta\theta_P\{|H_J(f_{PM})|-1\}$.

Figure 20:
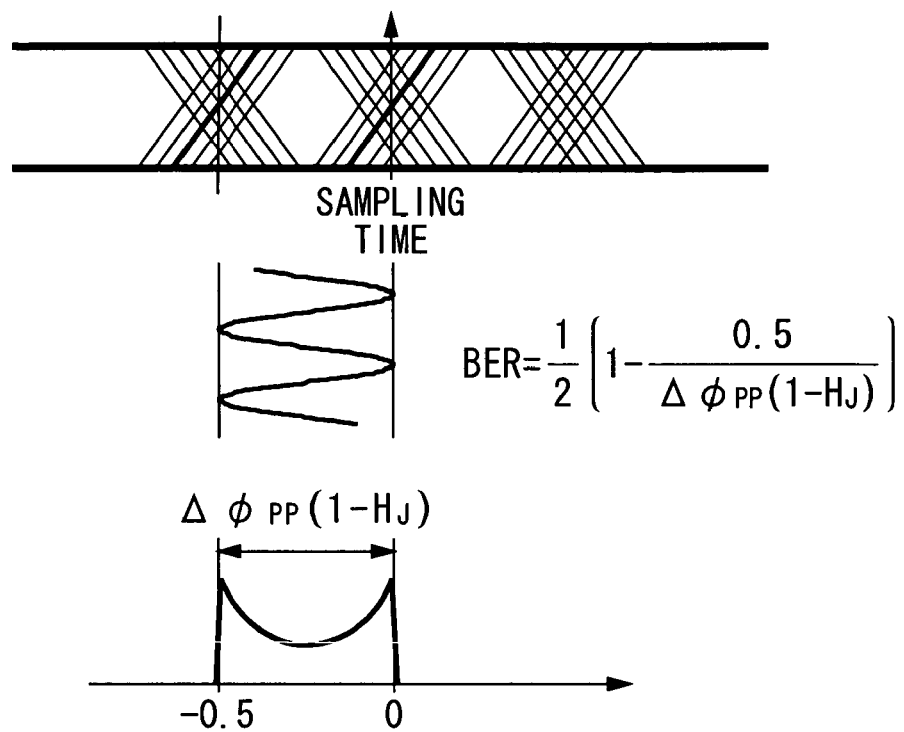
FIG. 20 shows the alignment jitter in the worst case.

FIG. 20 shows the alignment jitter in the worst case. The minimum input jitter 0.5 $UI_{PP}$ makes the recovered bit swing between 0 UI and 0.5 UI. From Equation (30), the probability of error that the random variable following the uniform distribution exceeds $t_{decision}$ is given by $$BER = p(x)(X - t_{decision}) = \frac{1}{2}\left\{1 - \frac{t_{decision}}{\Delta\theta_{PP}\{|H_J(f_{PM})|-1|\}}\right\} \quad (35)$$

The sampling instant $t_{decision}$ should be at the center of the bit time interval or as 0.5 UI (Unit Interval). Thus, the bit error rate becomes:

$$BER = \frac{1}{2}\left\{1 - \frac{1}{2\Delta\theta_{PP}\{|H_J(f_{PM})|-1|\}}\right\} \quad [UI] \quad (36)$$

The bit error rate estimator 102 may calculate the bit error rate of the DUT based on Equation (36). In other words, based on the gain $H_J(f_{PM})$ of the jitter transfer function of the DUT, the relationship between the input timing jitter and the bit error rate shown in FIG. 19 can be calculated.

The measuring apparatus 100 may calculate a jitter tolerance of the DUT. Please note that the jitter tolerance means the amount of the input timing jitter that provides the bit error rate of a predetermined value or more. For example, the jitter tolerance may be the minimum amount of the input timing jitter that provides the bit error rate larger than zero.

The bit error rate of the DUT can be calculated in accordance with Equation (36). The lower limit of the jitter tolerance is given from Equation (36) as follows:

$$inf(\Delta\theta_{PP}) = \frac{1}{2||H_J(f_{PM})|-1|} \quad (37)$$

Since $|H_J(f_{PM})|$ is generally less than 1, the bit error rate and the jitter tolerance may be calculated by $||H_J(f_{PM})|-1|=1-|H_J(f_{PM})|$ in Equations (36) and (37).

The measuring apparatus 100 of this example calculates the bit error rate and the jitter tolerance based on the alignment errors of the input and output signals that are based on the gain of the jitter transfer function, as described associated with Equations (36) and (37). Since Equations (36) and (37) calculate the bit error rate and the jitter tolerance while considering the internal noise in the DUT to be zero, the bit error rate and the jitter tolerance represented by Equations (36) and (37) are the best-case values thereof. The measuring apparatus 100 may calculate the bit error rate and the jitter tolerance represented by Equations (36) and (37) as the best-case values of the bit error rate and jitter tolerance of the DUT or as the approximated values thereof.

The measuring apparatus 100 may calculate the bit error rate and jitter tolerance further based on the phase of the transfer function as described referring to FIG. 5. When the phase of the jitter transfer function is introduced into the bit error rate and jitter tolerance represented by Equations (36) and (37), $$BER = \frac{1}{2}\left\{1 - \frac{1}{2\Delta\theta_{PP}\{|H_J(f_{PM})|\exp(-jLH_J(f_{PM}))-1|\}}\right\} \quad (38)$$

$$inf(\Delta\theta_{PP}) = \frac{1}{2||H_J(f_{PM})|\exp(-jLH_J(f_{PM}))-1|} \quad (39)$$

are obtained. The measuring apparatus 100 may calculate the bit error rate and jitter tolerance in accordance with Equations (38) and (39). Since the internal noise in the DUT is considered to be zero in Equations (38) and (39) as well as in Equations (36) and (37), the bit error rate and jitter tolerance represented by Equations (38) and (39) are also the best-case values of the bit error rate and jitter tolerance of the DUT. The measuring apparatus 100 may calculate the bit error rate and jitter tolerance represented by Equations (38) and (39) as the best-case values of the bit error rate and jitter tolerance of the DUT or as the approximated values thereof. Moreover, since $$Re(|H_J(f_{PM})|\exp(-jLH_J(f_{PM})))$$

is generally less than 1, the bit error rate and the jitter tolerance may be calculated by $$||H_J(f_{PM})|\exp(-jLH_J(f_{PM}))-1|=1-Re(|H_J(f_{PM})|\exp(-jLH_J(f_{PM})))$$

in Equations (38) and (39).

Moreover, the measuring apparatus 100 may calculate the bit error rate and jitter tolerance of the DUT based on the following equations.

$$BER = \frac{1}{2}\left\{1 - \frac{1}{2\Delta\theta_{PP}\{|H_J(f_{PM})|\exp(-jLH_J(f_{PM}))-1|^\beta\}}\right\} \quad (38.2)$$

$$inf(\Delta\theta_{PP}) = \frac{1}{2||H_J(f_{PM})|\exp(-jLH_J(f_{PM}))-1|^\beta} \quad (39.2)$$

Where $\beta$ is a correction constant which indicates performance degradation of the DUT, and is given in advance by measurement etc.

Moreover, the measuring apparatus 100 may calculate the bit error rate and jitter tolerance of the DUT further based on the internal noise in the DUT. In a case where the DUT includes a PLL for generating the recovered clock and the recovered clock is received as the output signal of the DUT, for example, the measuring apparatus 100 may calculate the bit error rate and the jitter tolerance of the DUT further based on the internal nose in the PLL.

The phase noise caused by the PLL internal noise is given as follows:

$$|1-H_J(f_{PM})\exp(-jLH_J(f_{PM}))|^2|\Delta\phi(f_{PM})|^2(f_{PM} \leq f_b) \quad (40)$$

$$f_b = f_0/2Q \quad (41)$$

In the above, $f_b$ is the upper limit frequency of the band of the output signal of the DUT. For example, in a case where the DUT outputs the recovered clock as the output signal thereof, $f_b$ is the upper limit of the pass band of the PLL loop for generating that recovered clock. $f_b$ can be obtained from the clock frequency $f_0$ in accordance with Equation (41). Alternatively, $f_b$ can be obtained from the maximum value of the phase factor of the jitter transfer function.

When the term related to the phase noise in Equation (40) is added to the bit error rate represented by Equation (38), the following equation is obtained.

$$BER = \frac{1}{2}\left\{1 - \frac{1}{2\Delta\theta_{PP}\{H_J(f_{PM})|e^{-jLH_J(f_{PM})}+1\} \{|H_J(f_{PM})|e^{-jLH_J(f_{PM})}-1|\}}\right\} \quad (42)$$

Therefore, the bit error rate and the lower limit of the jitter tolerance are obtained, respectively.

$$BER = \begin{cases} \frac{1}{2}\left\{1 - \frac{1}{2\Delta\theta_{PP}\{||H_J(f_{PM})|e^{-j\angle H_J(f_{PM})} - 1|\}}\right\} & (f_{PM} > f_b) \\ \frac{1}{2}\left\{1 - \frac{1}{2\Delta\theta_{PP}\{||H_J(f_{PM})|e^{-j\angle H_J(f_{PM})} + 1|\}}{\{||H_J(f_{PM})|e^{-j\angle H_J(f_{PM})} - 1|\}}\right\} & (f_{PM} < f_b) \end{cases} \quad (43)$$

$$inf(\Delta\theta_{PP}) = \begin{cases} \frac{1}{2||H_J(f_{PM})|e^{-j\angle H_J(f_{PM})} - 1|} & (f_{PM} > f_b) \\ \frac{1}{2\{||H_J(f_{PM})|e^{-j\angle H_J(f_{PM})} + 1|\}} & (f_{PM} < f_b) \\ \{||H_J(f_{PM})|e^{-j\angle H_J(f_{PM})} - 1|\} \end{cases} \quad (44)$$

Note that, for $f_{PM} < f_b$, $|H_J(f_{PM})| \approx 1.0$. Thus, it is found that the lower limit of the jitter tolerance below $f_{PM}=f_b$ is degraded to about ½ of the lower limit of the jitter tolerance above $f_{PM}=f_b$. Moreover, since $$Re(|H_J(f_{PM})|\exp(-j\angle H_J(f_{PM})))$$

is generally less than 1, the bit error rate and the jitter tolerance may be calculated by $$||H_J(f_{PM})|\exp(-j\angle H_J(f_{PM})) - 1| = 1 - Re(|H_J(f_{PM})|\exp(-j\angle H_J(f_{PM})))$$

in Equations (43) and (44).

The measuring apparatus 100 may calculate the bit error rate and jitter tolerance of the DUT in accordance with Equations (43) and (44). Since this calculation is further based on the internal noise in the DUT, the bit error rate and jitter tolerance of the DUT can be calculated more precisely.

As described above, the lower limit of the jitter tolerance can be obtained only from the jitter transfer function. For $f_{PM} < f_b$, the measurement of the jitter tolerance corresponds to a test of the effects of the phase noise. Since the jitter transfer function can be calculated simply by a computer, the bit error rate and the lower limit of the jitter tolerance can be calculated from Equations (36), (37), (38), (39), (43) and (44). Therefore, the bit error rate estimator 102 may calculate the bit error rate of the DUT in accordance with any of Equations (36), (38) and (43).

Figure 21:
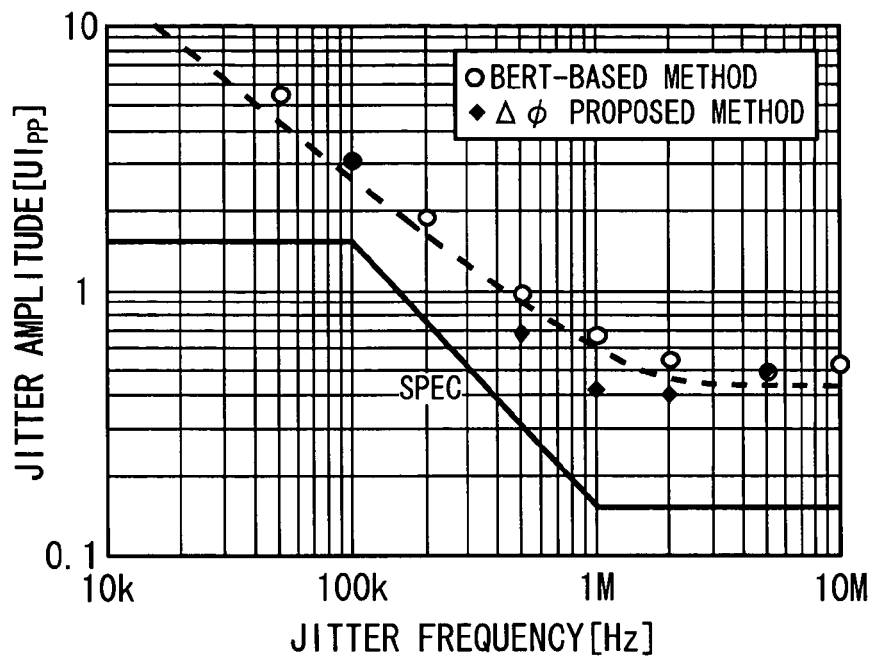
FIG. 21 shows an exemplary relationship between the frequency of the input timing jitter and the jitter tolerance.

FIG. 21 shows an exemplary relationship between the frequency of the input timing jitter and the jitter tolerance. In FIG. 21, the vertical axis represents the jitter tolerance while the horizontal axis represents the frequency of the input timing jitter. Moreover, in FIG. 21, solid line shows an exemplary specification of the DUT while circles show exemplary values actually measured. The jitter tolerance in FIG. 21 corresponds to Equation (44). In addition, when the frequency of the input timing jitter is high, the jitter tolerances calculated in accordance with Equations (39) and (44) are equal to each other. Furthermore, when the frequency of the input timing jitter is higher, Equation (44) approximates to Equation (37). On the other hand, the frequency region of $f_{PM} < f_b$ in Equation (44) corresponds to a slope region on the low-frequency side in FIG. 21.

Figure 22:
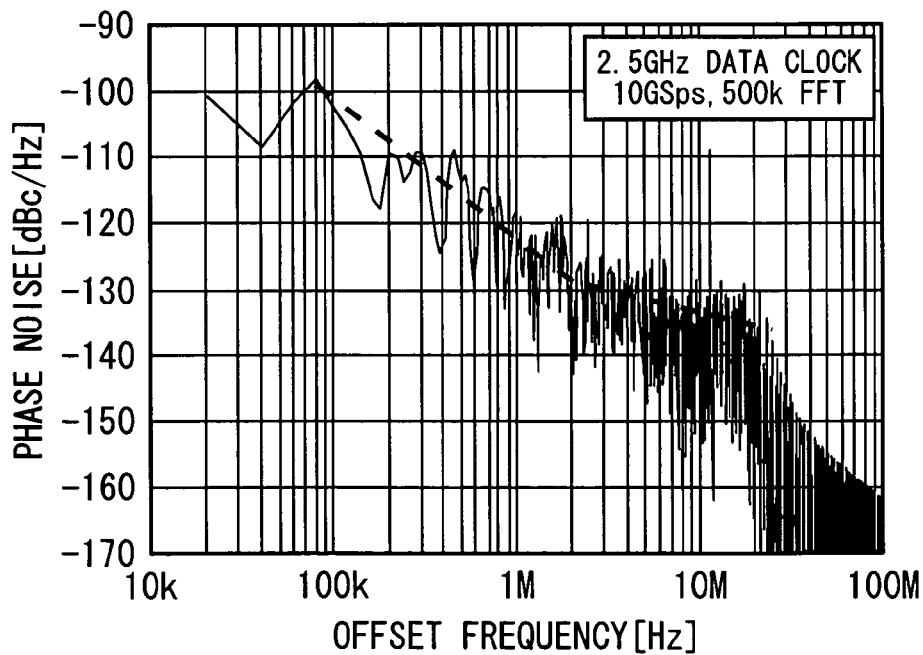
FIG. 22 shows an example of the phase noise spectra.

FIG. 22 shows an example of the phase noise spectra. The slope of the phase noise spectra shown in FIG. 22 corresponds to the slope of the jitter tolerance shown in FIG. 21. From FIGS. 21 and 22, the phase noise spectra and the jitter tolerance have the same slope region over the low jitter frequencies.

Figure 23:
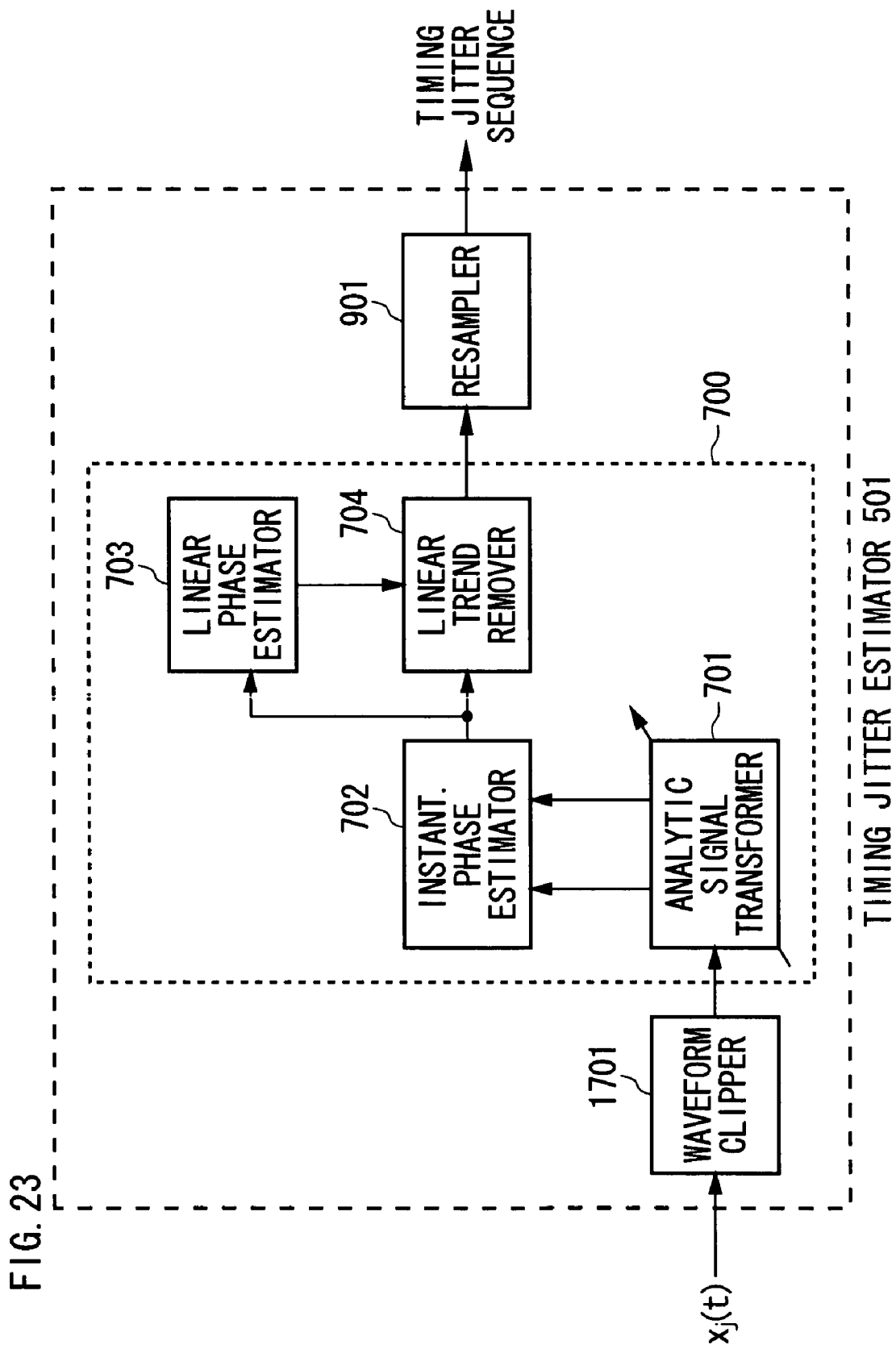
FIG. 23 shows another example of the structure of the timing jitter estimator 501.

FIG. 23 shows another example of the structure of the timing jitter estimator 501. In FIG. 23, the components labeled with the same reference numeral as those in FIG. 9 have the same or similar functions and structures as/to those described referring to FIG. 9. The timing jitter estimator 501 in this example includes the structure of the timing jitter estimator 501 described referring to FIG. 9, and further includes a waveform clipper 1701.

The waveform clipper 1701 removes the amplitude modulation components from the signal received by the timing jitter estimator 501. The waveform clipper 1701 replaces the signal value that is larger than a predetermined first threshold value with the first threshold value and also replaces the signal value that is smaller than a predetermined second threshold value with the second threshold value, so as to remove the amplitude modulation component of the signal. Moreover, the timing jitter estimator 501 described in the other examples may include the waveform clipper 1701 as in the present example. Since the waveform clipper 1701 removes the amplitude modulation components from the signal, the jitter transfer function can be calculated precisely.

Figure 24:
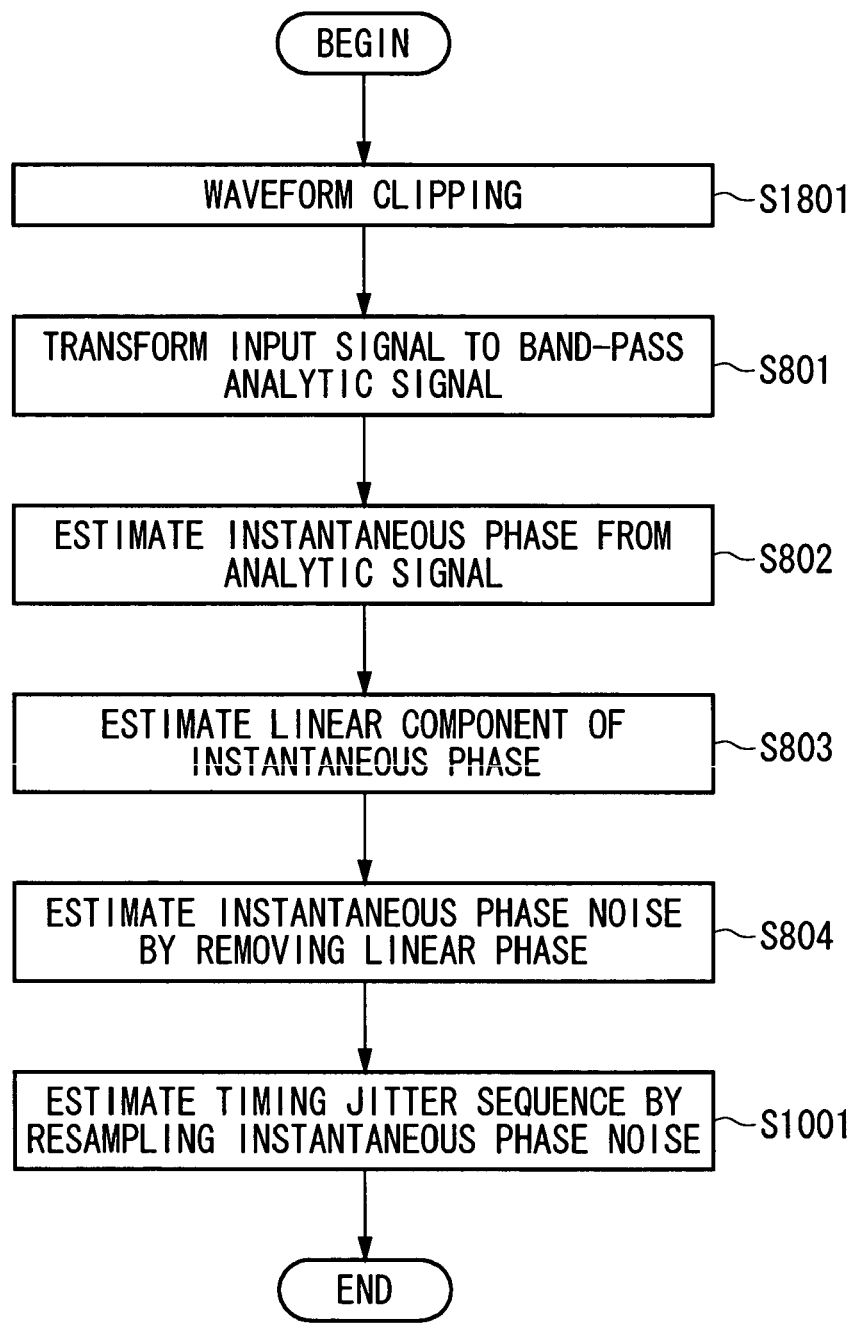
FIG. 24 is a flowchart showing an example of step of timing estimation S221.

FIG. 24 shows another example of step of timing jitter estimation S221. In FIG. 24, the steps having the same reference numerals are the same or similar as/to those described referring to FIG. 10. Timing jitter estimation step S221 in this example includes timing jitter estimation step S221 described referring to FIG. 10 and further includes waveform clipping step S1801.

Waveform clipping step S1801 removes the amplitude modulation components from the signal. Analytic signal transforming step S801 generates an analytic signal of the signal from which the amplitude modulation components have been removed. Step S1801 removes the amplitude modulation components in a similar manner to that of the waveform clipper 1701 described referring to FIG. 23. Moreover, step S1801 may be performed by using the waveform clipper 1701.

Figure 25:
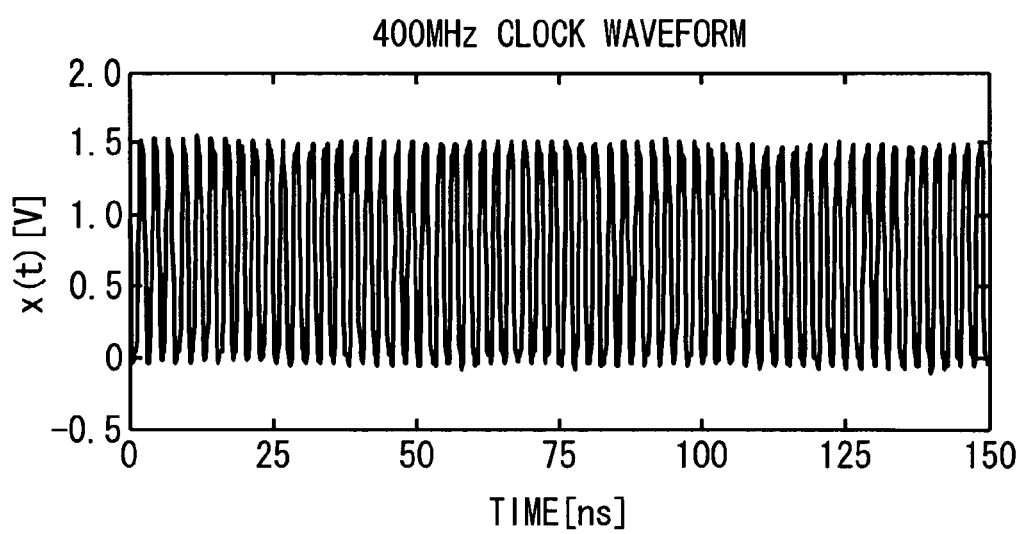
FIG. 25 shows an example of the signal received by the timing jitter estimator 501.
Figure 26:
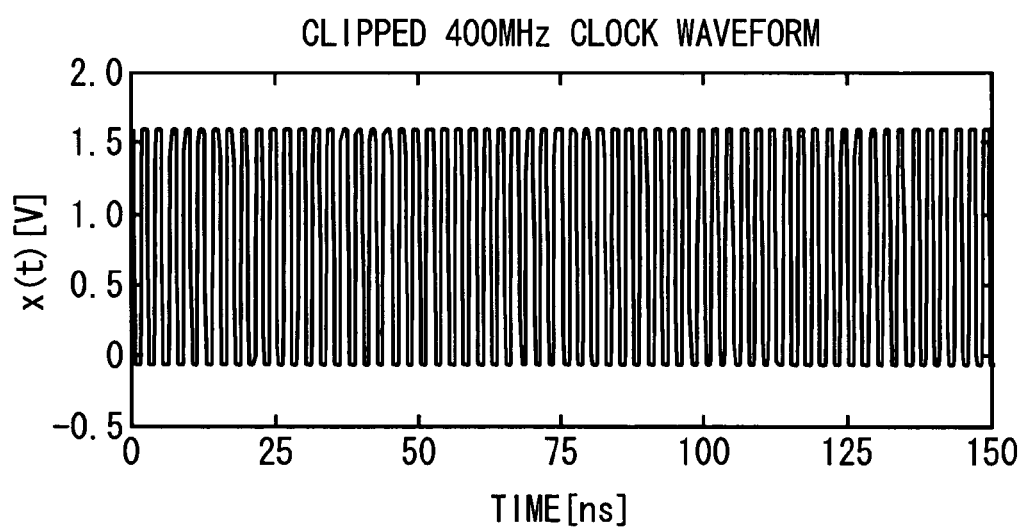
FIG. 26 shows an example of the signal from which the amplitude modulation components have been removed.

FIGS. 25 and 26 are diagrams for explaining the removal of the amplitude modulation components by the waveform clipper 1701. FIG. 25 shows an example of the signal received by the timing jitter estimator 501. The waveform clipper 1701 multiplies the signal value of the analog or digital input signal by a constant, replaces the resultant signal value that is larger than the predetermined first threshold value with the first threshold value, and replaces the resultant signal value that is smaller than the predetermined second threshold value with the second threshold value. Please note that the first threshold value is assumed to be larger than the second threshold value. FIG. 26 shows an example of the signal from which the amplitude modulation components have been removed.

FIG. 27 shows still another example of the structure of the timing jitter estimator 501. In FIG. 27, the components labeled with the same reference numerals as those in FIG. 9 have the same or similar functions and structures as/to those described referring to FIG. 9. The timing jitter estimator 501 in this example includes the structure of the timing jitter estimator 501 described referring to FIG. 9, and further includes a low frequency component remover 1901. The low frequency component remover 1901 extracts frequency components in a desired band from the instantaneous phase noise and outputs the extracted components. The low frequency component remover 1091 may remove the low frequency components from the instantaneous phase noise and output the instantaneous phase noise with no low frequency component. By removing the low frequency components of the instantaneous phase noise, the gain of the jitter transfer function can be calculated more precisely.

Figure 28:
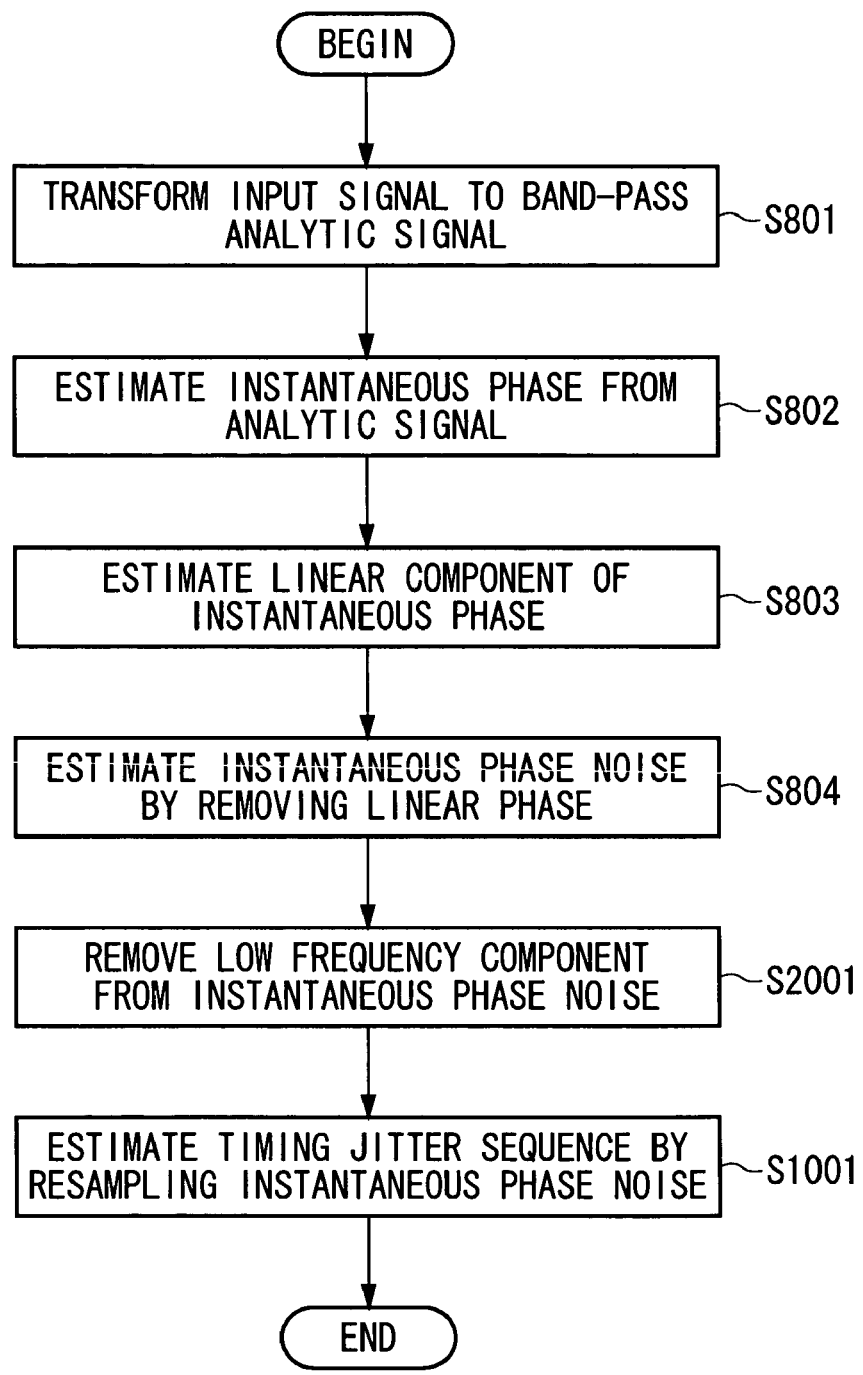
FIG. 28 is a flowchart showing another example of step of timing estimation S221.

FIG. 28 shows another example of step of timing estimation S221. In FIG. 28, the steps having the same reference numerals are the same or similar as/to those described referring to FIG. 10. Timing jitter estimation step S221 includes timing jitter estimation step S221 described referring to FIG. 10 and further includes step of removing low frequency component S2001.

Low frequency component removal step S2001 removes the low frequency components from the signal. Step S2001 removes the low frequency components in a similar manner to that of the low frequency component remover 1901 described referring to FIG. 27. Step S1801 may be performed by using the low frequency component remover 1901.

Figure 29:
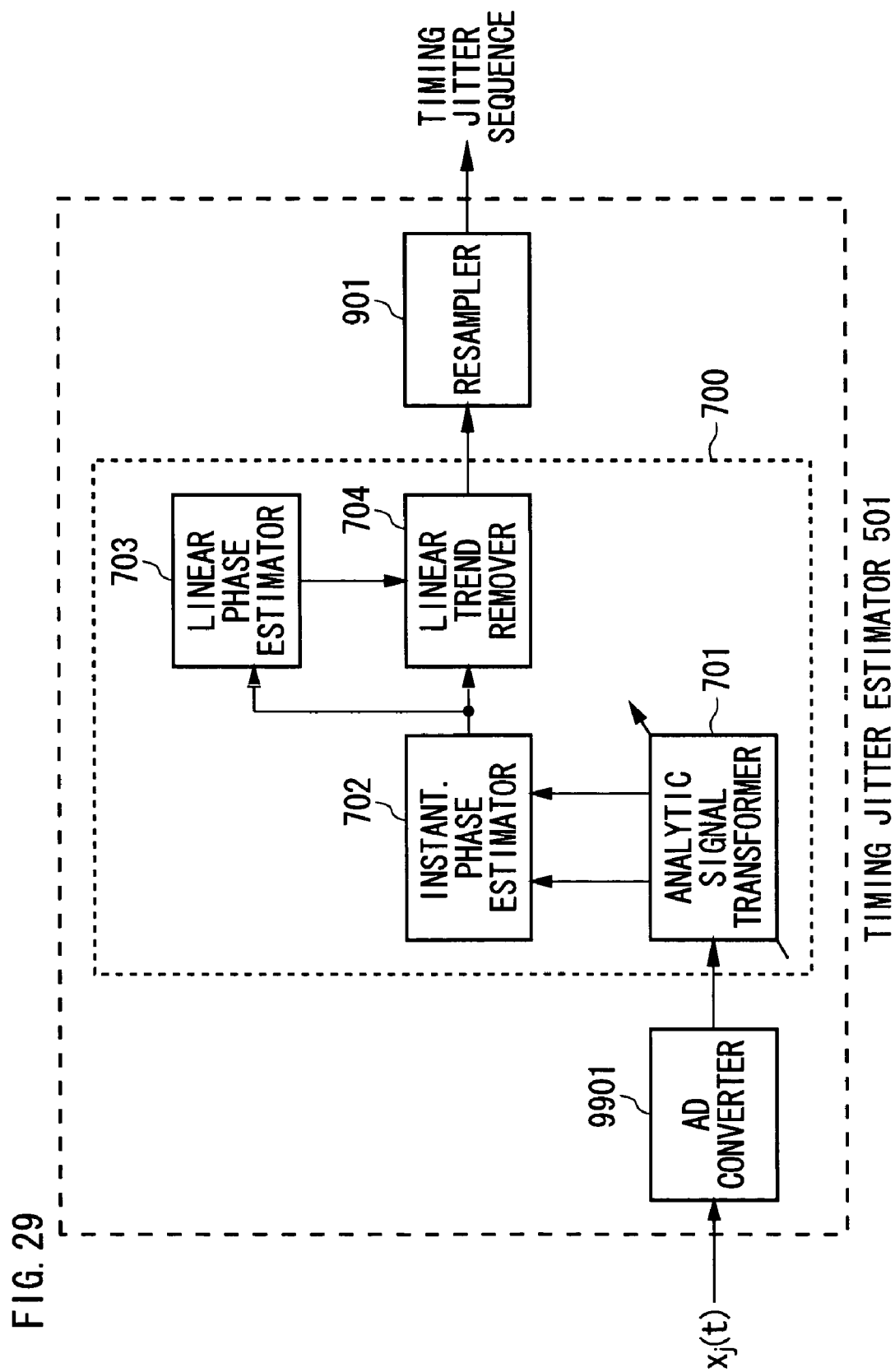
FIG. 29 shows another example of the structure of the timing jitter estimator 501.

FIG. 29 shows another example of the structure of the timing jitter estimator 501. In FIG. 29, the components labeled with the same reference numerals as those in FIG. 9 have the same or similar functions and structures as/to those described referring to FIG. 9. The timing jitter estimator 501 in this example includes the structure of the timing jitter estimator 501 described referring to FIG. 9, and further includes an analog-to-digital (AD) converter 9901.

AD converter 9901 converts the analog signal received by the timing jitter estimator 501 to a digital signal. AD converter 9901 supplies the digital signal to the analytic signal transformer 701, and the analytic signal transformer 701 generates the analytic signal based on the digital signal. AD converter 9901 may use a high-speed AD converter, a digitizer, or a digital oscilloscope. Alternatively, the timing jitter estimator 501 described in the other examples may include the AD converter 9901 same as the timing jitter estimator 501 of this example.

Figure 30:
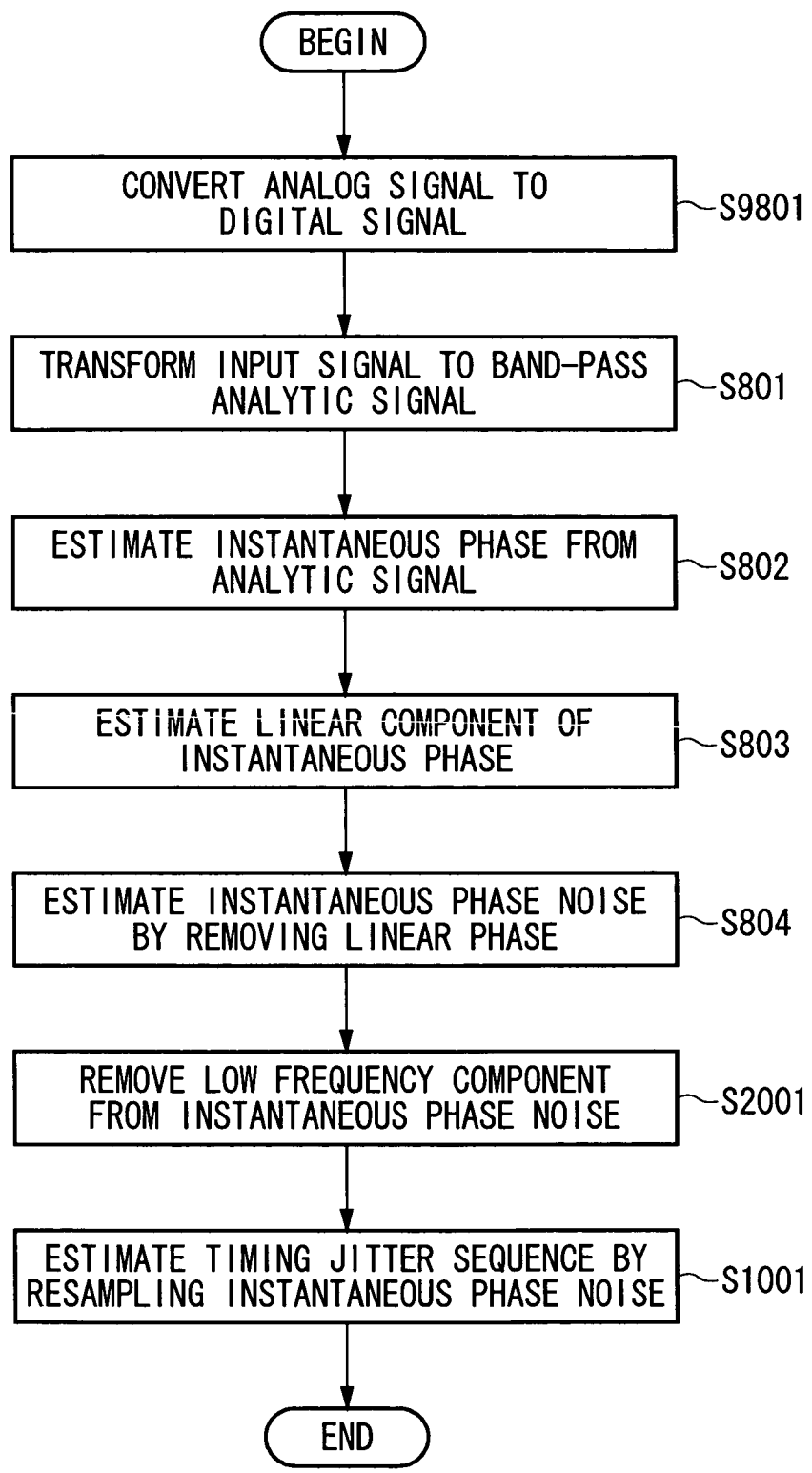
FIG. 30 is a flowchart showing another example of the timing jitter estimation S221.

FIG. 30 is a flowchart showing another example of the timing jitter estimation step S221. In FIG. 30, the steps having the same reference numerals are the same or similar as/to those described referring to FIG. 10. Timing jitter estimation step S221 in this example includes timing jitter estimation step S221 described referring to FIG. 10 and further includes AD conversion step S9801.

AD conversion step S9801 converts the analog signal to a digital signal. Analytic signal transforming step S801 generates the analytic signal of the converted digital signal. Step S9801 converts the analog signal to the digital signal in a similar manner to that of the AD converter 9901 described referring to FIG. 29. Step S9901 may be performed by using the AD converter 9901.

Figure 31:
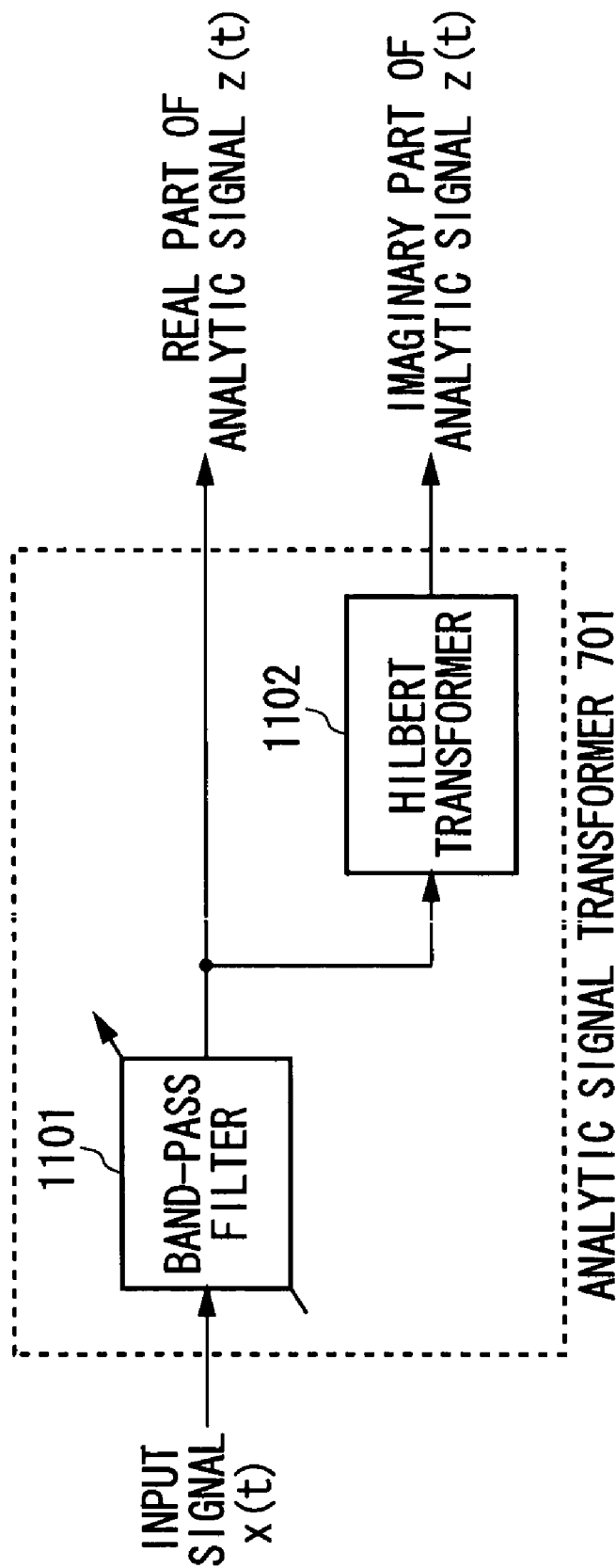
FIG. 31 shows an exemplary structure of the analytic signal transformer 701.

FIG. 31 shows an exemplary structure of the analytic signal transformer 701. The analytic signal transformer 701 includes a band-pass filter 1101 that generates a band-limited signal obtained by extracting the frequency components in the vicinity of the fundamental frequency of the signal received by the timing jitter estimator 501, and a Hilbert transformer 1102 that performs Hilbert transform of the band-limited signal so as to generate a Hilbert pair of the signal.

The band-pass filter 1101 may be an analog filter or a digital filter, or may be implemented by using digital signal processing such as FFT. Moreover, the band-pass filter 1101 may be construed so as to allow the bandwidth in which the components are allowed to pass to be varied freely. According to the analytic signal transformer 701 of this example, the analytic signal based on the fundamental frequency of the received signal can be generated. Thus, the gain of the jitter transfer function can be calculated precisely. The generation of the analytic signal using the Hilbert transform is described below.

The analytic signal z(t) of the real signal x(t) is defined by the following complex signal.

$$z(t) = x(t) + j\hat{x}(t) \qquad (45)$$

In the above equation, j is imaginary unit, and the imaginary part $\hat{x}(t)$ of the complex signal z(t) is obtained by Hilbert transform of the real part x(t).

On the other hand, Hilbert transform of the time-domain waveform x(t) is defined by the following equation.

$$\hat{x}(t) = H[x(t)] = \frac{1}{\pi} \int_{-\infty}^{+\infty} \frac{x(\tau)}{t - \tau} d\tau \qquad (46)$$

$\hat{x}(t)$ is convolution of functions x(t) and $(1/\pi t)$. In other words, Hilbert transform is equivalent to the output obtained by making x(t) pass through an all pass filter. Please note that the phase of the output $\hat{x}(t)$ is shifted by $\pi/2$ although the magnitude of the components of the spectra is not varied.

The analytic signal and Hilbert transform are described in, for example, A. Papoulis, Probability, Random Variables, and Stochastic Processes, 2nd edition, McGraw-Hill Book Company, 1984.

The instantaneous phase $\phi(t)$ of the real signal x(t) is obtained from the analytic signal z(t) by using the following equation.

$$\phi(t) = \tan^{-1}\left[\frac{\hat{x}(t)}{x(t)}\right] \qquad (47)$$

Next, algorithm for estimating the instantaneous phase using Hilbert transform is described. First, the signal to be measured shown in FIG. 11

$$x(t) = A\cos\left(\frac{2\pi}{T_0}t + \phi_0 - \Delta\phi(t)\right) \qquad (48)$$

is subjected to Hilbert transform so as to obtain a signal corresponding to the imaginary part of the complex signal $$\hat{x}(t) = H[x(t)] = A\sin\left(\frac{2\pi}{T_0}t + \phi_0 - \Delta\phi(t)\right) \qquad (49)$$

thereby the signal to be measured x(t) is transformed to the analytic signal, $$z(t) = x(t) + j\hat{x}(t) = \qquad (50)$$
$$A\cos\left(\frac{2\pi}{T_0}t + \phi_0 - \Delta\phi(t)\right) + jA\sin\left(\frac{2\pi}{T_0}t + \phi_0 - \Delta\phi(t)\right)$$

shown in FIG. 12.

The obtained analytic signal has been subjected to the band-pass filtering by the band-pass filter 1101. Therefore, the jitter corresponding to the fluctuation of the fundamental frequency of the signal to be measured can be calculated precisely.

Then, the instantaneous phase estimator 702 estimates the phase function φ(t) shown in FIG. 13 from the analytic signal z(t) by using Equation (47).

$$\phi(t) = \left[\frac{2\pi}{T_0}t + \phi_0 - \Delta\phi(t)\right] \mod 2\pi \quad [\text{rad}] \tag{51}$$

φ(t) is represented by using a principal value of the phase in the region from −Π to Π, and has discontinuous points approximately at times where the phase changes from −Π to Π. Finally, by unwrapping the discontinuous phase function φ(t) (that is, appropriately adding integral multiples of 2 Π to the principal value φ(t)), the discontinuities can be removed, so that the instantaneous phase φ(t) shown in FIG. 14 is obtained.

$$\phi(t) = \frac{2\pi}{T_0}t + \phi_0 - \Delta\phi(t) \quad [\text{rad}] \tag{52}$$

The analytic signal transformer 701 may compensate the real part for delay time τ, as represented by the following equation.

$$z(t) = x(t-\tau) + j\hat{x}(t) \tag{53}$$

As represented by Equation (53), the high accuracy analytic signal can be obtained in a case where the delay time τ corresponding to the filter delay is observed in the Hilbert transforming procedure by the analytic signal transformer 701 generating the analytic signal. Moreover, the timing jitter estimator 501 may calculate the instantaneous phase φ(t) after the linear phase term has been removed, in accordance with the following equation.

$$\phi(t) = \tan^{-1}\left[\frac{\hat{x}(t)}{x(t)}\right] - 2\pi f_J t \tag{54}$$

Moreover, the timing jitter estimator 501 may calculate the instantaneous phase φ(t) after correcting the delay time τ in Hilbert transform was corrected, in accordance with the following equation.

$$\phi(t) = \tan^{-1}\left[\frac{\hat{x}(t)}{x(t-\tau)}\right] - 2\pi f_J t \tag{55}$$

Please note that $f_J$ represents the jitter frequency of the signal x(t). By removing the linear phase term, the instantaneous phase noise of the signal x(t), shown in FIG. 16, can be detected.

Figure 32:
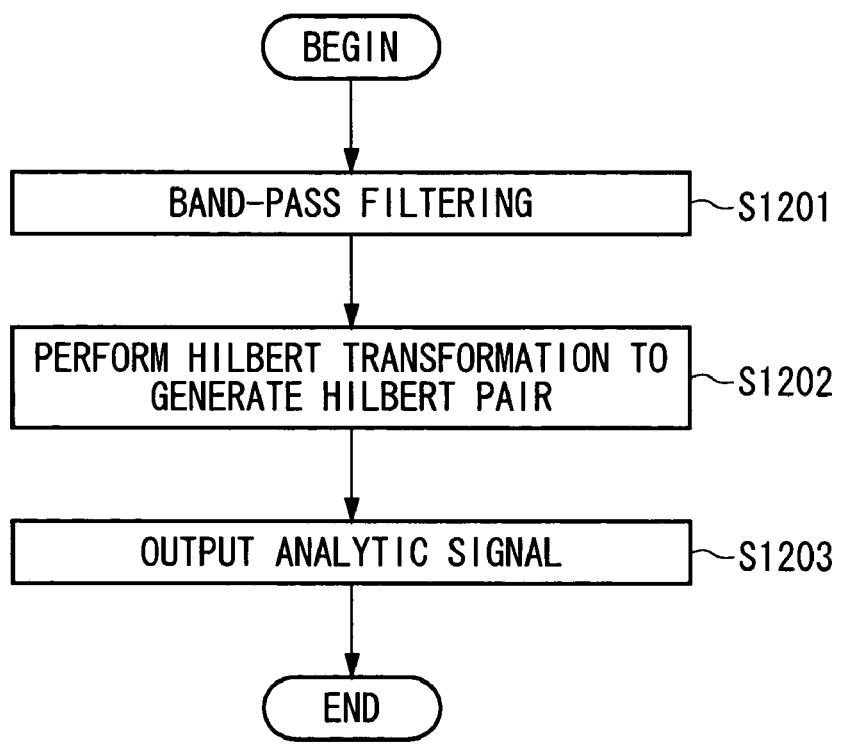
FIG. 32 is a flowchart showing an example of analytic signal transforming step S801.

FIG. 32 is a flowchart showing an example of analytic signal transforming step S801. Analytic signal transforming step S801 generates a band-limited signal obtained by extracting the frequency components in the vicinity of the fundamental frequency of the signal received by the timing jitter estimator 501, in band-pass filtering step S1201. Step S1201 generates the band-limited signal in the similar manner to that of the band-pass filter 1101 described referring to FIG. 31. Step S1201 may be performed by using the band-pass filter 1101.

Then, in Hilbert transforming step S1202, the band-limited signal is subjected to Hilbert transform so as to generate a Hilbert pair. Step S1202 performs the generation of the Hilbert pair in a similar manner to that of the Hilbert transformer 1102 described referring to FIG. 31. Step S1202 may be performed by using the Hilbert transformer 1102.

Then, in output step S1203, the band-limited signal is output as the real part of the analytic signal, and the band-limited signal after being subjected to Hilbert transform is output as the imaginary part of the analytic signal.

Figure 33:
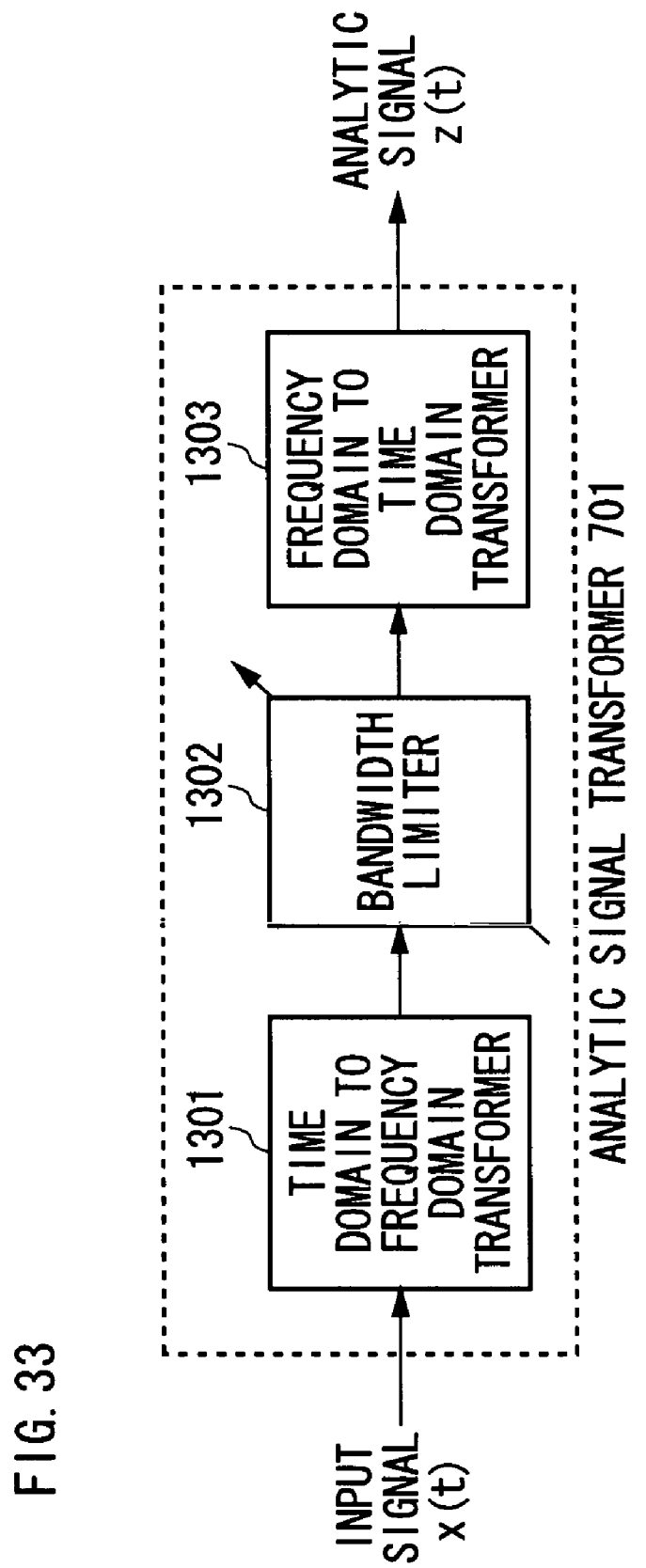
FIG. 33 shows another exemplary structure of the analytic signal transformer 701.

FIG. 33 shows another exemplary structure of the analytic signal transformer 701. The analytic signal transformer 701 includes a time-domain to frequency-domain transformer 1301 that transforms the signal received by the timing jitter estimator 501 to a two-sided spectra in frequency domain, a bandwidth limiter 1302 that extracts the frequency components in the vicinity of the positive fundamental frequency in the two-sided spectra in frequency domain, and a frequency-domain to time-domain transformer 1303 that transforms the output of the bandwidth limiter 1302 to a signal in time domain. The time-domain to frequency-domain transformer 1301 and the frequency-domain to time-domain transformer 1303 may be implemented by using FFT and inverse FFT, respectively. Moreover, the bandwidth limiter 1302 may have the same or similar function and structure as/to the band-pass filter 1101 described referring to FIG. 31. The band where the signal components are allowed to pass through the bandwidth limiter 1302 is freely variable. The details of the operation of the analytic signal transformer 701 in this example are described later.

Figure 34:
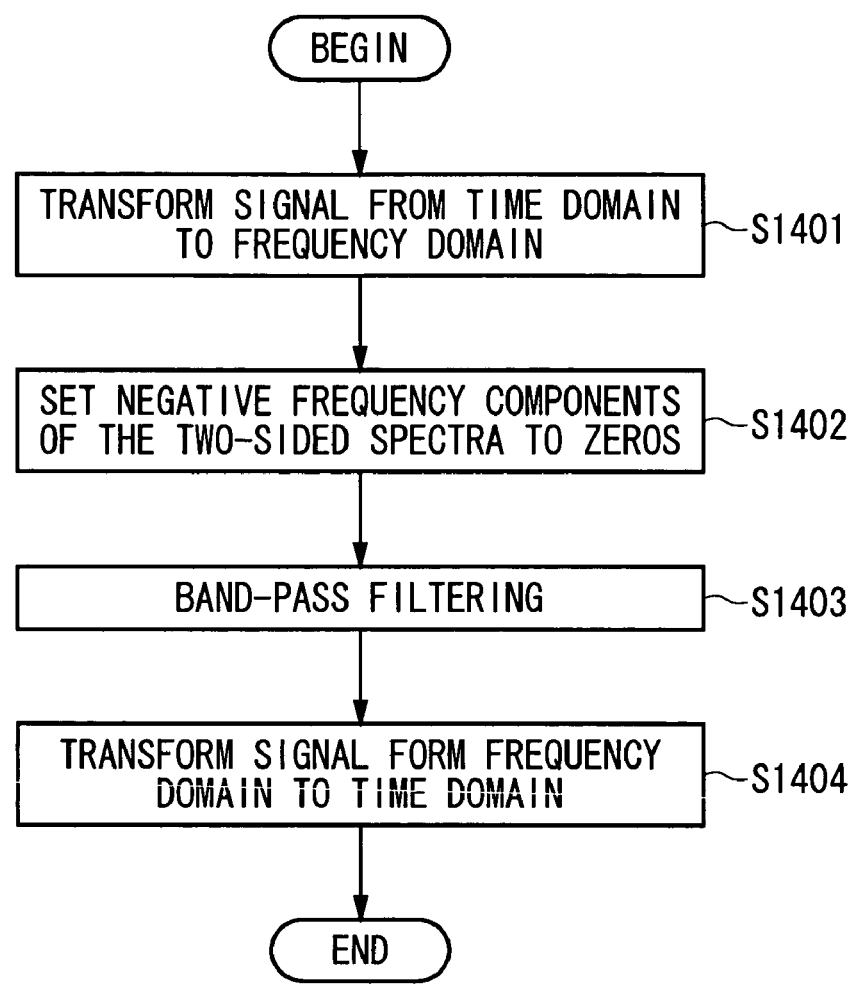
FIG. 34 is a flowchart showing another example of analytic signal transforming step S801.

FIG. 34 is a flowchart showing another example of analytic signal transforming step S801. Analytic signal transforming step S801 transforms the signal received by the timing jitter estimator 501 to a signal in frequency domain in step S1401. Step S1401 generates the signal in frequency domain in a similar manner to that of the time-domain to frequency-domain transformer 1301 described referring to FIG. 33. Step S1401 may be performed by using the time-domain to frequency-domain transformer 1301.

Then, in negative frequency component removal step S1402, negative frequency components in the two-sided spectra in frequency domain are removed. Step S1402 may have a similar function to that of the bandwidth limiter 1302 described referring to FIG. 33. Step S1403 may be performed by using the bandwidth limiter 1302.

Then, in bandwidth limiting step S1403, the frequency components in the vicinity of the positive fundamental frequency in the transformed signal in frequency domain are extracted. Step S1403 may have a similar function to that of the bandwidth limiter 1302 described referring to FIG. 33. Step S1403 may be performed by using the bandwidth limiter 1302.

The signal in frequency domain is then transformed to a signal in time domain in step S1404. Step S1404 may generate the signal in time domain in a similar manner to that of the frequency-domain to time-domain transformer 1303 described referring to FIG. 33. Step S1404 may be performed by the frequency-domain to time-domain transformer 1303. Next, the details of the operation of the analytic signal transformer 701 that generates the analytic signal by using Fast Fourier transform are described.

Figure 35:
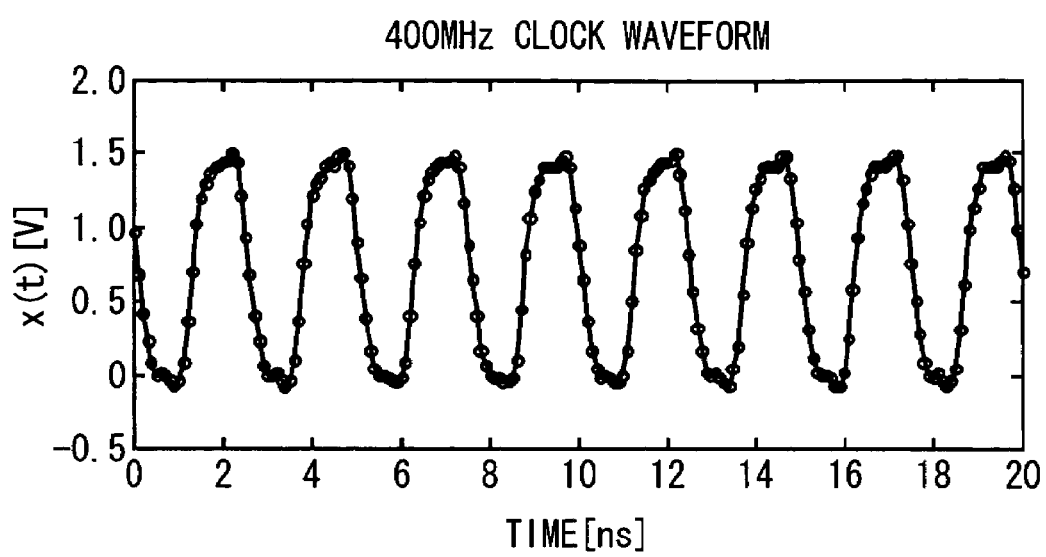
FIG. 35 shows an example of the signal received by the analytic signal transformer 701.

FIG. 35 shows an example of the signal received by the analytic signal transformer 701. The analytic signal transformer 701 receives the digitized signal x(t) shown with circles in FIG. 35. The time-domain to frequency-domain transformer 1301 performs FFT operation for the signal x(t), thereby transforming the signal x(t) to the signal X(f) in frequency domain.

Figure 36:
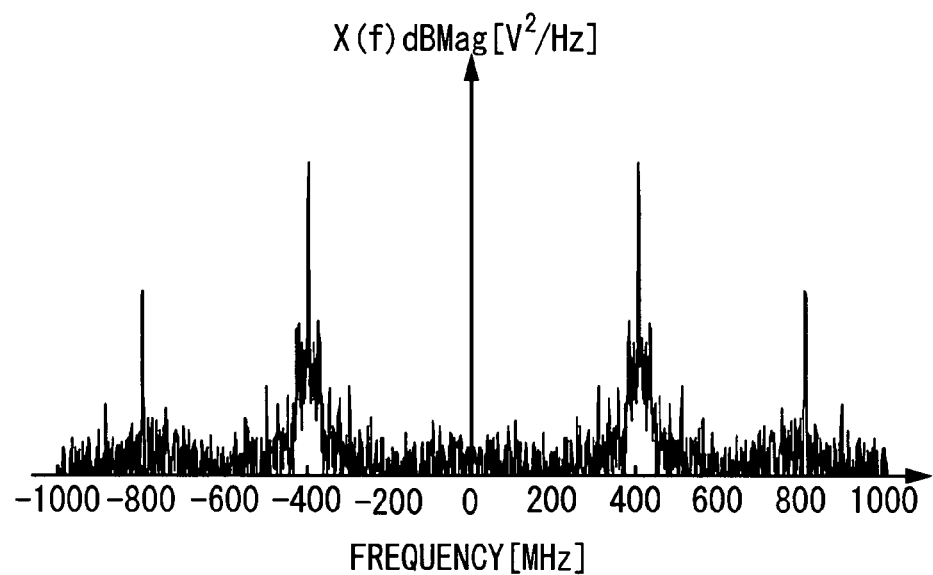
FIG. 36 shows an example of the signal X(f) in frequency domain.

FIG. 36 shows an example of the signal X(f) in frequency domain. The bandwidth limiter 1302 sets the data other than the data in the vicinity of the fundamental frequency in the positive frequency components of the spectra X(f) to zeros so as to leave only the data in the vicinity of the fundamental frequency in the positive frequency components, and then doubles the positive frequency components. These operations in frequency domain correspond to the bandwidth limiting of the signal to be measured in time domain and the transform of the signal after band limiting to the analytic signal.

Figure 37:
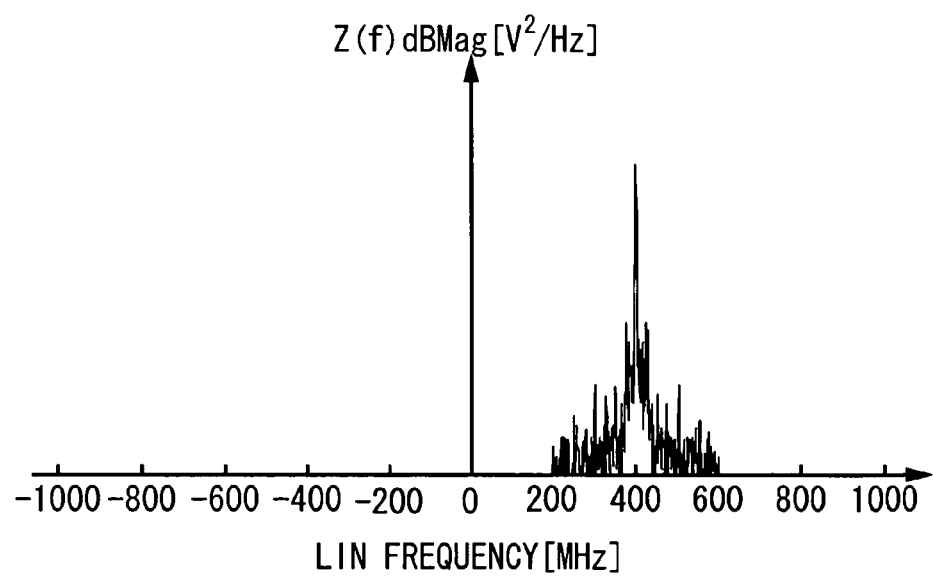
FIG. 37 shows a signal Z(f) in frequency domain of which the bandwidth was limited.

FIG. 37 shows a signal Z(f) in frequency domain of which the bandwidth was limited. The frequency-domain to time-domain transformer 1303 performs inverse Fourier transform operation on the signal Z(f) so as to generate the analytic signal z(t) for which the bandwidth was limited.

Figure 38:
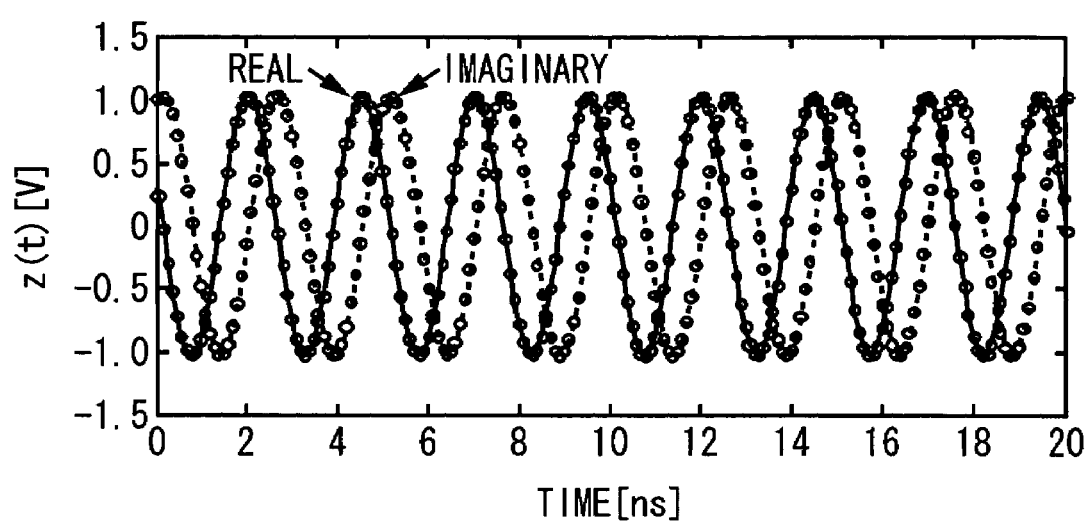
FIG. 38 shows the analytic signal z(t) for which the bandwidth was limited.

FIG. 38 shows the analytic signal z(t) for which the bandwidth was limited. Please note that the operation for doubling the positive frequency components can be omitted in a case where the object is the instantaneous phase estimation.

In the analytic signal transformer 701 described referring to FIG. 33, the period of the signal x(t) does not correspond to the number of the points of Fast Fourier transform in some cases. In these cases, it is necessary to multiply the digitized signal x(t) by a window function. The analytic signal transformer 701 in the cases of multiplying the signal x(t) by the window function is described below.

Figure 39:
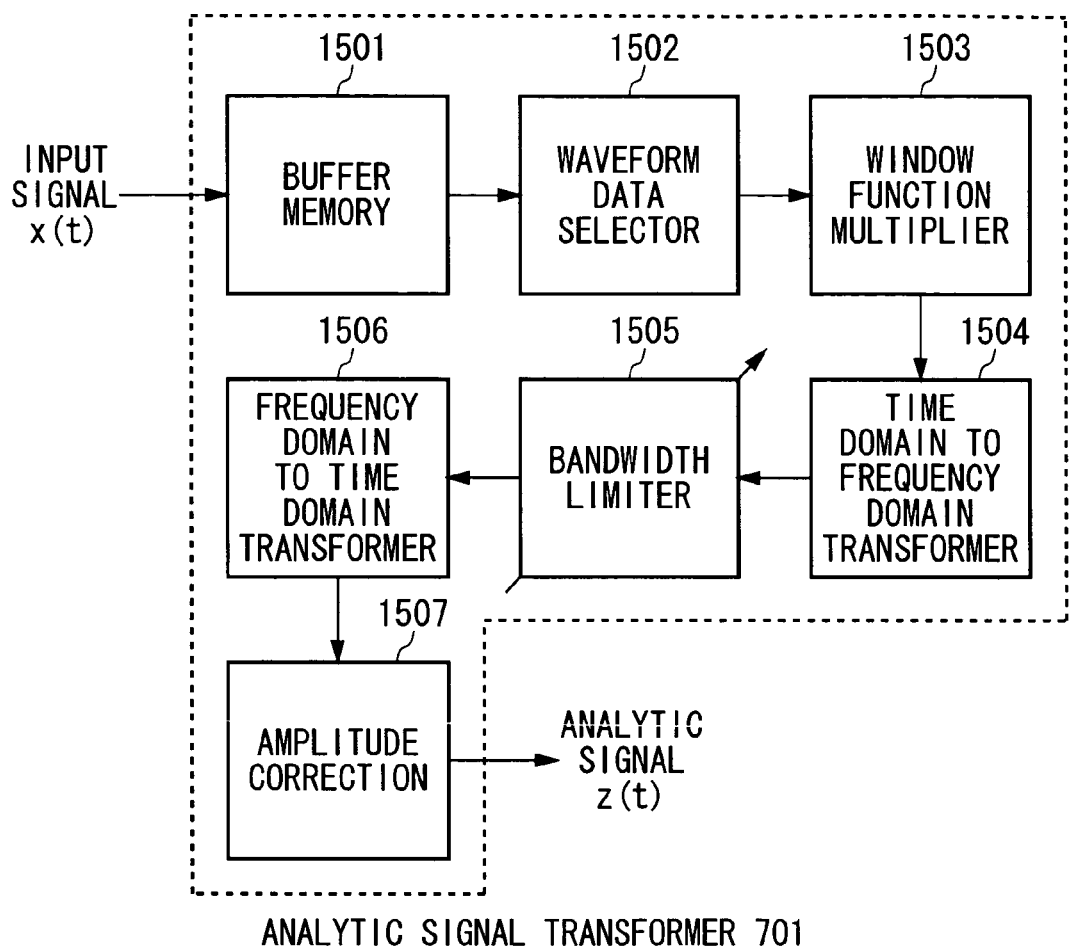
FIG. 39 shows another example of the structure of the analytic signal transformer 701.

FIG. 39 shows another example of the structure of the analytic signal transformer 701. The analytic signal transformer 701 includes a buffer memory 1501 that stores the received signal, a waveform data selector 1502 that selects a waveform from the signal stored in the buffer memory 1501, a window function multiplier 1503 that multiplies the signal waveform section selected by the waveform data selector 1502 by a predetermined window function, a time-domain to frequency-domain transformer 1504 that transforms the waveform data multiplied by the window function to the spectra infrequency domain, a bandwidth limiter 1505 that extracts the frequency components in the vicinity of the positive fundamental frequency of the given spectra, a frequency-domain to time-domain transformer 1506 that transforms the frequency components extracted by the bandwidth limiter 1505 to a signal in time domain, and an amplitude corrector 1507 that multiplies the signal in time domain by a reciprocal of the window function so as to generate the analytic signal. Please note that the wave form data selector 1502 selects a finite duration waveforms by overlapping the waveform sections partially.

In the case where the signal components of the signal x(t) were multiplied by the window function, the signal x(t) is subjected to amplitude modulation. According to the analytic signal transformer 701 of this example, however, the amplitude modulation of the signal x(t) can be corrected by performing multiplication by a reciprocal of the window function in the amplitude corrector 1507.

The window function multiplier 1503 outputs the signal x(t)·w(t) obtained by multiplying the signal x(t) by the window function w(t) to the time-domain to frequency-domain transformer 1504. The time-domain to frequency-domain transformer 1504 transforms the received signal to a signal in frequency domain. The bandwidth limiter 1505 outputs the spectra Z(f) obtained by replacing the negative frequency components of that signal with zeros.

The frequency-domain to time-domain transformer 1506 outputs a signal IFFT [Z (f)] obtained by transforming the spectra Z(f) to a signal in time domain. In this example, the analytic signal transformer 701 may output the real part and the imaginary part of the signal output from the frequency-domain to time-domain transformer 1506 as the real part and the imaginary part of the analytic signal. The real part $x_{real}(t)$ and the imaginary part $x_{imag}(t)$ of the analytic signal are the real part Re{IFFT[Z(f)]} and the imaginary part Im{IFFT[Z(f)]} of the output signal from the frequency-domain to time-domain transformer 1506, respectively.

$$w'(t)x_{real}(t)=Re\{IFFT[Z(f)]\}$$

$$w'(t)x_{imag}(t)=Im\{IFFT[Z(f)]\} \quad (56)$$

w' (t) represents the transformed window function w(t) from the spectra Z(f). The real part $x_{real}(t)$ and the imaginary part $x_{imag}(t)$ of the analytic signal are influenced by the amplitude modulation by the window function w(t) to approximately the same degree. Therefore, the instantaneous phase represented by Equation (54) is represented by the following equation.

$$\Delta\phi(t) = \tan^{-1}\left[\frac{\frac{w'(t)}{w(t)}x_{real}(t)}{\frac{w'(t)}{w(t)}x_{imag}(t)}\right] - 2\pi f_J t \approx \tan^{-1}\left[\frac{x_{real}(t)}{x_{imag}(t)}\right] - 2\pi f_J t \quad (57)$$

In a case of calculating the instantaneous phase of the signal x(t) in this example, as represented by Equation (57), the phase estimation errors caused by the amplitude modulation by the window function can be canceled in the real part and the imaginary part. In a case that the amplitude modulation by the window function occurs, the phase estimation error occurs according to the following equation.

$$\Delta\phi(t) = \tan^{-1}\left[\frac{w'(t)}{w(t)} \cdot \frac{\hat{x}(t)}{x(t)}\right] - 2\pi f_J t$$

Since the phase estimation errors associated with $x_{real}(t)$ and $x_{imag}(t)$ can be canceled with each other in this example, it is possible to calculate the instantaneous phase with no phase estimation error caused by the amplitude modulation by the window function. In other words, as is apparent from Equations (56) and (57), in a case that the real part Re{IFFT[Z(f)]} and the imaginary part Im{IFFT[Z(f)]} of the output signal of the frequency-domain to time-domain transformer 1506 are output as the real part and the imaginary part of the analytic signal, the instantaneous phase estimator 702 can calculate the instantaneous phase of the signal x(t) precisely.

Moreover, as shown in FIG. 39, when the real part and the imaginary part of the signal from which the amplitude modulation components by the window function were removed are output as the real part and the imaginary part of the analytic signal in the amplitude corrector 1507, it is possible to efficiently perform other analysis and test of the DUT, and the like, by using the analytic signal.

The time-domain to frequency-domain transformer 1504, the bandwidth limiter 1505 and the frequency-domain to time-domain transformer 1506 have the same or similar functions and structures as/to those of the time-domain to frequency-domain transformer 1301, the bandwidth limiter 1302 and the frequency-domain to time-domain transformer 1303 described referring to FIG. 33.

Next, the operation of the analytic signal transformer 701 of the present invention is described. First, the buffer memory 1501 stores the signal to be measured. The waveform data selector 1502 then extracts waveform section of the signal stored in the buffer memory 1501. The window function multiplier 1503 then multiplies the waveform section selected by the waveform data selector 1502 by the window function. Then, the time-domain to frequency-domain transformer 1504 performs FFT operation on the waveform section multiplied by the window function, so that the signal in time domain is transformed to the two-sided spectra in frequency domain. Next, the bandwidth limiter 1505 replaces the negative frequency components of the two-sided spectra in frequency domain with zeros, so as to obtain one-sided spectra. The bandwidth limiter 1505 then replaces the frequency components of the one-sided spectra other than those around the fundamental frequency of the signal to be measured with zeros so as to leave the frequency components around the fundamental frequency of the signal to be measured only, thereby the bandwidth of the signal in frequency domain is limited. Then, the frequency-domain to time-domain transformer 1506 performs inverse FFT on the bandlimited one-sided spectra, so that the signal in frequency domain is transformed to a signal in time domain. The amplitude corrector 1507 multiplies the signal in time domain by the reciprocal of the window function so as to generate the bandlimited analytic signal. The analytic signal transformer 701 then checks whether or not the buffer memory 1501 stores the waveform data that has not been processed. If the unprocessed waveform data is determined to be left in the buffer memory 1501, the waveform data selector 1502 selects the next waveform section. After the waveform data selector 1502 extracts the waveform section so that it partially overlaps the previously extracted waveform section, the analytic signal transformer 701 repeats the aforementioned operations.

Figure 40:
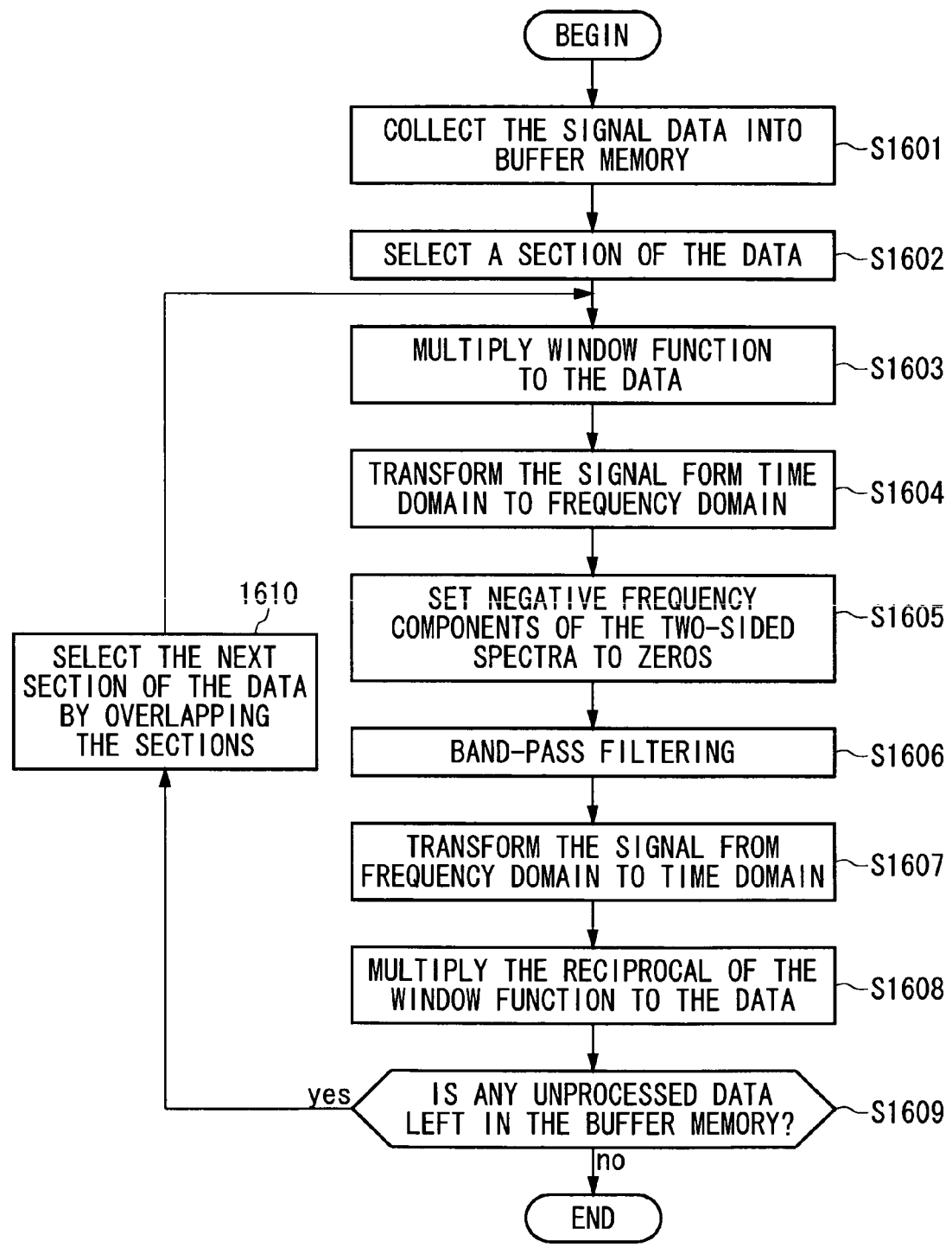
FIG. 40 is a flowchart of another example of analytic signal transforming step S801.

FIG. 40 is a flowchart of another example of analytic signal transforming step S801. Step S801 stores the signals to be measured in buffer memory step S1601. Step S1601 has the same or similar function as/to that of the buffer memory 1501 described referring to FIG. 39. Step S1601 may be performed by using the buffer memory 1501.

Then, waveform data selection step S1602 selects a part of the signal to be measured, that was stored in buffer memory step S1601, and extracts the selected waveform section as the waveform data. Step S1602 has the same or similar as/to that of the waveform data selector 1502 described referring to FIG. 39, and may be performed by using the waveform data selector 1502.

Then, in window function multiplying step 1603, the waveform data extracted in step S1602 is multiplied by a predetermined window function such as Hanning function. Step S1603 has the same or similar function as/to that of the window function multiplier 1503 described referring to FIG. 39, and may be performed by the window function multiplier 1503.

Then, in time-domain to frequency-domain transforming step S1604, the waveform data multiplied by the window function is transformed to a signal in frequency domain. Step S1604 has the same or similar function as/to that of the time-domain to frequency-domain transformer 1504 described referring to FIG. 39.

Then, in negative frequency component removal step S1605, the negative frequency components of the signal transformed into frequency domain are removed. Step S1605 has the same or similar function as/to that of the bandwidth limiter 1505 described referring to FIG. 39, and may be performed by the bandwidth limiter 1505.

Then, in bandwidth limiting step S1606, the frequency components of the signal transformed into frequency domain in the vicinity of the fundamental frequency thereof are extracted. Step S1606 has the same or similar function as/to that of the bandwidth limiter 1505 described referring to FIG. 39, and may be performed by the bandwidth limiter 1505.

Then, in frequency-domain to time-domain transforming step S1607, the signal having the limited bandwidth is transformed to a signal in time domain. Step S1607 has the same or similar function as/to that of the frequency-domain to time-domain transformer 1506 described referring to FIG. 39 and may be performed by the frequency-domain to time-domain transformer 1506.

Then, in amplitude correction step S1608, the amplitude modulation components of the signal transformed into time domain are removed. Step S1608 has the same or similar function as/to that of the amplitude corrector 1507 described referring to FIG. 39, and may be performed by the amplitude corrector 1507.

Next, in decision step S1609, it is determined whether or not there is any unprocessed data of the signal to be measured that was stored in step S1601. If the unprocessed data is left, waveform data selection step S1601 extracts the next part of the signal in such a manner that it partially overlaps the previously extracted part. Step S1610 has a similar function to step S1602. When it is determined in step S1609 that there is no unprocessed waveform data, the procedure is finished.

Figure 41:
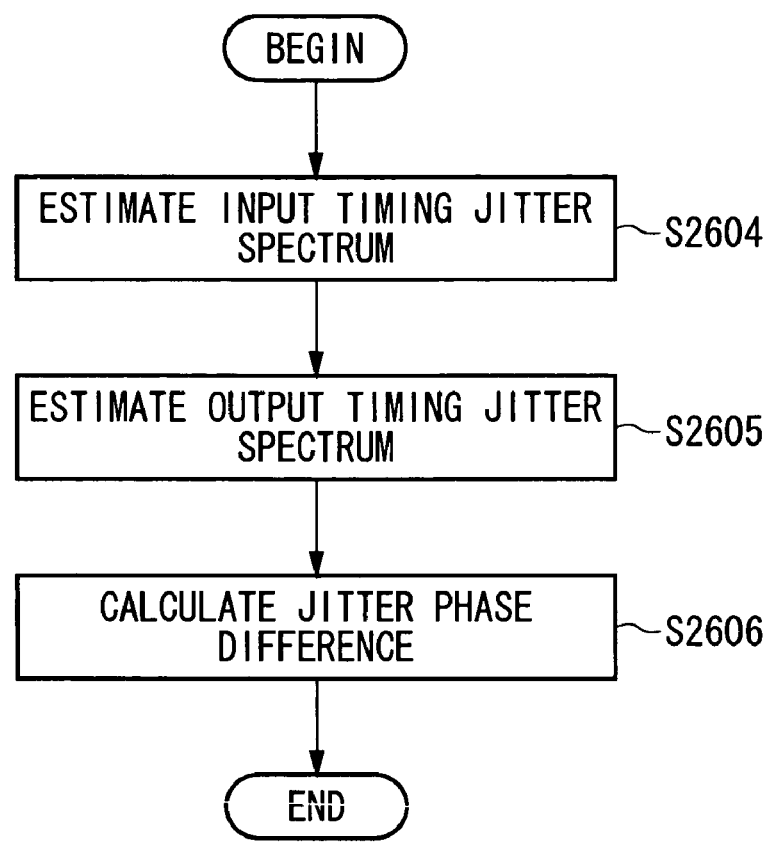
FIG. 41 shows a flowchart of an example of phase difference estimation step S2301 described referring to FIG. 7.

Next, a method of estimating the phase of the jitter transfer function is described below. FIG. 41 shows a flowchart of an example of phase difference estimation step S2301 described referring to FIG. 7. First, in input timing jitter spectra estimation step S2604, timing jitter spectra of the input signal is estimated by applying Fourier transform to the input timing jitter sequence, estimated in input timing jitter sequence estimation step S241 described referring to FIG. 6. Next, in output timing jitter spectra estimation step S2605, timing jitter spectra of the output signal is estimated by applying Fourier transform to the output timing jitter sequence, estimated in output timing jitter sequence estimation step S243 described referring to FIG. 6. Then, in jitter phase difference estimation step S2606, phase differences between the input and output timing jitter sequence is estimated from the timing jitter spectra estimated in steps S2604 and S2605, and the procedure is finished.

The jitter phase difference estimator 503 estimates the timing jitter spectra of the input signal by using Equation (3) in step S2604, which estimates the timing jitter spectra from the input timing jitter. Moreover, the jitter phase difference estimator 503 estimates the timing jitter spectra of the output signal by using Equation (4) in step S2605, which estimates the timing jitter spectra from the output timing jitter. Moreover, the jitter phase difference estimator 503 estimates the phase difference between the input and output timing jitters by using Equation (9) in step S2606, which estimates differences between the input and output timing jitter from the timing jitter spectra. Furthermore, jitter phase difference estimator 503 may estimate the phase difference between the input and output timing jitter by calculating the arctangent of the ratio of imaginary part to real part of the jitter transfer function (i.e. Im/Re) in step S2606.

The phase difference between the input and output timing jitters may be calculated by calculating the timing difference between the zero-cross timing of the input instantaneous phase noise waveform and that of the output instantaneous phase noise, calculating a ratio of the calculated timing difference to the period of the applied jitter (reciprocal of the jitter frequency) and multiplying the calculated ratio by 2 Π (rad) (or 360degrees) Similarly, it may be calculated by calculating the timing difference between the zero-cross timing of the input timing jitter waveform and that of the output timing jitter waveform, calculating the ratio of the calculated timing difference to the period of the applied jitter (the reciprocal of the jitter frequency) and multiplying the calculated ratio by 2 Π (rad) (or 360 degrees).

Figure 42:
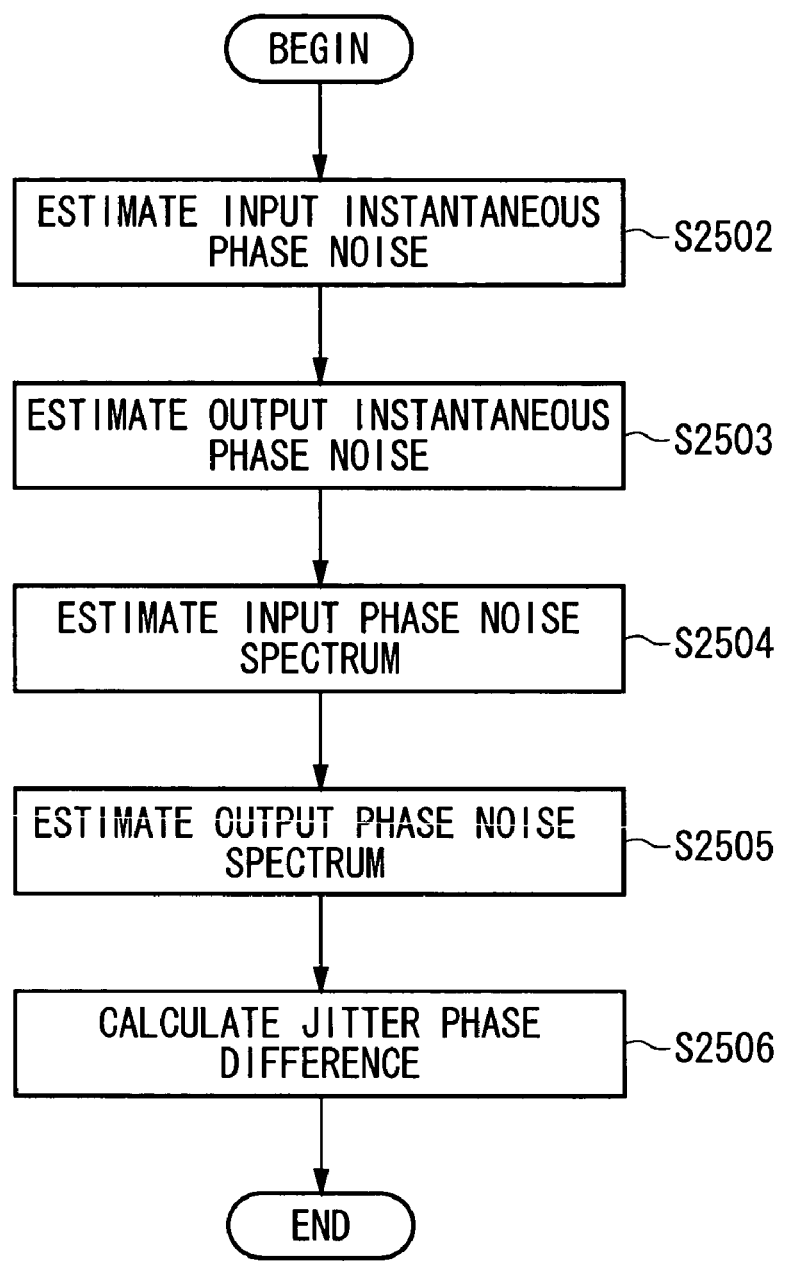
FIG. 42 is a flowchart of another example of phase difference estimation step S2301 described referring to FIG. 7.

Moreover, the phase of the jitter transfer function may be calculated by the instantaneous phase noise waveform of the input and output signal. FIG. 42 is a flowchart of another example of phase difference estimation step S2301 described referring to FIG. 7. The instantaneous phase noise waveform of the input signal to be supplied to the DUT is calculated in input instantaneous phase noise waveform estimation step S2502. Next, The instantaneous phase noise waveform of the output signal output from the DUT is calculated in output instantaneous phase noise waveform estimation step S2503. Next, the phase noise spectra of the input signal is calculated by applying Fourier transform to the instantaneous phase noise waveform of the input signal in input phase noise spectra estimation step S2504. Next, the phase noise spectra of the output signal is calculated by applying Fourier transform to the instantaneous phase noise waveform of the output signal in output phase noise spectra estimation step S2505. Then, in jitter phase difference estimation step S2506, the phase difference between the instantaneous phase noises from the phase noise spectra calculated in steps S2504 and S2505, and the procedure is finished.

In step S2504, where the phase noise spectra is obtained from the input instantaneous phase noise, the jitter phase difference estimator 503 estimates the phase noise spectra of the input signal by using Equation (1). Moreover, the jitter phase difference estimator 503 estimates the phase noise spectra of the output signal by using Equation (2) in step S2505 where the phase noise spectra is obtained from the output instantaneous phase noise. Furthermore, the jitter phase difference estimator 503 obtains the phase difference between the input and output instantaneous phase noises by using Equation (9) in step S2506, where phase difference between the instantaneous phase noises is obtained from the phase noise spectra, and estimates phase of the jitter transfer function.

Figure 43:
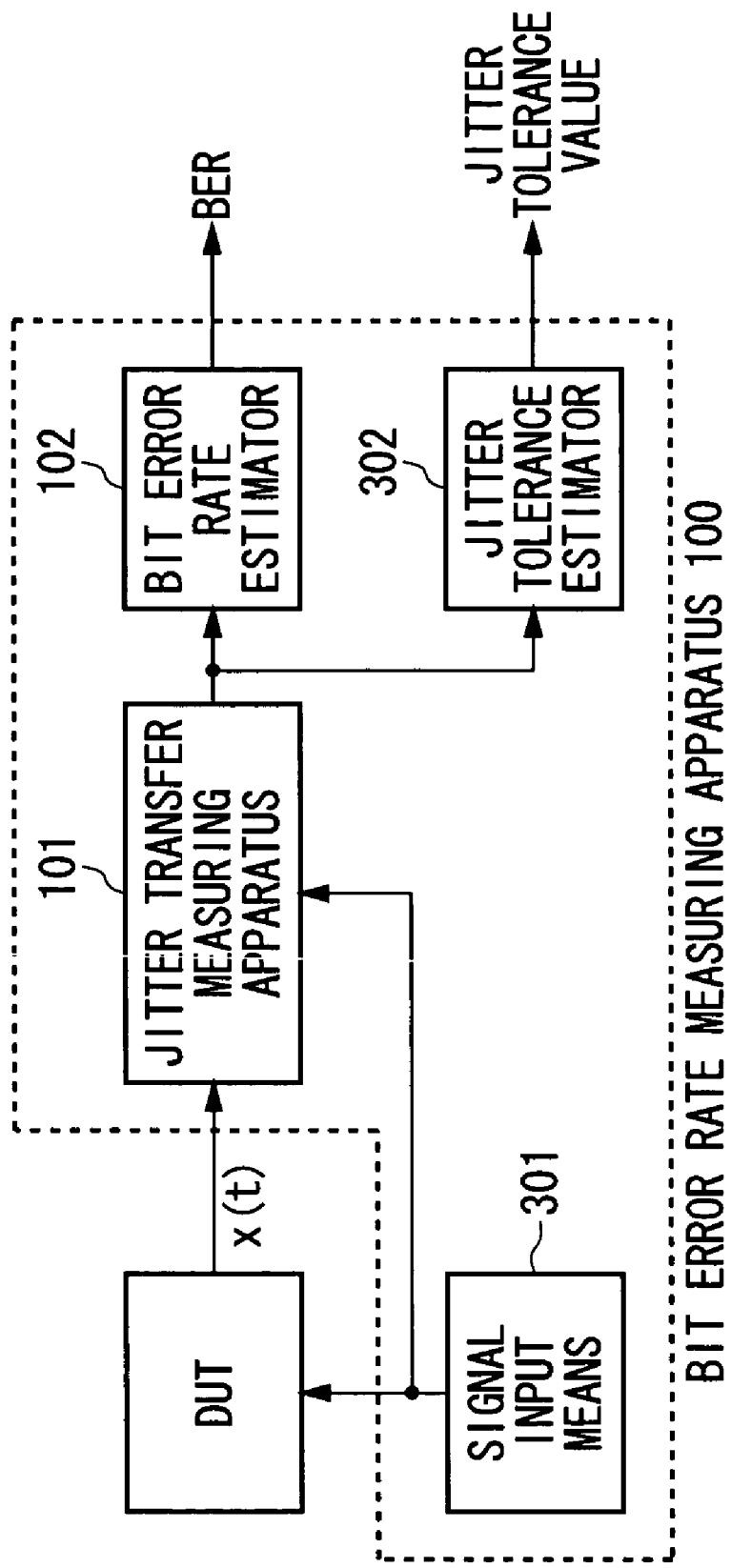
FIG. 43 illustrates another exemplary measuring apparatus 100.

FIG. 43 illustrates another exemplary measuring apparatus 100. In FIG. 43, the components having the same reference numerals as those in FIG. 1 have the same or similar functions and structures as/to those described referring to FIG. 1. The measuring apparatus 100 of this example includes the structure of that shown in FIG. 1 and also includes a signal input means 301 and a jitter tolerance estimator 302.

The signal input means 301 supplies a signal obtained by applying a desired jitter to the input signal to be input to the DUT. The signal input means 301 applies sinusoidal jitter to the input signal, for example. By applying the sinusoidal jitter, the bit error rate can be calculated precisely. The details in the case of applying the sinusoidal jitter are described later.

The jitter tolerance estimator 302 estimates a jitter tolerance of the DUT based on the jitter transfer function of the DUT. The jitter tolerance estimator 302 may estimate the jitter tolerance based on the gain of the jitter transfer function as described above. Moreover, the jitter tolerance estimator 302 may estimate the jitter tolerance further based on the phase of the jitter transfer function. Moreover, the jitter tolerance estimator 302 may estimate the jitter tolerance further based on the internal noise of the DUT.

The jitter tolerance estimator 302 may calculate the jitter tolerance of the DUT in accordance with Equation (37), (39) or (44). Moreover, the jitter tolerance estimator 302 may calculate the best-case value of the jitter tolerance of the DUT as described above.

The jitter transfer function measuring apparatus 101 estimates the jitter transfer function of the DUT based on the input timing jitter that the signal input means 301 applies to the input signal and the output timing jitter in the output signal of the DUT. The signal input means 301 applies input timing jitters having different jitter amplitude to the input signal one after another. In this example, the jitter transfer function measuring apparatus 101 receives the signal input to the DUT and the signal output from the DUT.

Figure 44:
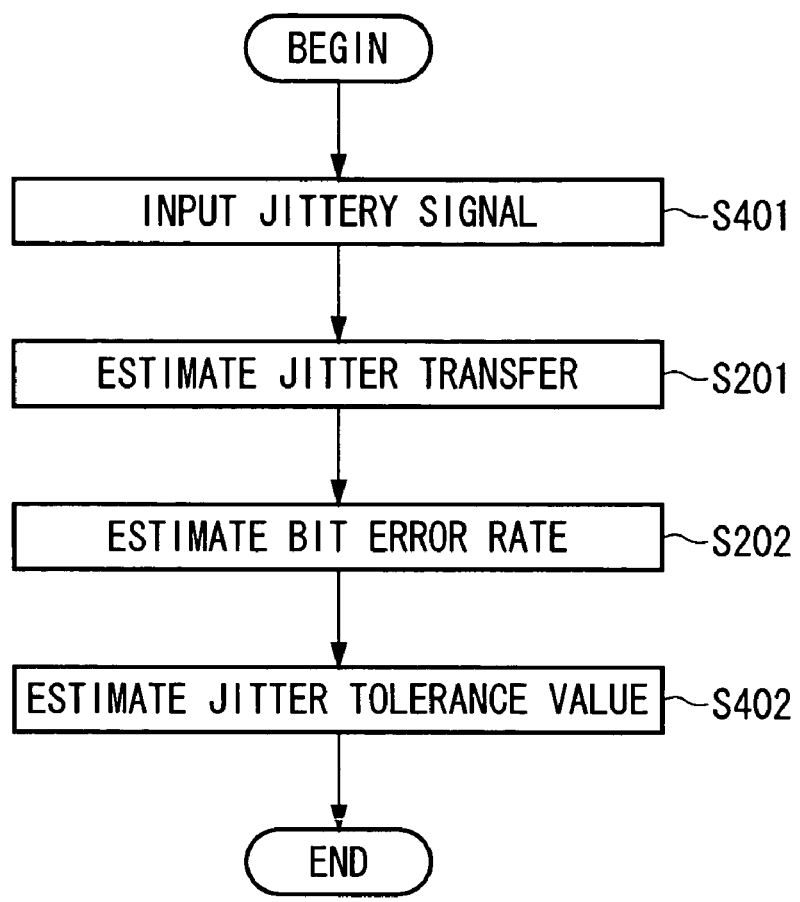
FIG. 44 is a flowchart of another example of the measuring method according to the present invention.

FIG. 44 is a flowchart of another example of the measuring method according to the present invention. In FIG. 44, the steps labeled with the same reference numeral as those in FIG. 2 have the same or similar functions as/to those described referring to FIG. 2. First, in signal input step S401, a desirable jitter is applied to the input signal, and the jittery input signal is supplied to the DUT. Step S401 has the same or similar function as/to the signal input means 301 described referring to FIG. 43. Step S401 may be performed by using the signal input means 301.

Next, the jitter transfer function is calculated in step S201. Step S201 is the similar step to jitter transfer function estimation step S201 in FIG. 2. Next, the bit error rate is calculated in step S202. Step 202 is the similar step to bit error rate estimation step S202 in FIG. 2.

Next, the jitter tolerance of the DUT is calculated in jitter tolerance estimation step S402. Step S402 has the same or similar function as/to the jitter tolerance estimator 302 described referring to FIG. 43. Step S402 may be performed by using the jitter tolerance estimator 302.

Figure 45:
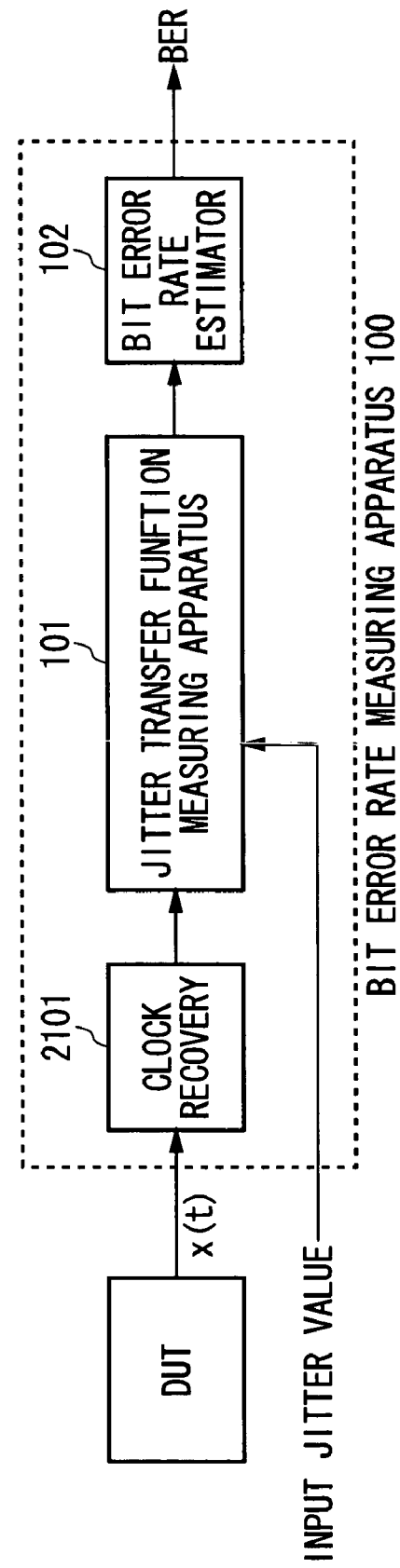
FIG. 45 illustrates another exemplary measuring apparatus 100.

FIG. 45 illustrates another exemplary measuring apparatus 100. In FIG. 45, the components having the same reference numerals as those in FIG. 1 have the same or similar functions and structures as/to those described referring to FIG. 1. The measuring apparatus 100 of this example includes the structure of that shown in FIG. 1 and also includes a clock recovery unit 2101.

The clock recovery unit 2101 generates a recovered clock signal of the output signal based on the output signal of the DUT. The jitter transfer function measuring apparatus 101 receives the recovered clock as the output signal from the DUT and calculates the jitter transfer function of the DUT based on the recovered clock signal.

Figure 46:
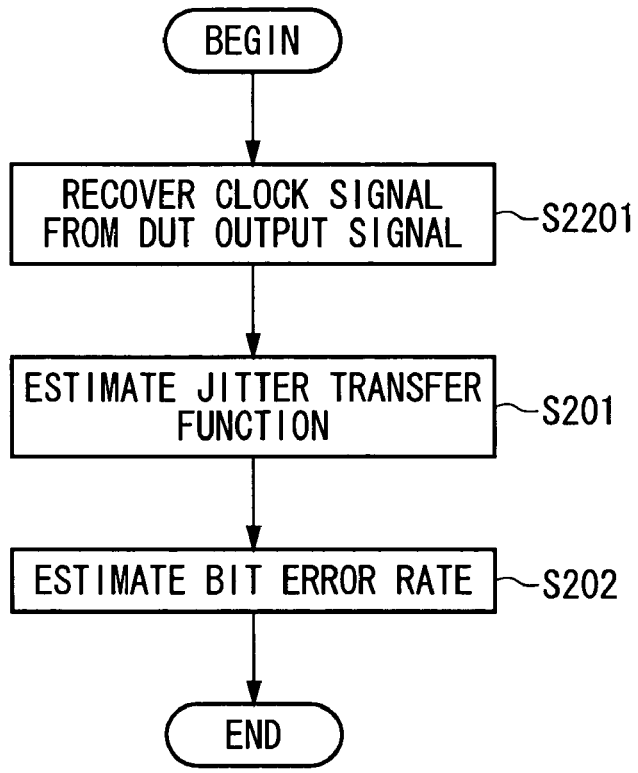
FIG. 46 is a flowchart of another example of the measuring method according to the present invention.

FIG. 46 is a flowchart of another example of a measuring method according to the present invention. In clock recovery step S2201, the recovered clock signal of the output signal of the DUT is generated. Step S2201 has the same or similar function as/to that of the clock recovery unit 2101 described referring to FIG. 45, and may be performed by using the clock recovery unit 2101.

Then, in jitter transfer function estimation step S201, the jitter transfer function of the DUT is calculated. Step S201 has the same or similar function as/to that of the jitter transfer function measuring apparatus 101 described referring to FIG. 45, and may be performed by using the jitter transfer function measuring apparatus 101.

Then, in bit error rate estimation step S202, the bit error rate of the DUT is calculated. Step S202 has the same or similar function as/to that of the bit error rate estimator 102 described referring to FIG. 45, and may be performed by using the bit error rate estimator 102.

Figure 47:
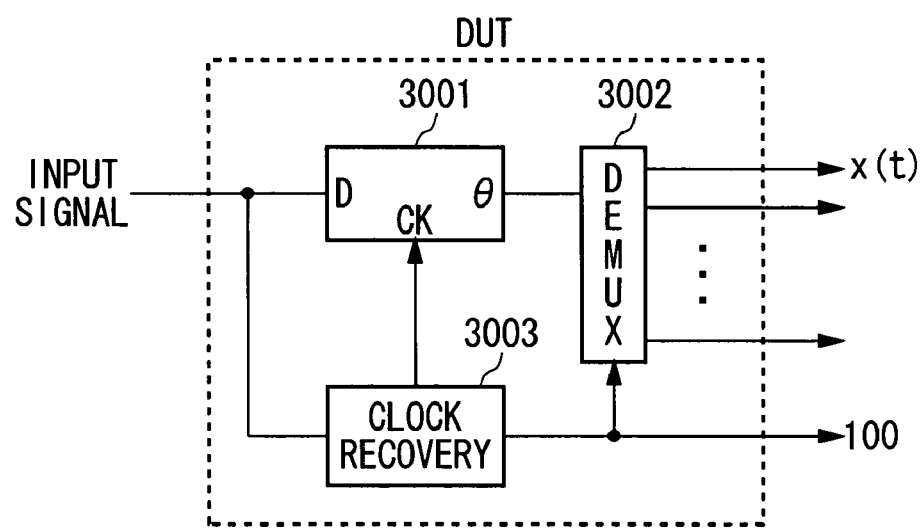
FIG. 47 shows an exemplary structure of the DUT.

FIG. 47 shows an exemplary structure of the DUT. The DUT accepts serial data as an input signal and outputs parallel data as an output signal. The DUT includes a flip-flop 3001, a clock recovery unit 3003 and a serial-parallel converter 3002.

The clock recovery unit 3003 receives the input signal (serial bit stream) and generates the recovered clock for outputting the output signal based on the input signal (serial bit stream) received. In the present example, the clock recovery unit 3003 has a phase-locked-loop (PLL).

The flip-flop 3001 supplies the input signal to the serial-parallel converter 3002. The serial-parallel converter 3002 receives the recovered clock and converts the serial input signal to the parallel output signal based on the timings of the recovered clock.

The measuring apparatus 100 receives the recovered clock generated by the clock recovery unit 3003 as the output signal of the DUT, and then calculates the bit error rate and/or jitter tolerance of the DUT based on the recovered clock.

Figure 48:
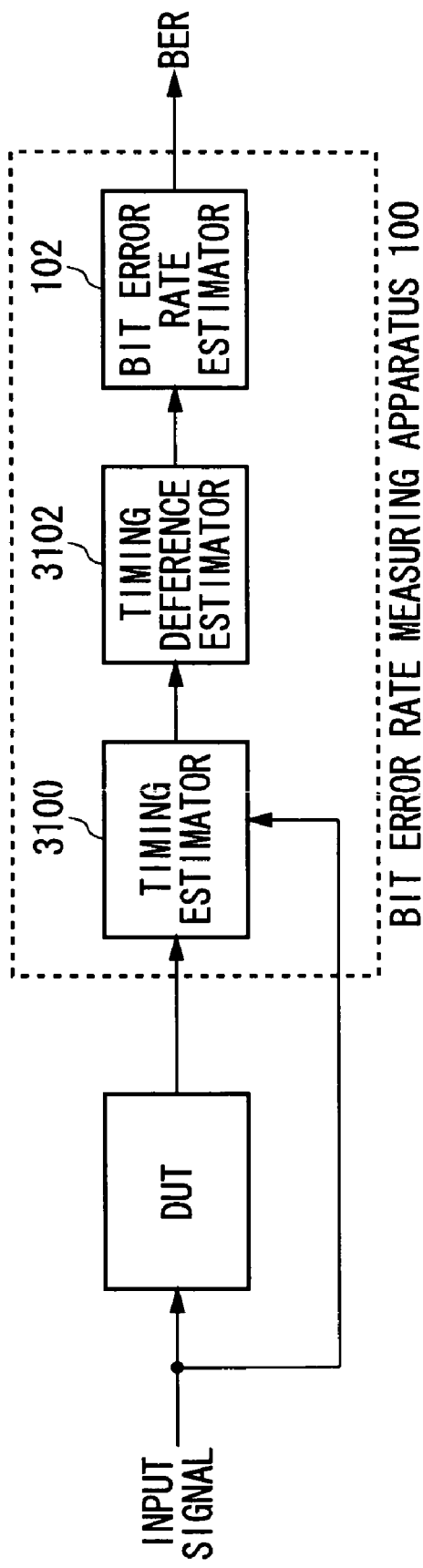
FIG. 48 illustrates another exemplary measuring apparatus 100.

FIG. 48 illustrates another exemplary measuring apparatus 100. In FIG. 48, the components having the same reference numerals as those in FIG. 1 have the same or similar functions and structures as/to those described referring to FIG. 1. The measuring apparatus 100 of this example includes a timing estimator 3100, a timing difference estimator 3102 and a bit error estimator 102.

The timing estimator 3100 estimates a timing error sequence of the input signal for testing the DUT and a timing error sequence of the output signal that the DUT outputs in response to the input signal. The timing difference estimator 3102 calculates the timing differences between the timing error sequence of the input signal and that of the output signal. The timing difference estimator 3102 may calculate the timing differences based on the peak values or the RMS values of the input timing error sequences and the output timing error sequences. The bit error rate estimator 102 estimates the bit error rate of the DUT based on the thus calculated timing differences. Equations indicating the relationship between the timing differences and the bit error rate may be given in advance to the bit error rate estimator 102. Also, Tables indicating the relationship between the timing differences and the bit error rate may be given in advance to the bit error rate estimator 102.

Figure 49:
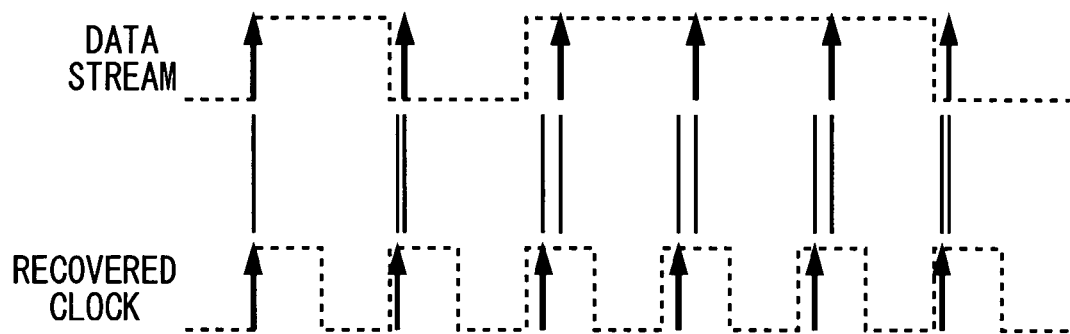
FIG. 49 shows exemplary input and output signals.

FIG. 49 shows exemplary input and output signals. In the shown example, the DUT outputs the recovered clock as the output signal. The timings of the data stream input to the DUT and the timings of the recovered clock are shown with arrows in FIG. 49. The input data stream and the recovered clock have the timing differences shown in FIG. 49. The bit error rate estimator 102 calculates the bit error rate based on such timing differences.

Figure 50:
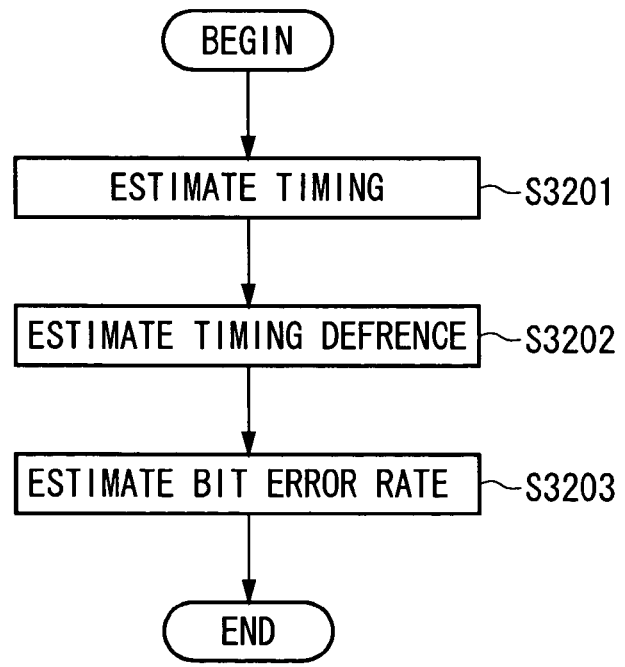
FIG. 50 is a flowchart of another example of the measuring method according to the present invention.

FIG. 50 is a flowchart of another example of a measuring method according to the present invention. In timing estimation step S3201, the timing error sequences of the input and output signals are obtained. Step S3201 has the same or similar function as/to that of the timing estimator 3100 described referring to FIG. 48, and may be performed by using the timing estimator 3100.

Then, in timing difference estimation step S3202, the timing differences between the input and output signals are calculated. Step S3202 has the same or similar function as/to that of the timing difference estimator 3102 described referring to FIG. 48, and may be performed by using the timing difference estimator 3102.

Then, in bit error rate estimation step S3203, the bit error rate of the DUT is calculated. Step S3203 has the same or similar function as/to that of the bit error rate estimator 102 described referring to FIG. 48, and may be performed by using the bit error rate estimator 102.

Figure 51:
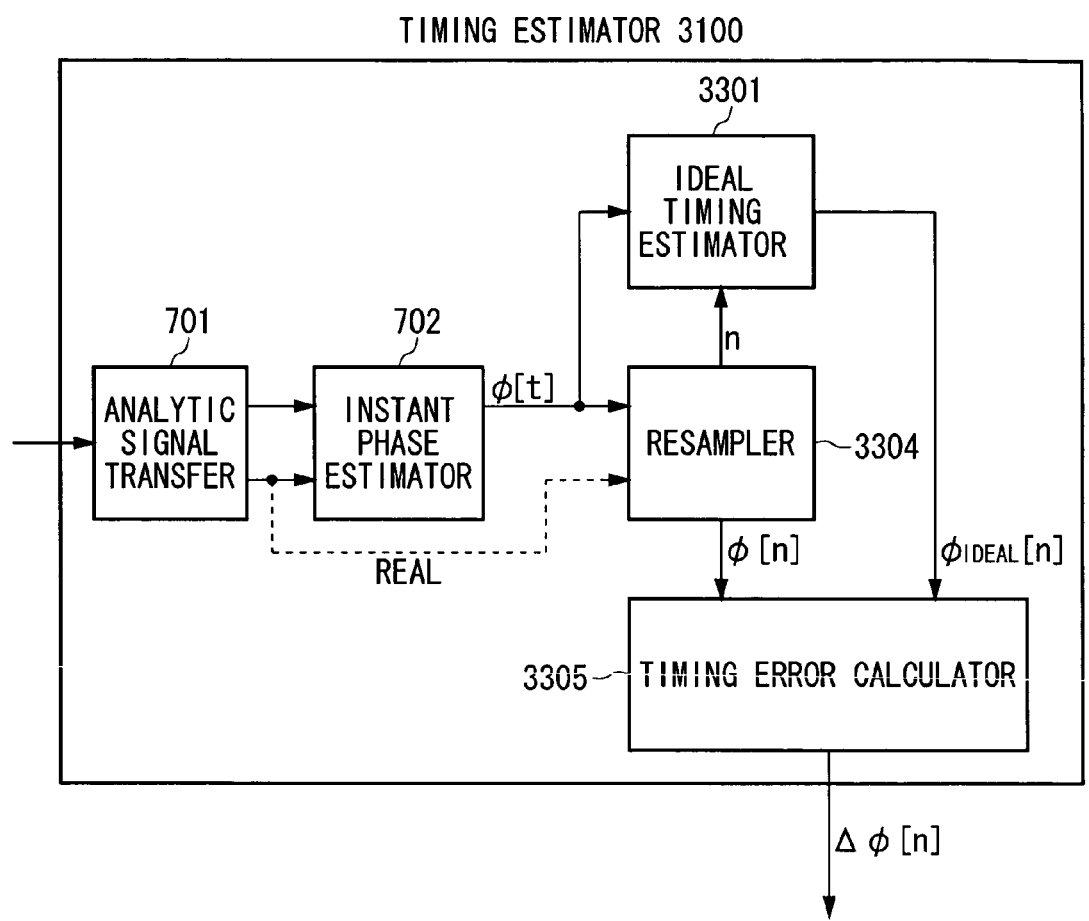
FIG. 51 illustrates an exemplary structure of the timing estimator 3100.

FIG. 51 illustrates an exemplary structure of the timing estimator 3100. In FIG. 51, the components having the same reference numerals as those in FIG. 9 have the same or similar functions and structures of those shown in FIG. 9. The timing estimator 3100 includes an analytic signal transformer 701 that transforms the input and output signals to complex analytic signals, an instantaneous phase estimator 702 that calculates the instantaneous phase of the analytic signal, an ideal timing estimator 3301 that calculates the initial phase angles and average frequencies of the instantaneous phases and estimates the ideal timings of the input and output signal, a resampler 3304 that resamples the instantaneous phase and generates the input timing sequence of the input signal and the output timing sequence of the output signal, and a timing error calculator 3305 that calculates a timing error sequence of the input signal and a timing error sequence of the output signal based on the ideal timings and the timing sequences.

The resampler 3304 may supply the timing n of the timing error sequences $\Delta\phi[nT]$ to the ideal timing estimator 3301. Moreover, the resampler 3304 may sample the instantaneous phase at the zero-crossing timing of the waveform of the real part of the analytic signal. Furthermore, the resampler 3304 may supply the sampling timing in the resampler 3304 to the ideal timing estimator 3301 as the timing n. The ideal timing estimator 3301 calculates the ideal timings of the input and output signal based on the timing n supplied by the resampler 3304.

The analytic signal transformer 701, the instantaneous phase estimator 702, and the resampler 3304 have the same or similar functions and structures as/to the analytic signal transformer 701, the instantaneous phase estimator 702, and the resampler 901 shown in FIG. 11.

The ideal timing estimator 3301 calculates the initial phase angles and average frequencies of the linear instantaneous phase of the input and output signals, that is shown in FIG. 14, so as to calculate the ideal timings of the input and output signals. In this case, the ideal timing estimator 3301 may include the linear phase estimator 703. The ideal timing estimator 3301 may output the values of the linear phase, which is generated at the timing n, as the ideal timings. The timing error calculator 3305 generates the timing error sequence of each of the input and output signals based on the ideal timing and the result of the resampling of instantaneous phase noise by the resampler 3304. The measuring apparatus 100 of the present example calculates the bit error rate based on an alignment error (timing difference) caused by the jitters in the input and output signals. The alignment error is described later.

Figure 52:
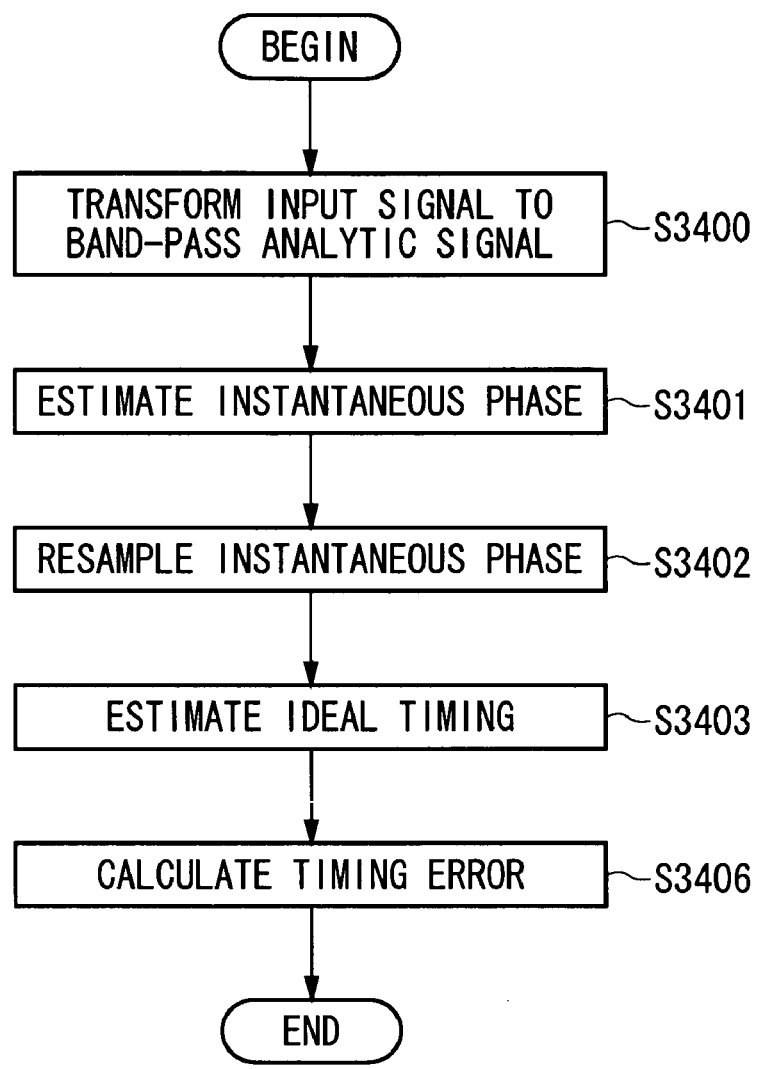
FIG. 52 is a flowchart of an example of timing estimation step S3201.

FIG. 52 is a flowchart of an example of timing estimation step S3201. First, in analytic signal transform step S3400, the input and output signal are transformed to the analytic signal. Step S3400 has the same or similar function as/to the analytic signal transformer 701 described referring to FIG. 51, and may be performed by using the analytic signal transformer 701. Next, in instantaneous phase estimation step S3401, the instantaneous phases of the input and output signals are calculated. Step S3401 has the same or similar function as/to the instantaneous phase estimator 702 described referring to FIG. 51, and may be performed by using the instantaneous phase estimator 702.

Then, in resampling step S3402, the input and output timing jitter sequences are generated by sampling the instantaneous phase noise of the input and output signal. Step S3402 has the same or similar function as/to that of the resampler 3304 described referring to FIG. 51, and may be performed by using the resampler 3304.

Then, in ideal timing estimation step S3403, the initial phase angles and average frequencies of the input and output signals are calculated, and the ideal timings of the input and output signals are also calculated. Step S3403 has the same or similar function as/to that of the ideal timing estimator 3301 described referring to FIG. 51, and may be performed by using the ideal timing estimator 3301.

Then, in timing error calculation step S3406, the timing sequences of the input and output signals are generated. Step S3406 has the same or similar function as/to the timing error calculator 3305 described referring to FIG. 51, and may be performed by using the timing error calculator 3305.

Next, the alignment jitter is described. An alignment jitter is defined by P. R. Trischitta, and represents the alignment error between the timing jitter of the input signal and the timing jitter of the output signal (recovered clock) The alignment jitter is defined by the following equation.

$$\Delta\text{align}[nT]=|(\Delta\phi[nT]-\Delta\theta[nT])| \quad (31)$$

$\Delta\theta[nT]$ and $\Delta\phi[nT]$ are the timing jitter sequence of the input signal to the DUT and that of the output signal of the DUT, respectively. The peak-to-peak value and the RMS value of the alignment jitter are represented as follows:

$$\Delta\text{align}_{PP}=|(\Delta\phi-\Delta\theta)_{PP}| \quad (58)$$

$$\sigma_{\Delta align}=\sqrt{\sigma_{\Delta\theta}^2+\sigma_{66\theta}^2-2\rho\sigma_{\Delta\phi}\sigma_{\Delta\theta}} \quad (59)$$

$\rho$ is a correlation coefficient between the timing jitter of the recovered clock and the timing jitter of the data input to the DUT. For example, it is assumed that the timing jitter of the recovered clock is strongly correlated with the timing jitter of the input data of the DUT. In this case, $\rho$ can be considered to be 1.0, and the following relationship is established.

$$\sigma_{\Delta align}\approx\sqrt{(\sigma_{\Delta\phi}-\sigma_{\Delta\theta})^2}=|\sigma_{\Delta\phi}-\sigma_{\Delta\theta}|$$

Thus, the alignment error between the input data and the recovered clock can be minimized. At this time, the clock recovery unit has the minimum bit error rate. On the other hand, when the timing jitter of the recovered clock is completely uncorrelated with the timing jitter of the input data of the clock recovery unit, $\rho$ can be considered to be 0.0, and the following relationship is satisfied.

$$\sigma_{\Delta align}=\sqrt{\sigma_{\Delta\phi}^2+\sigma_{\Delta\theta}^2}$$

Because of the alignment error between the input data and the recovered clock, this DUT has the bit error rate that is not neglectable. Moreover, the peak-to-peak value of the timing jitter of the recovered clock is given as follows:

$$\Delta\phi_{PP}=\Delta\theta_{PP}\sqrt{\max[|H_J(f_J)|^2]} \quad (60)$$

The peak-to-peak value of the alignment jitter is obtained as follows:

$$\Delta\text{align}_{PP}=\Delta\theta_{PP}\{|\sqrt{\max[|H_J(f_J)|^2]}-1|\} \quad (61)$$

Next, the case where the sinusoidal jitter is applied to the input signal to the DUT is described. An input data signal x(t) is phase modulated with the timing jitter $\Delta\theta[nT]$. The recovered clock signal y(t) is also phase modulated with the timing jitter $\Delta\phi[nT]$.

$$x(t)=A\sin(2\pi f_b t+\Delta\theta[t]) \quad (62)$$

$$y(t)=B\sin(2\pi f_b t+\Delta\phi[t]) \quad (63)$$

In the above equations, $f_b$ is a bit rate (bit clock frequency). When the instantaneous phase noises of the bit clock $\Delta\theta[nT]$ and $\Delta\phi[nT]$ are made to correspond to the sine wave $\cos(2\pi f_{PM}t)$, the sinusoidal jitter is obtained. On the other hand, when the sinusoidal jitter is demodulated, the sine wave is obtained. Since this sine wave corresponds to a line spectrum in frequency domain, the jitter frequency $f_J$ is given by a single frequency $f_{PM}$. Therefore, a ratio of the demodulated sine wave at the frequency of $f_{PM}$ provides the jitter transfer function expressed by Equation (8).

On the other hand, when $\Delta\theta[nT]$ and $\Delta\phi[nT]$ are adapted to correspond to Gaussian noise $n_g(t)$, the Gaussian noise jitter is obtained. When the Gaussian noise jitter is demodulated, the Gaussian noise wave is obtained. Since the Gaussian noise corresponds to wide band spectrum in frequency domain, the jitter frequency $f_J$ is given by a frequency band ($F_{lower}$, $F_{upper}$). Therefore, the ratio of the input and output spectrum in this frequency band gives the jitter transfer function.

It is known that, when the truncated Gaussian distribution jitter and the sinusoidal jitter are compared to each other at the same peak-to-peak value, the sinusoidal jitter results in the bit error rate with penalty of about 1 dB larger than that of the Gaussian distribution. In other words, the sinusoidal jitter can provide the worst-case jitter distribution case to the DUT. Therefore, in the case where the measuring apparatus 100 applies the sinusoidal jitter to the input signal, the test of the bit error rate and jitter tolerance can be performed precisely.

Next, the jitter tolerance is described. The measurement of the jitter tolerance is extension of the bit error test. More specifically, the timing jitter $\Delta\theta[nT]$ of the input data to the DUT is made to fluctuate by the sinusoidal jitter or the like, thereby testing the bit error rate. While the jitter frequency $f_J$ is fixed and the applied jitter amount is increased, the minimum applied jitter amount that causes the generation of the bit error rate is obtained. Next, the relationship between the sinusoidal jitter and the bit error rate is described. First, a decision boundary or sampling instant is described. In the description of the decision boundary, it is assumed that the bit stream has no timing jitter.

Figures 53, 54:
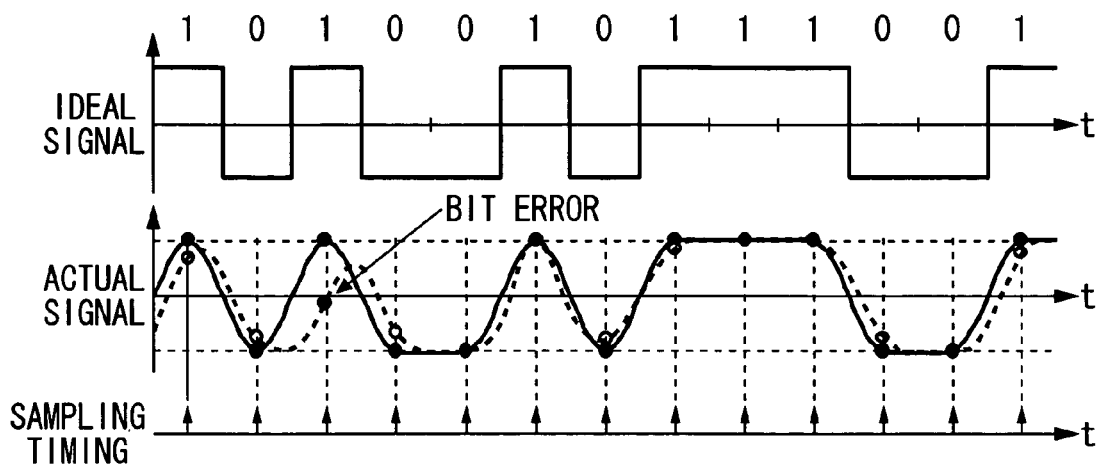
FIG. 53 shows an example of the ideal and actual signals of the output signal.
FIG. 54 shows the test time of the measuring apparatus 100 and that of a conventional bit error rate measuring apparatus.

FIG. 53 shows an example of the ideal and actual signals of the output signal. As shown in FIG. 53, the optimum decision boundary $t_{decision}$ is a halfway point between two adjacent zero-crossings (that is, a rising edge and a falling edge). The period of the optimum decision boundaries is given by the period of bits $T_b=1/f_b$. (a) A conventional measuring apparatus performs sampling of the bit stream output from the DUT at the optimum decision boundaries $t_{decision}$. In a case where the DUT is a serializer, for example, the output bit stream from the serializer is sampled at $t_{decision}$ that is given by the bit period. In another case where the DUT is a deserializer, data multiplexed with a ratio 1:L is output. Therefore, the output bit stream from the deserializer is sampled at $t_{decision}$ that is given by the data period per channel of $LT_b$. (b)Then, the conventional measuring apparatus compares the sampled values with a threshold value, and discriminates logical values "1" and "0" of the output bit stream of the DUT. (c) The conventional measuring apparatus compares the logical values determined from the sampled values with expected values corresponding thereto, so as to calculate the error rate.

$$BER=\frac{\text{number of bits detected in error in a time interval}}{\text{number of bits transmitted in a time interval}} \quad (64)$$

Let consider a test time required for the bit error rate test. For example, the application of a pseudo-random binary sequence having a pattern length of $2^{15}-1$ that is phase-modulated with the jitter frequency of 5 MHz in order to perform the jitter tolerance test for a 2.5 Gbps serial communication device requires only 13 μsec. Moreover, the application of a pseudo-random binary sequence having a pattern length of $2^{23}-1$ requires only 3.4 msec. On the other hand, the test for the bit error rate of $10^{-9}$ requires 0.4 sec. Thus, this test time is independent of the pattern length. Moreover, in order to test the bit error rate of $10^{-12}$, 400 sec is required. Moreover, when the applied jitter amount is increased, the PLL circuit in the DUT may not work correctly. In particular, as the bit clock frequency increases, this type of bit error may occur in a case that the applied jitter amount is slightly increased. From the above, according to the method in which the generation of the bit error is detected, it is hard to obtain a measurement having good repeatability or to shorten the test time. Therefore, it is necessary to find a method which does not require direct detection of the bit error occurrence to shorten the test time.

The measuring apparatus 100 described referring to FIGS. 1 to 47 calculates the jitter transfer function of the DUT and then calculates the bit error rate and/or the jitter tolerance of the DUT based on the thus calculated jitter transfer function. Therefore, as compared with the conventional measuring apparatus, the test time can be reduced. Moreover, although the measuring apparatus 100 described referring to FIGS. 1 to 47 calculates the jitter transfer function of the DUT, the measuring apparatus 100 in other examples may calculate the bit error rate and/or jitter tolerance of the DUT based on the jitter transfer function that was supplied to the measuring apparatus 100 in advance.

In other words, the measuring apparatus 100 may include the bit error rate estimator that estimates the bit error rate of the DUT based on the jitter transfer function of the DUT given in advance. Moreover, the measuring apparatus 100 may include the jitter tolerance estimator that estimates the jitter tolerance of the DUT based on the gain of the jitter transfer function of the DUT given in advance. In this case, the bit error rate estimator and jitter tolerance estimator may have the same or similar functions and structures as/to the bit error rare estimator 102 and the jitter tolerance estimator 302 mentioned above.

The measuring apparatus 100 described referring to FIGS. 48 to 52 calculates the timing differences between the input and output signals and then calculates the bit error rate of the DUT based on the thus calculated timing differences. Therefore, as compared with the conventional measuring apparatus, the test time can be reduced. Moreover, the measuring apparatus described referring to FIGS. 48 to 52 may include the jitter tolerance estimator that estimates the jitter tolerance of the DUT. The jitter tolerance estimator calculates the jitter tolerance of the DUT based on the timing difference between the input and output signals.

Figure 55:
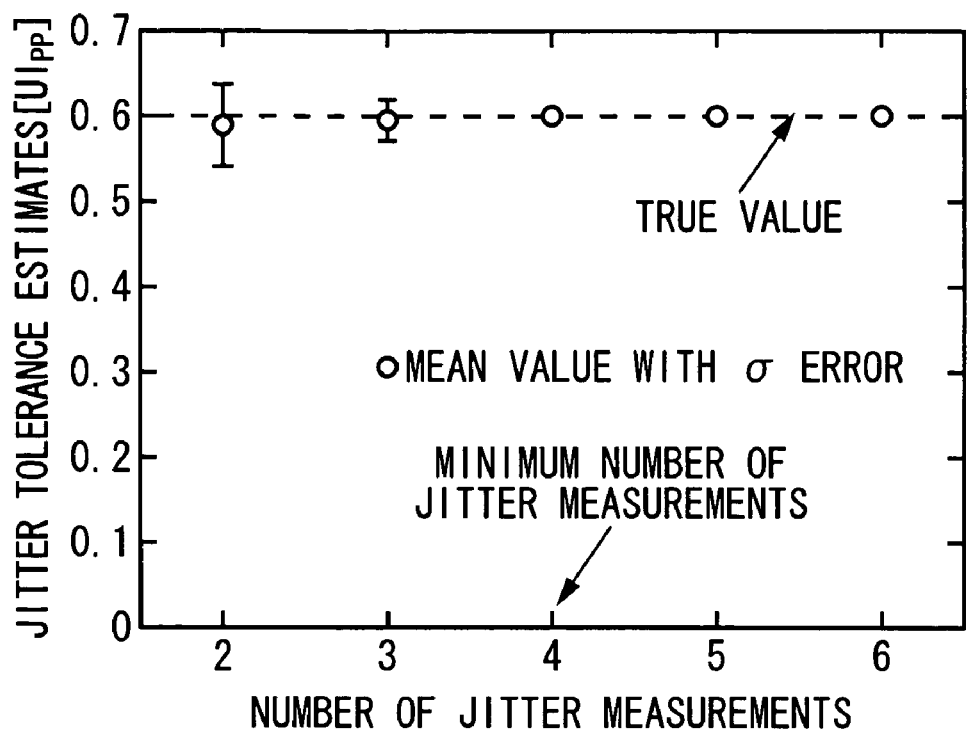
FIG. 55 shows an exemplary relationship between the number of times the applied jitter amount was changed and the measured jitter tolerance in the measuring apparatus 100.

FIG. 54 shows the test time of the measuring apparatus 100 and that of a conventional bit error rate measuring apparatus. FIG. 55 shows an exemplary relationship between the number of times the applied jitter amount was changed and the measured jitter tolerance in the measuring apparatus 100. As shown in FIG. 54, the conventional bit error rate measuring apparatus requires the test time of 20 sec in order to change the applied jitter amount 20 times and perform 1-sec bit error rate test for each of 20 types of jitter amount. On the other hand, the aforementioned measuring apparatus 100 can estimate the jitter tolerance with high precision by changing the applied jitter amount the minimum number times (for example, four times) and obtaining the jitter gain, as shown in FIG. 55. The measuring apparatus 100 can calculate the jitter tolerance with high precision by changing the applied jitter amount, for example, four times and performing the measurement for the respective applied jitter amount, as shown in FIG. 55. In the measuring apparatus 100, the jitter measurement for each jitter amount requires about 0.5 msec. Thus, the measuring apparatus 100 can obtain the jitter gain of the DUT in about 2 sec. That is, the measuring apparatus 100 can obtain the jitter tolerance in the test time that is about 1/10 of the test time of the conventional measuring apparatus.

Figure 56:
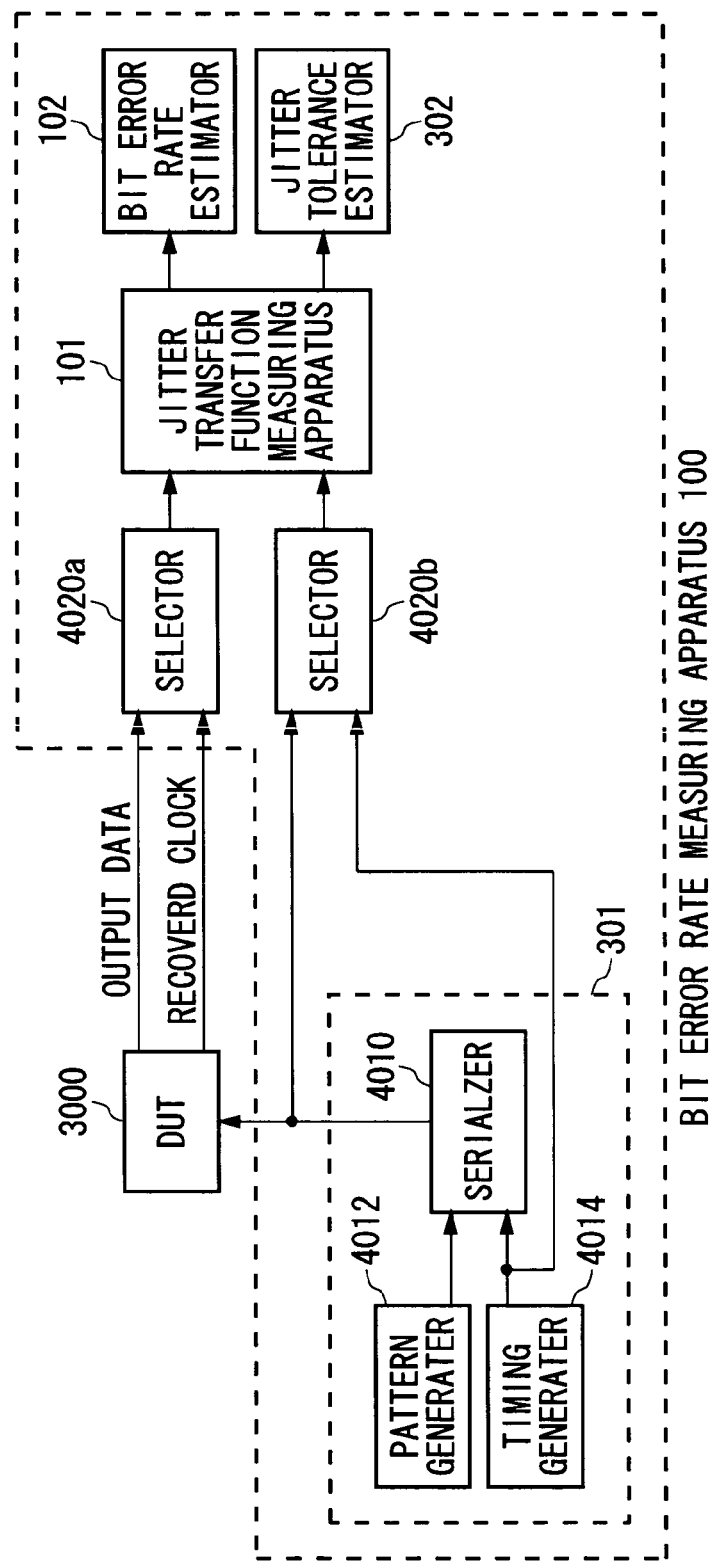
FIG. 56 illustrates another exemplary measuring apparatus 100.

FIG. 56 illustrates another exemplary measuring apparatus 100. The measuring apparatus 100 of this example includes the same structure of that described referring to FIG. 43 and a selector 4020a and a selector 4020b (hereinafter, simply referred to as selectors 4020). The selectors 4020 select either an input data signal given to the electronic device or an input data clock signal for generating the input data signal, and supply it to the jitter transfer function measuring apparatus 101 as an input signal of the DUT 3000. Moreover, the selectors 4020 select either an output data signal output from the DUT 3000 in response to the input data signal, or a recovered clock signal output from the DUT 3000 in response to the input data signal, and supply it to the jitter transfer function measuring apparatus 101 as an output signal of the DUT 3000.

The jitter transfer function measuring apparatus 101 measures the jitter transfer function between the received input signal and the received output signal. Operation of the jitter transfer function measuring apparatus 101 is the same as the operation of the jitter transfer function measuring apparatus 101 described referring to FIG. 43. Moreover, operation of the bit error rate estimator 102 and the jitter tolerance estimator 302 is the same as the operation of the bit error rate estimator 102 and the jitter tolerance estimator 302 described referring to FIG. 43.

Moreover, the signal input means 301 generates the input data signal supplied to the DUT 3000, and includes a pattern generator 4012, a timing generator 4014, and a serializer 4010. The pattern generator 4012 supplies pattern data for generating the input data signal to the serializer 4010, and the timing generator 4014 supplies the input data clock signal for generating the input signal to the serializer 4010. The serializer 4010 generates the input data signal based on the received pattern data and the received input data clock. For example, the serializer 4010 outputs each data of the received pattern data one after another in response to a timing of edges of the received input data clock signal.

Moreover, as explained in FIG. 43, the signal input means 301 applies a desired timing jitter to the input data signal. The signal input means 301 may apply the timing jitter to the input data signal by applying the timing jitter to the input data clock signal.

As the output signal, when the recovered clock signal is selected, the jitter transfer function measuring apparatus 101 can measure the jitter transfer function in the clock recovery unit 3003 described referring to FIG. 47. In this case, either the input data signal or the input data clock signal maybe selected as the input signal.

Moreover, as the output signal, when the output data signal is selected, the jitter transfer function measuring apparatus 101 can measure the jitter transfer function in all the structure of the DUT 3000 described referring to FIG. 47. Also in this case, either the input data signal or the input data clock signal may be selected as the input signal. That is, by selecting the input signal, it can be determined that which part of the DUT 3000 is to be measured.

Moreover, also in the measuring method described referring to FIG. 44, there may be a step for selecting either the input data signal or the input data clock signal as the input signal, and a step for selecting either the output data signal or the recovered clock signal as the output signal, between S401 and S201. These steps may be performed by using the selectors 4020.

Figures 57, 58:
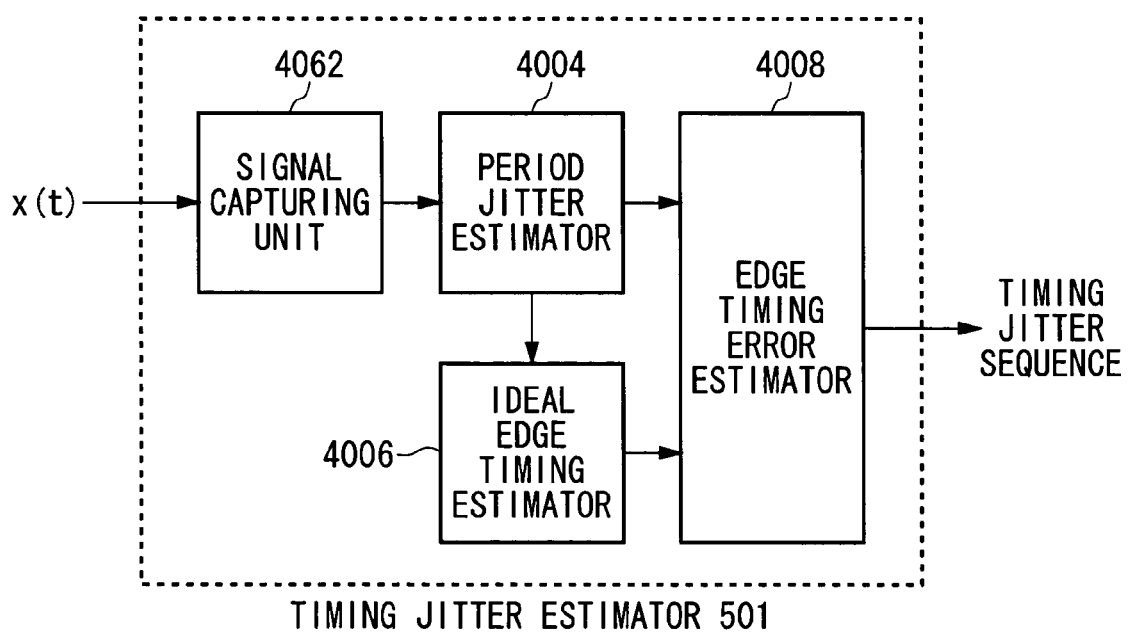
FIG. 57 illustrates examples of pattern data generated by a pattern generator 4012.
FIG. 58 illustrates another exemplary structure of the timing jitter estimator 501 of the jitter transfer function measuring apparatus 101.

FIG. 57 illustrates examples of pattern data generated by the pattern generator 4012. For example, the pattern generator 4012 may generate a signal of pseudo-random binary sequence as shown in data A. Moreover for example, the pattern generator 4012 may generate pattern data as shown in data B, in which a bit of the pattern data corresponding to a certain output pin of the DUT 3000 repeats 1 (high) and 0 (low) by turns. In this case, the amount of the input data signal and the input data clock signal input to the DUT 3000 are equalized for the certain output pin of the DUT 3000. Thereby, the jitter transfer function measuring apparatus 101 can measure the jitter transfer function more precisely.

Moreover, the pattern generator 4012 may generate pattern data as shown in Data C, in which 1 and 0 is repeated for every bit number same number as the output pins. Also in this case, the jitter transfer function can be measured more precisely same as the Data B, and the pattern data can be generated easily.

FIG. 58 illustrates another exemplary structure of the timing jitter estimator 501 of the jitter transfer function measuring apparatus 101. The timing jitter estimator 501 of this example includes a signal capturing unit 4062, a period jitter estimator 4004, an ideal edge timing estimator 4006, and an edge timing error estimator 4008. For example, the timing jitter estimator 501 in this example is a conventional oscilloscope.

The signal capturing unit 4062 captures the output signal of the DUT. Moreover, the signal capturing unit 4062 measures a period of the captured output signal etc.

The period jitter estimator 4004 estimates a period jitter sequence of the output signal based on the measurement result in the signal capturing unit 4062. Here, the period jitter sequence may indicate length of each cycle of the output signal, and may indicate timing of each edge of the output signal.

The ideal edge timing estimator 4006 estimates an average period of the output signal based on the period jitter sequence. For example, when the period jitter sequence indicates the length of each cycle of the output signal, the idea ledge timing estimator 4006 estimates an average of each value of the period jitter sequence as an average period of the output signal.

Next, the edge timing error estimator 4008 estimates the output timing jitter sequence based on the average period of the period jitter sequence, and the period jitter sequence. For example, the output timing jitter may be estimated by calculating an ideal edge timing sequence indicating ideal timing of each edge of the output signal, and calculating difference between the ideal edge timing sequence and the period jitter sequence indicating timing of each edge of the output signal, based on the average period of the output signal.

The timing jitter sequence of the output signal can be estimated by the structure of the timing jitter estimator 501 in this example as well as the timing jitter estimators 501 of the other examples. Moreover, the timing jitter sequence of the input signal of the DUT may be estimated.

Figure 59:
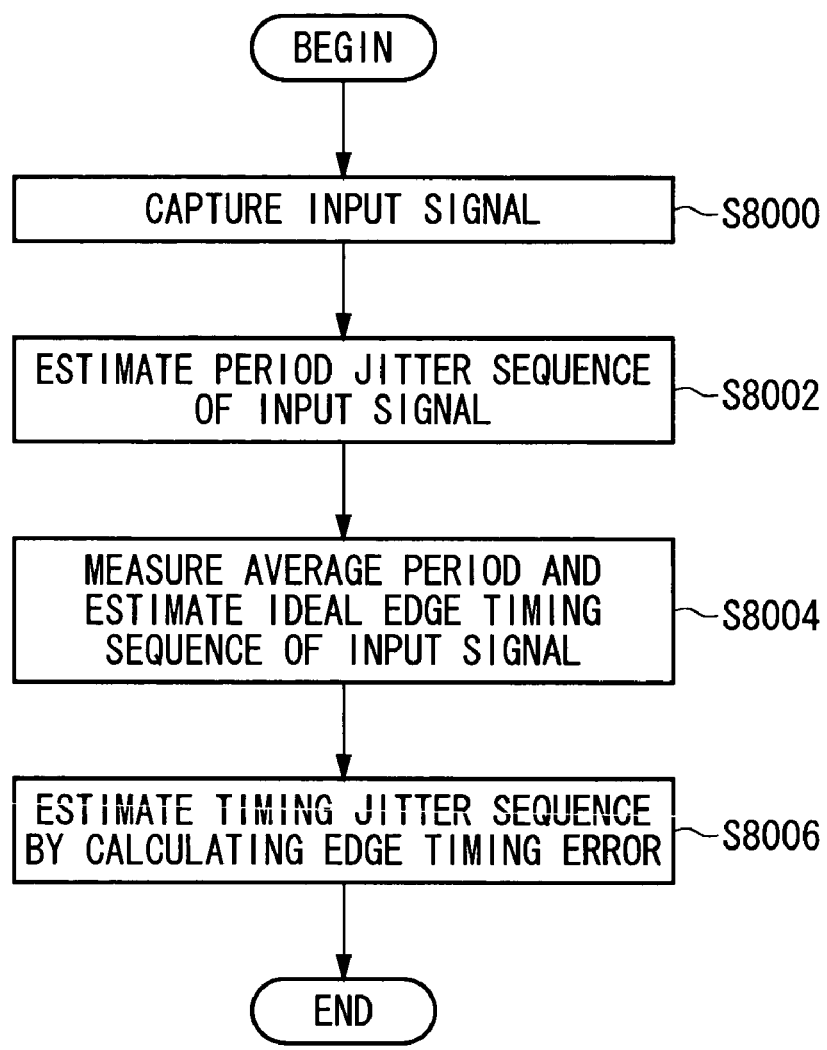
FIG. 59 is a flowchart showing another example of step of the timing jitter estimation S221.

FIG. 59 is a flowchart showing another example of step of the timing jitter estimation S221. The timing jitter estimation step S221 in this example may be performed by the timing jitter estimator 501 described referring to FIG. 58.

First, the signal, from which the timing jitter is to be estimated, is captured in signal capturing step S8000. The step S8000 may be performed by using the signal capturing unit 4062 described referring to FIG. 58.

Next, the period jitter sequence of the captured signal is estimated in a period jitter sequence estimation step S8002. The step S8002 may be performed by using the period jitter estimator 4004 described referring to FIG. 58.

Next, the average period of the signal is estimated in ideal edge timing estimation step S8004. The step S8004 may be performed by using the ideal edge timing estimator 4006 described referring to FIG. 58.

Next, the timing jitter sequence of the signal is estimated in the edge error estimation step S8006. The step S8006 may be performed by using the edge timing error estimator 4008 described referring to FIG. 58.

Figure 60:
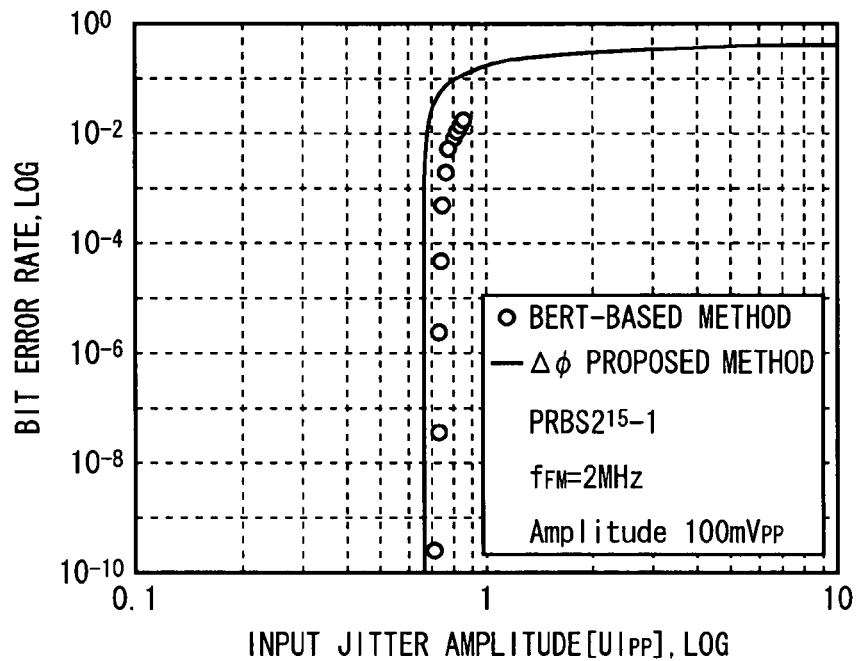
FIG. 60 is an example of a curve of bit error rate.

FIG. 60 shows an example of a curve of a bit error rate. In FIG. 60, circles show measurement points of bits measured by a conventional measuring apparatus, and a solid line shows the bit error rate curve measured by the measuring apparatus 100. According to the measuring apparatus 100, the bit error rate curve which is compatible with the conventional method can be obtained. Moreover, as described referring to FIG. 56, in order to obtain the bit error rate curve as shown in FIG. 60, either the input data signal or the input data clock signal may be selected as the input signal, and either the output data signal or the recovered clock signal as the output signal.

Figure 61:
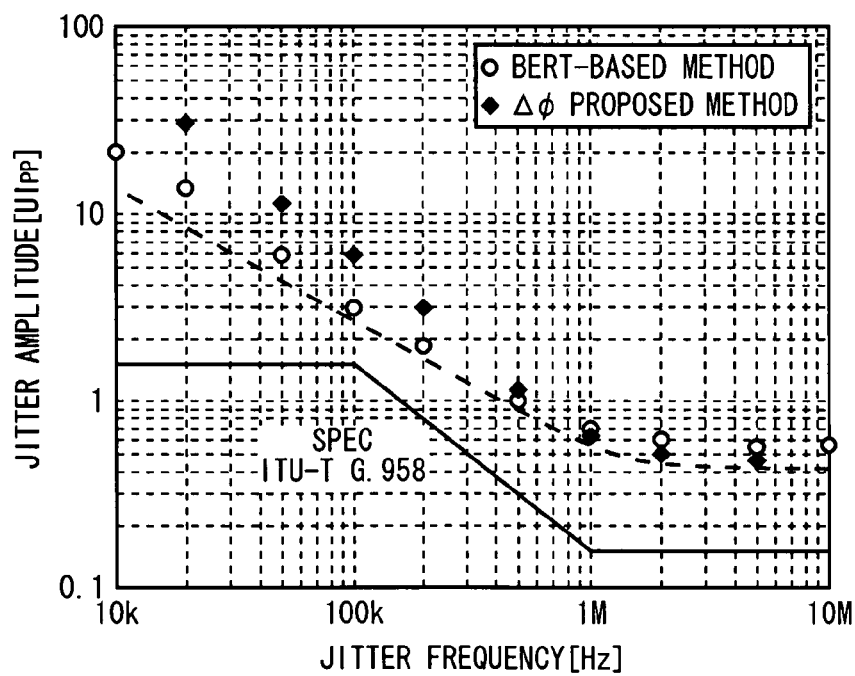
FIG. 61 is an exemplary measurement of the jitter tolerance.

FIG. 61 is an exemplary measurement of the jitter tolerance.

In FIG. 61, a horizontal axis shows frequency of the input timing jitter, and a vertical axis shows the jitter tolerance. Moreover, in FIG. 61, circles show the jitter tolerance measured by the conventional measuring apparatus, and square marks show the jitter tolerance measured by the measuring apparatus 100. In this example, the measuring apparatus 100 measures the jitter tolerance using the Equation (39). As shown in FIG. 61, the measuring apparatus 100 can measure the jitter tolerance which is compatible with the conventional method. Moreover, as described referring to FIG. 56, in order to obtain the jitter tolerance as shown in FIG. 61, either the input data signal or the input data clock signal may be selected as the input signal, and either the output data signal or the recovered clock signal may be selected as the output signal.

Moreover, the measuring apparatus 100 may measure the jitter tolerance using Equation (39.2). The more accurate jitter tolerance can be measured by substituting, for example, 0.75 for $\beta$ in this case.

Figure 62:
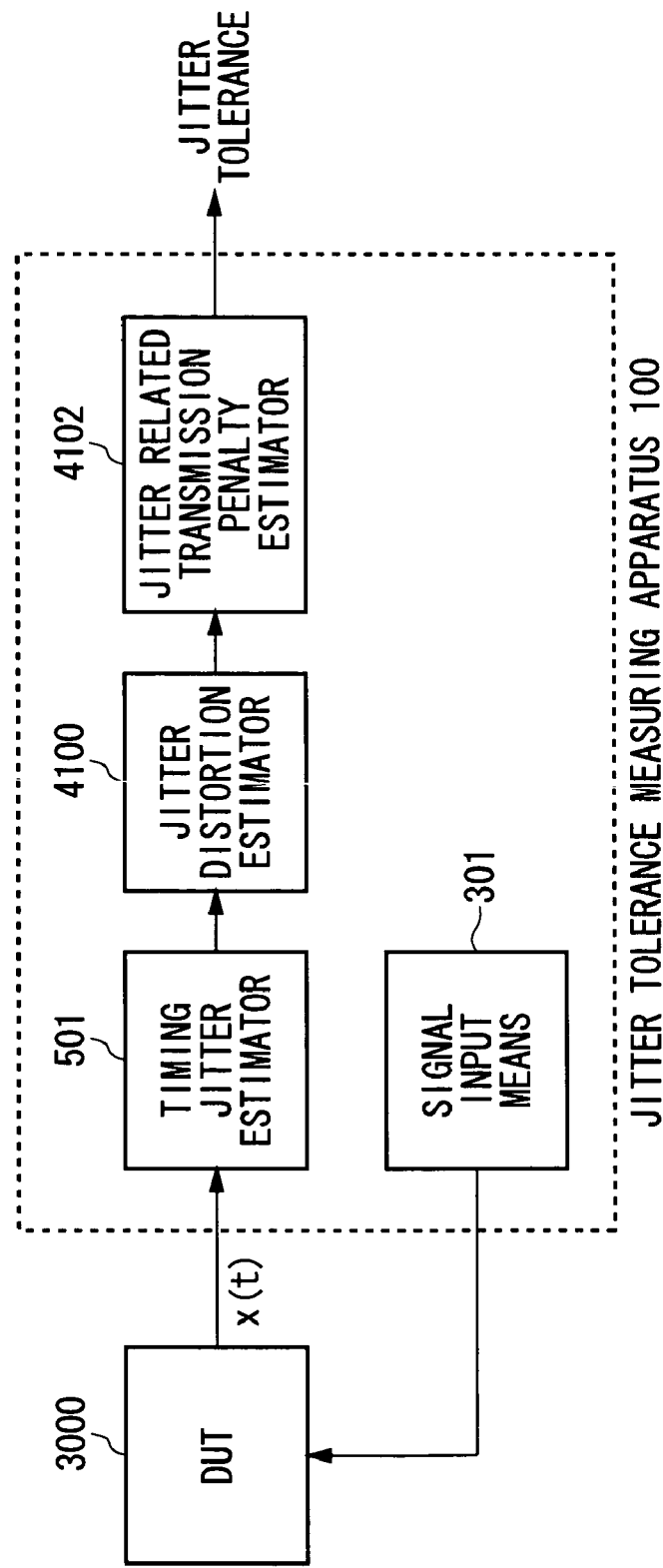
FIG. 62 is another exemplary structure of a jitter tolerance measuring apparatus as an example of the measuring apparatus 100.

FIG. 62 is another exemplary structure of a jitter tolerance measuring apparatus as an example of the measuring apparatus 100.

The measuring apparatus 100 includes a signal input means 301, a timing jitter estimator 501, a jitter distortion estimator 4100, and a jitter related transmission penalty estimator 4102. The signal input means 301 has the same function and the same structure as the signal input means 301 described referring to FIG. 56, and the timing jitter estimator 501 has the same function and the same structure as the timing jitter estimator 501 described referring to FIG. 3.

The jitter distortion estimator 4100 estimates the jitter distortion of the output timing jitter sequence. Here, the jitter distortion of the output timing jitter sequence is distortion of the output timing jitter of the output signal which the DUT 3000 actually outputs in response to the input signal, against the ideal timing jitter of the output signal which the DUT 3000 is to output in response to the input signal.

The jitter related transmission penalty estimator 4102 estimates reliability of the DUT 3000 against jitter based on the jitter distortion. For example, the jitter related transmission penalty estimator 4102 estimates the jitter tolerance of the DUT 3000. Moreover, the jitter related transmission penalty estimator 4102 may estimate whether the DUT 3000 operates normally in response to the input timing jitter of a predetermined amplitude. That is, the signal input means 301 may apply the input timing jitter of desired amplitude to the input signal, and may supply it to the DUT 3000, and the jitter related transmission penalty estimator 4102 may estimate the reliability of the DUT 3000 against jitter for the amplitude of the input timing jitter.

Figure 63:
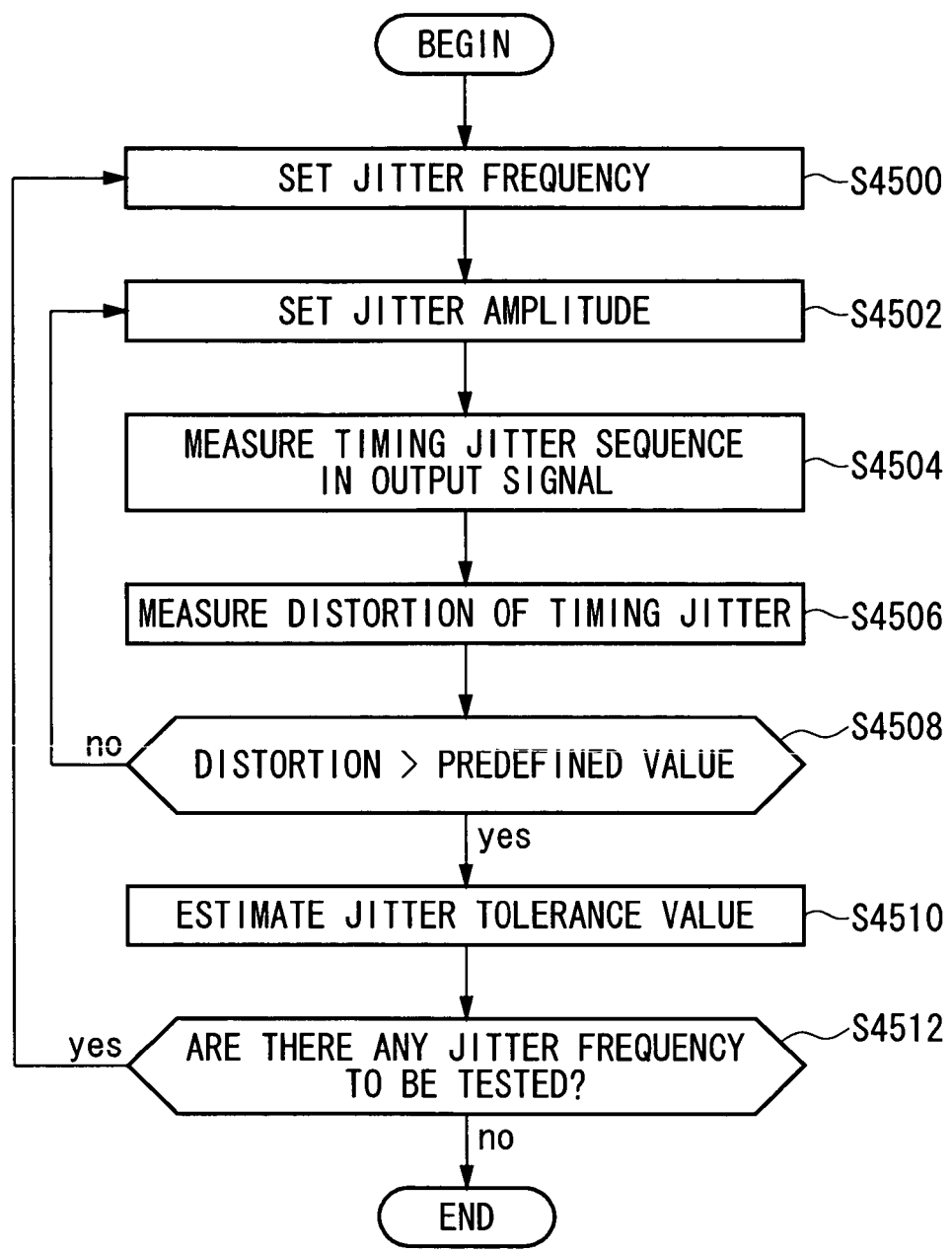
FIG. 63 is a flowchart showing an example of measuring method for measuring DUT 3000.

FIG. 63 is a flowchart showing an example of measuring method for measuring the DUT 3000. First, in the jitter frequency setting step S4500, frequency of the input timing jitter, applied to the input signal to the DUT 3000, is set up.

Next, in a jitter amplitude setting step S4502, amplitude of the input timing jitter, applied to the input signal to the DUT 3000, is set up. The steps S4500 and S4502 may be performed using the signal input means 301 described referring to FIG. 62.

Next, in a timing jitter sequence measurement step S4504, the output timing jitter sequence is measured based on the output signal of the DUT 3000. The step S4504 may be performed using the timing jitter estimator 501 described referring to FIG. 62.

Next, in a jitter distortion measurement step S4506, the jitter distortion of the timing jitter of the output signal, which DUT 3000 actually outputs, against the timing jitter of the output signal which DUT 3000 is to output in response to the input signal, is measured. The step S4506 may be performed using the jitter distortion estimator 4100 described referring to FIG. 62.

Next, in a judging step S4508, it is judged whether the jitter distortion is larger than a predetermined value. The step S4508 may be performed using the jitter related transmission penalty estimator 4102 described referring to FIG. 62.

In the step S4508, if the jitter distortion is smaller than the predetermined value, the sequence returns to the step S4502 again, where the input signal, to which input timing jitter of larger amplitude than the previous time is applied, inputs to the DUT 3000, and the processing of the steps S4502-S4508 is repeated until the jitter distortion in the step 4508 becomes larger than the predetermined value.

If the jitter distortion is larger than the predetermined value in the step S4508, the jitter tolerance of the DUT 3000 is estimated in the jitter tolerance estimation step S4510. In the step S4510, the amplitude of the input timing jitter may be estimated as a jitter tolerance of the DUT 3000 at the frequency of the input timing jitter, when being judged in the step S4508 that the jitter distortion is larger than the predetermined value. Moreover, the step S4510 may be performed using the jitter related transmission penalty estimator 4102 described referring to FIG. 62.

Next, in a step S4512, it is judged whether there is any input timing jitter of another frequency which is to be measured further. If there is another input timing jitter of another frequency which is to be measured, the frequency is set up in the S4500 and the processing of the steps S4500-S4510 is repeated. Moreover, if there is no input timing jitter to be measured any more, the measurement of the jitter tolerance is ended. That is, the signal input means 301 supplies the input signal, to which a plurality of sinusoidal jitters having different frequency are applied, to the DUT 3000 for example, and the jitter related transmission penalty estimator 4102 estimates the reliability of the DUT against the jitter for every frequency of the sinusoidal jitters. Moreover, the signal input means 301 may supply the input signal, to which the input timing jitters having a plurality of frequency components is applied, to the DUT 3000. In this case, the reliability of the DUT 3000 against the jitters is measured for every frequency components.

Figure 64:
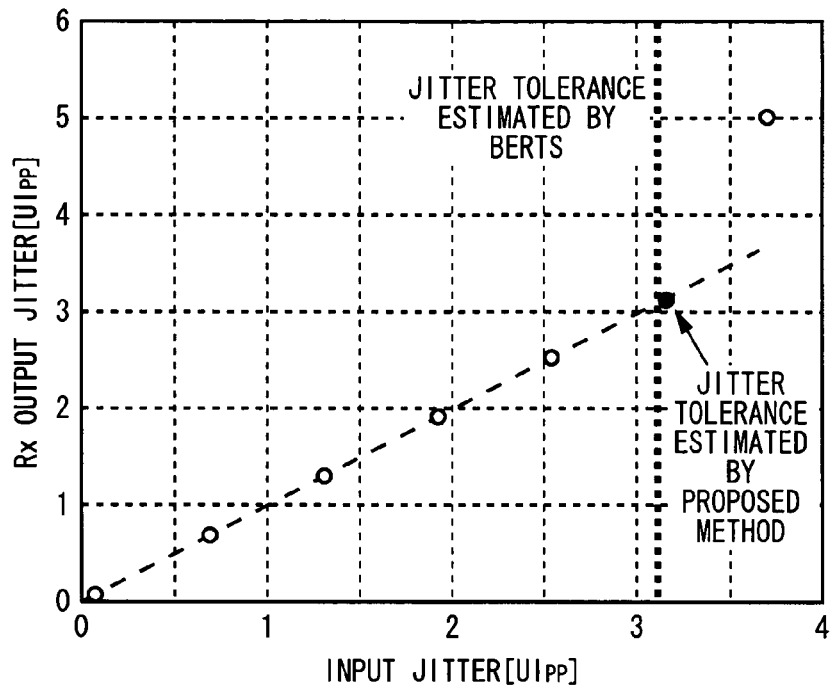
FIG. 64 is an exemplary measurement of the jitter tolerance.

FIG. 64 is an exemplary measurement of the jitter tolerance.

In FIG. 64, a horizontal axis shows the amplitude of the input timing jitter having a predetermined frequency, and a vertical axis shows the amplitude of the output timing jitter.

As described referring to FIG. 63, the signal input means 301 of the measuring apparatus 100 supplies a plurality of input signals, having different amplitudes of the input timing jitter, to the DUT 3000, and the jitter related transmission penalty estimator 4102 estimates the jitter tolerance of the DUT 3000 based on the jitter distortion of each of the output timing jitters against the plurality of input signals.

That is, as shown in the circles of FIG. 63, the jitter distortion estimator 4100 estimates the amplitude of the output timing jitters in response to a plurality of input timing jitters having different amplitudes, and the jitter related transmission penalty estimator 4102 estimates the jitter tolerance based on the amplitude of the input timing jitters, where the amplitude of the output timing jitter, in response to the amplitude of the input timing jitter, becomes nonlinear.

As described referring to FIG. 47, in the DUT 3000, the clock recovery unit 3003 generates a recovered clock in response to the input signal, and the flip-flop 3001 and the serial-parallel converter 3002 output the received signal in response to the recovered clock. For this reason, when the amplitude of the input timing jitter in the input signal is small, the output timing jitter has a linear relation to the amplitude of the input timing jitter. However, when the amplitude of the input timing jitter becomes larger than the bit width of the input signal etc., for example, there is a possibility that the flip-flop 3001 and the serial-parallel converter 3002 output a different bit value from the bit value which is to be output. For this reason, the amplitude of the output timing jitter becomes nonlinear in response to the amplitude of the input timing jitter. In this case, as mentioned above, since the output signal may output a different bit value from the original bit value, the jitter tolerance of the DUT 3000 can be measured easily by detecting the domain where the amplitude of the output timing jitter becomes nonlinear in response to the amplitude of the input timing jitter.

Figure 65:
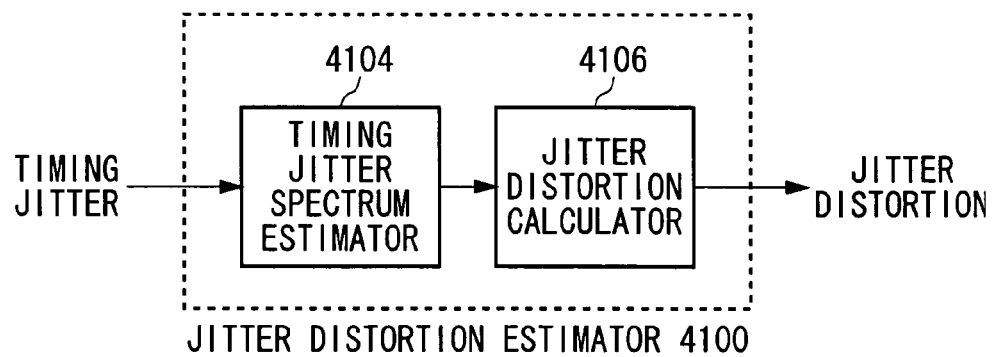
FIG. 65 is an exemplary structure of a jitter distortion estimator 4100.

FIG. 65 shows an example of the composition of the jitter distortion estimator 4100. In this example, the jitter distortion estimator 4100 measures the jitter distortion of the output timing jitter based on the spectrum of the output timing jitter sequence. The jitter distortion estimator 4100 includes a timing jitter spectrum estimator 4104 and the jitter distortion calculator 4106. Moreover, in this example, the signal input means 301 applies the input timing jitter, which has predetermined frequency like a sinusoidal jitter for example, to the input signal.

FIG. 65 is an exemplary structure of a jitter distortion estimator 4100. In this example, the jitter distortion estimator 4100 measures the jitter distortion of the output timing jitter based on the spectrum of the output timing jitter sequence. The jitter distortion estimator 4100 includes a timing jitter spectrum estimator 4104 and a jitter distortion calculator 4106. Moreover, in this example, the signal input means 301 applies the input timing jitter having a predetermined frequency, like a sinusoidal jitter for example, to the input signal.

The timing jitter spectrum estimator 4104 receives the output timing jitter sequence, and estimates the jitter spectrum of the output timing jitter sequence. For example, the timing jitter spectrum estimator 4104 estimates the jitter spectrum with Fourier transformation.

The jitter distortion calculator 4106 calculates the jitter distortion of the output timing jitter based on the jitter spectrum.

For example, the jitter distortion calculator 4106 calculates the distortion of the jitter spectrum of the output timing jitter in the output signal output from the DUT 3000, against the jitter spectrum of the output timing jitter in the output signal which is to be output from the DUT 3000.

Figure 66:
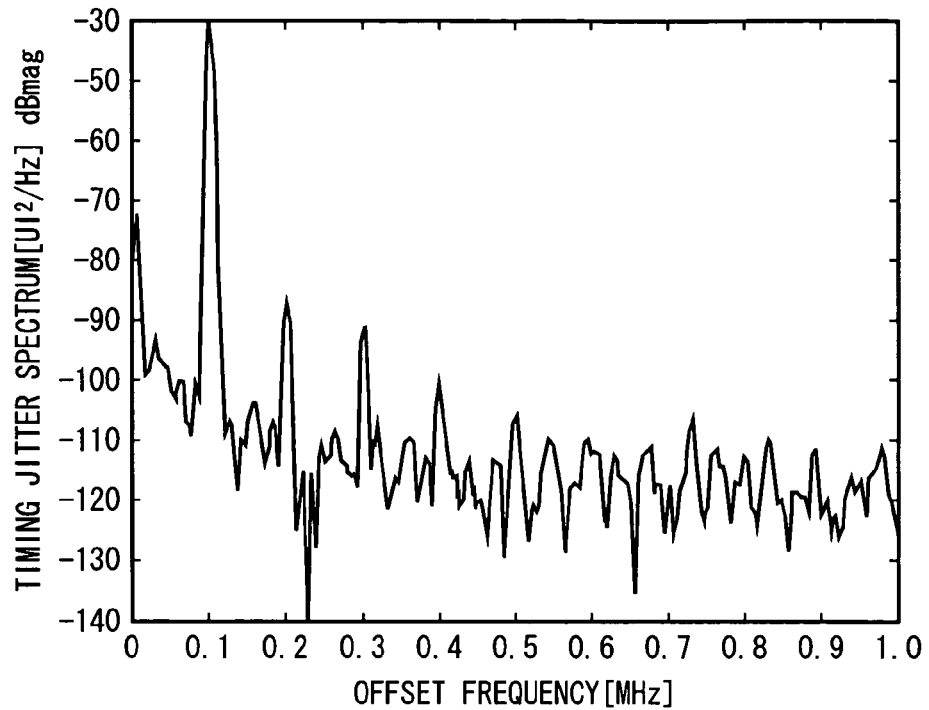
FIG. 66 is another exemplary measurement of the jitter tolerance.

FIG. 66 is another exemplary measurement of the jitter tolerance. FIG. 66 shows an example of the jitter spectrum of the output timing jitter of the output signal which the DUT 3000 is to output, when a sinusoidal jitter is applied to the input signal. In FIG. 66, a horizontal axis shows jitter frequency and a vertical axis shows the intensity of the jitter at the jitter frequency. When the input timing jitter is applied to the input signal, the output timing jitter is determined by the jitter transfer function of the sinusoidal jitter and the DUT 3000.

For example, when the sinusoidal jitter having a predetermined frequency is applied to the input signal, the spectrum of the output timing jitter has a peak at the fundamental frequency of the sinusoidal jitter, and having the intensity according to the jitter transfer function.

When the amplitude of the sinusoidal jitter, which is applied to the input signal, is in the linear domain described referring to FIG. 64, the spectrum of the output timing jitter shows the spectrum according to the sine wave, as described referring to FIG. 66. That is, a harmonic content is low enough compared with the fundamental frequency content.

Figure 67:
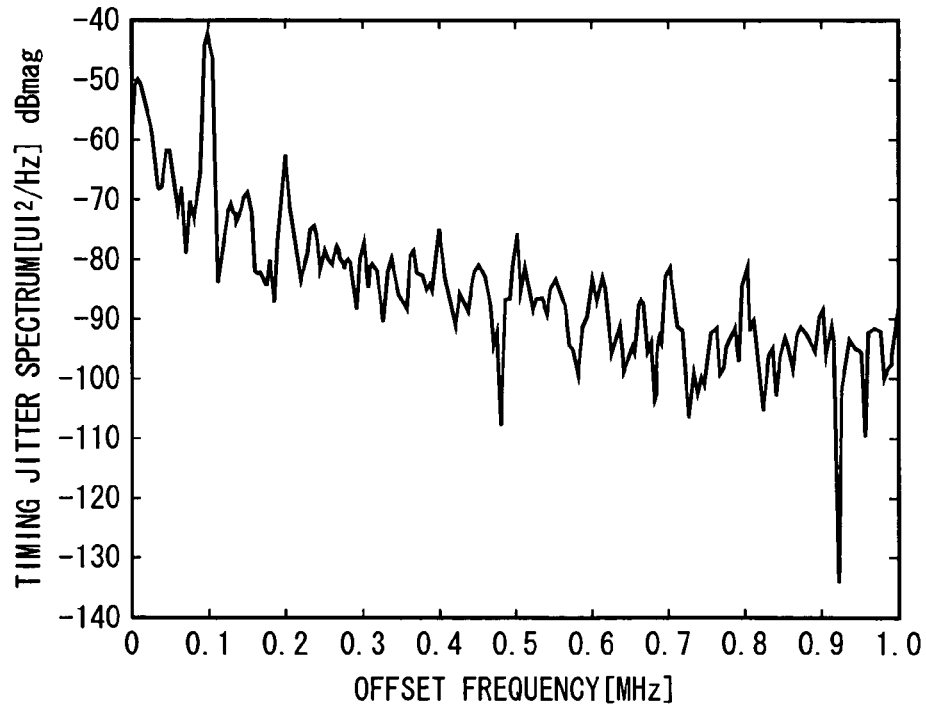
FIG. 67 is another example of jitter spectrum of an output timing jitter of an output signal which is to be output from the DUT 3000 in a case where a sinusoidal jitter is applied to the input signal.

FIG. 67 is another example of jitter spectrum of the output timing jitter of the output signal which is to be output from the DUT 3000 in a case where a sinusoidal jitter is applied to the input signal. In FIG. 67, a horizontal axis shows the jitter frequency and a vertical axis shows the intensity of the jitter at the jitter frequency. When the amplitude of the sinusoidal jitter, which is applied to the input signal, is in the nonlinear domain described referring to FIG. 64, distortion appears in the spectrum of the output timing jitter, as shown in FIG. 67, against the spectrum shown in FIG. 66. That is, a harmonic content of the fundamental frequency content increases. The jitter distortion estimator 4100 described referring to FIG. 65 estimates the distortion. For example, based on the ratio of the fundamental frequency content of the jitter spectrum same as the frequency of the sinusoidal jitter, and the harmonic content of the fundamental frequency component in the jitter spectrum, the jitter distortion of the output timing jitter is estimated. In this example, the jitter distortion estimator 4100 estimates that the output timing jitter is distorted, when the ratio of the intensity of the primary harmonic content to the intensity of the fundamental frequency content is larger than a predetermined value. When jitter distortion arises in the output timing jitter, a bit error may occurs in the output signal of the DUT 3000.

According to the jitter distortion estimator 4100 in this example, it can be judged that whether a bit error occurs in the output signal of the DUT 3000 by the applied input timing jitter. Moreover, the jitter tolerance of the DUT 3000 can be estimated by performing the same estimation for a plurality of input timing jitters having different amplitude.

Figure 68:
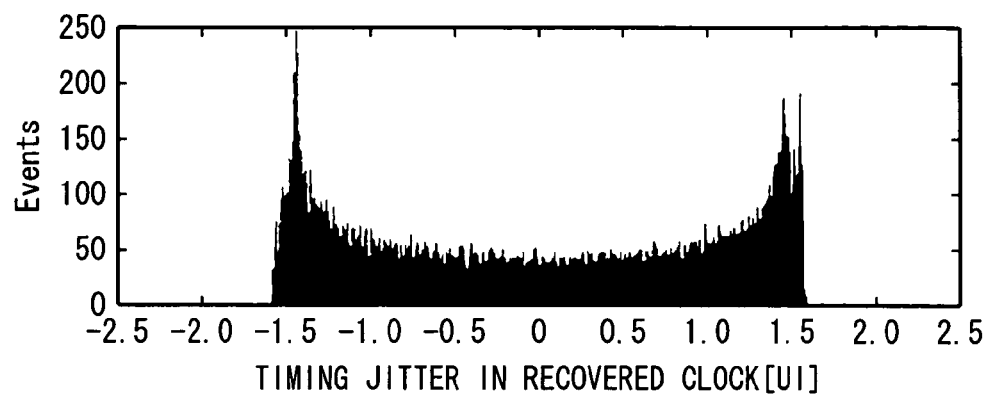
FIG. 68 is a jitter histogram of the output timing jitter in a case where amplitude of the sinusoidal jitter, applied to the input signal, is in linear domain, described referring to FIG. 64.
Figure 69:
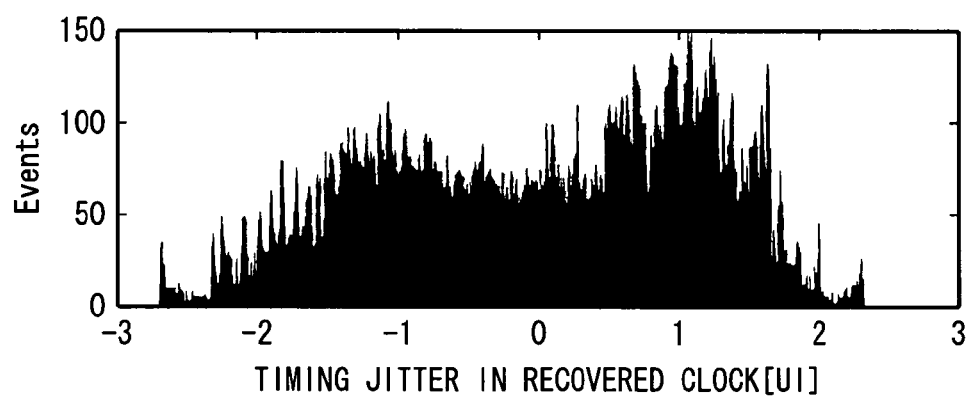
FIG. 69 is a jitter histogram of the output timing jitter in a case where amplitude of the sinusoidal jitter, applied to the input signal, is in nonlinear domain, described referring to FIG. 64.

FIGS. 68 and 69 illustrate other examples for the measurement of the jitter tolerance. FIGS. 68 and 69 show jitter histograms of the amplitude of the output timing jitter when a sinusoidal jitter is applied as the input timing jitter. In FIGS. 68 and 69, a horizontal axis shows the amplitude of the output timing jitter by Unit Interval, and a vertical axis shows the frequency of occurrence at each amplitude.

FIG. 68 is a jitter histogram of the output timing jitter in a case where amplitude of the sinusoidal jitter, applied to the input signal, is in linear domain described referring to FIG. 64. In this example, when the amplitude of the input sinusoidal jitter is in the linear domain, the DUT 3000 outputs the output timing jitter which has two peaks at the both ends of the jitter histogram, as shown in FIG. 68.

FIG. 69 is a jitter histogram of the output timing jitter in a case where amplitude of the sinusoidal jitter, applied to the input signal, is in nonlinear domain described referring to FIG. 64.

When the amplitude of the sinusoidal jitter, which is applied to the input signal, is in the nonlinear domain described referring to FIG. 64, the jitter histogram of the output timing jitter shown in FIG. 69 has distortion, against the jitter histogram shown in FIG. 68.

In this example, the jitter distortion estimator 4100 generates the jitter histogram of the output timing jitter sequence, and estimates the jitter distortion of the output timing jitter based on the jitter histogram. For example, the jitter distortion estimator 4100 may estimate the distortion of the output timing jitter against the input sinusoidal jitter based on whether there are two peaks at the both ends of a jitter histogram.

Figure 70:
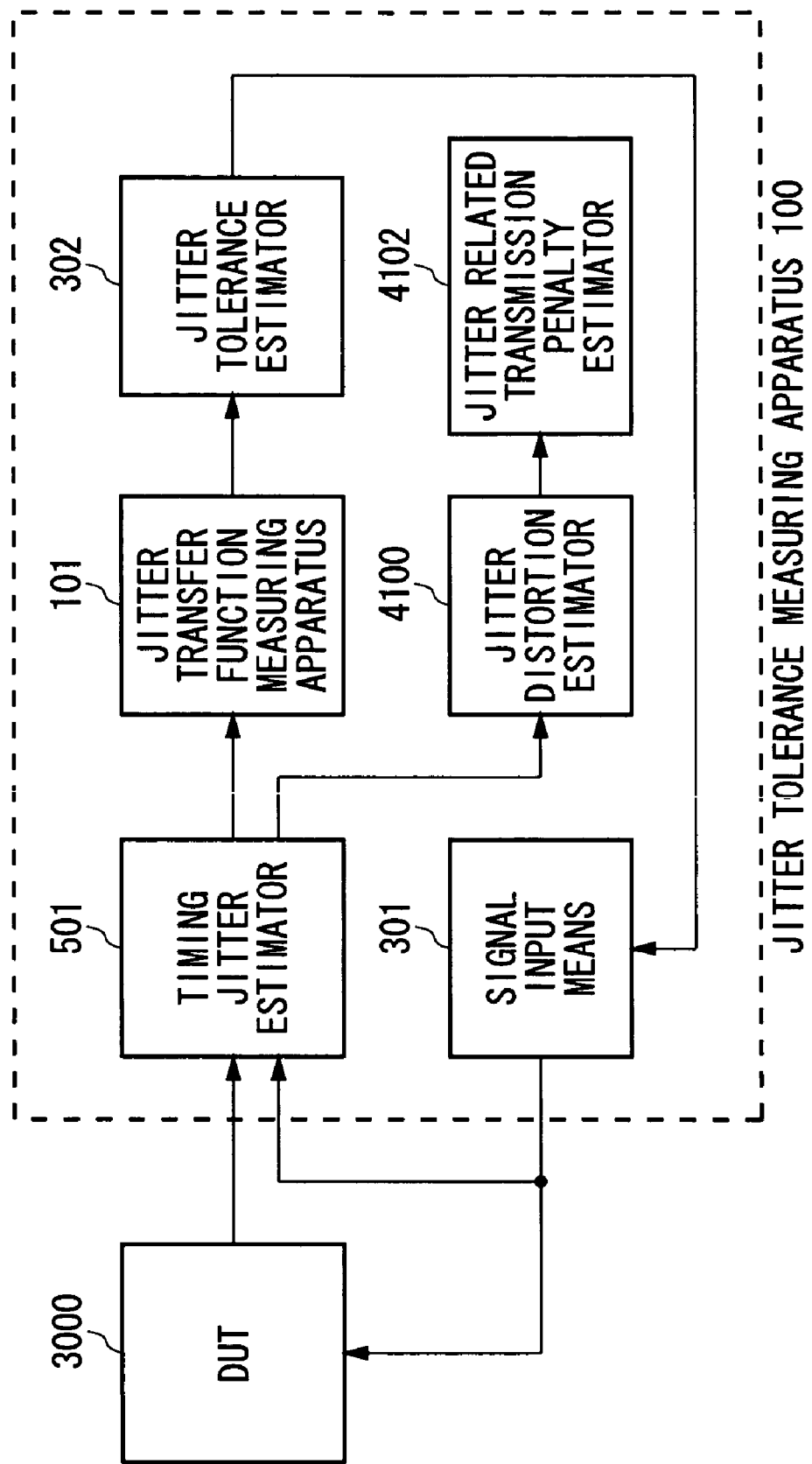
FIG. 70 is another exemplary structure of a jitter tolerance measuring apparatus as an example of the measuring apparatus 100.

FIG. 70 is another exemplary structure of a jitter tolerance measuring apparatus as an example of the measuring apparatus 100. In addition to the composition of the measuring apparatus 100 described referring to FIG. 62, the measuring apparatus 100 in this example further includes a jitter transfer function measuring apparatus 101 and a jitter tolerance estimator 302. The jitter transfer function measuring apparatus 101 and the jitter tolerance estimator 302 have the same or similar function and structure as/to the jitter transfer function measuring apparatus 101 and the jitter tolerance estimator 302 described referring to FIG. 43.

First, the measuring apparatus 100 in this example measures the jitter tolerance by the method described referring to FIG. 44 using the timing jitter estimator 501, the jitter transfer function measuring apparatus 101, and the jitter tolerance estimator 301. Next, the signal input means 301 supplies a first check signal to the DUT 3000, where the timing jitter of amplitude according to the jitter tolerance estimated by the jitter tolerance estimator 302 is applied to the first check signal.

The jitter distortion estimator 4100 estimates the jitter distortion of the output timing jitter of the output signal output from the DUT 3000 in response to the first check signal, against the ideal timing jitter of the output signal which the DUT 3000 is to output in response to the first check signal.

Then, the jitter related transmission penalty estimator 4102, which is an example of the judging unit judges whether the jitter tolerance estimated by the jitter tolerance estimator 302 is the right value based on the jitter distortion estimated by the jitter distortion estimator 4100.

When the jitter related transmission penalty estimator 4102 judges that the jitter tolerance is not the right value, the signal input means 301 supplies a second check signal to the DUT 3000, where the timing jitter having smaller amplitude than the first check signal is applied on the second check signal, and the jitter distortion estimator 4100 estimates the jitter distortion of the output timing jitter of the output signal which DUT 3000 outputs in response to the second check signal, against the ideal timing jitter of the output signal which DUT 3000 is to output in response to the second check signal. And the jitter related transmission penalty estimator 4102 newly estimates the jitter tolerance based on the jitter distortion corresponding to the second check signal estimated by the jitter distortion estimator 4100. For example, the jitter tolerance may be estimated newly by the processing of the steps of S4502-S4508 described referring to FIG. 63.

According to the measuring apparatus 100 in this example, the jitter tolerance of the DUT 3000 can be measured precisely and rapidly. That is, since the jitter tolerance is measured by each method described referring to FIGS. 44 and 63, the jitter tolerance can be measured precisely. For example, even if there is a tendency that the jitter tolerance measured by the method explained in FIG. 44 shows a larger value, the jitter tolerance can be measured with a still more sufficient precision. Moreover, the jitter tolerance can be measured at high speed by the method described referring to FIG. 63 by estimating the coarse value of the jitter tolerance by the method described referring to FIG. 44 at first. Moreover, like the measuring apparatus 100 explained in FIG. 56, the measuring apparatus 100 in this example may select either the input data signal or the input data clock signal as the input signal, and may select either the output data signal or the recovered clock signal as the output signal.

Figure 71:
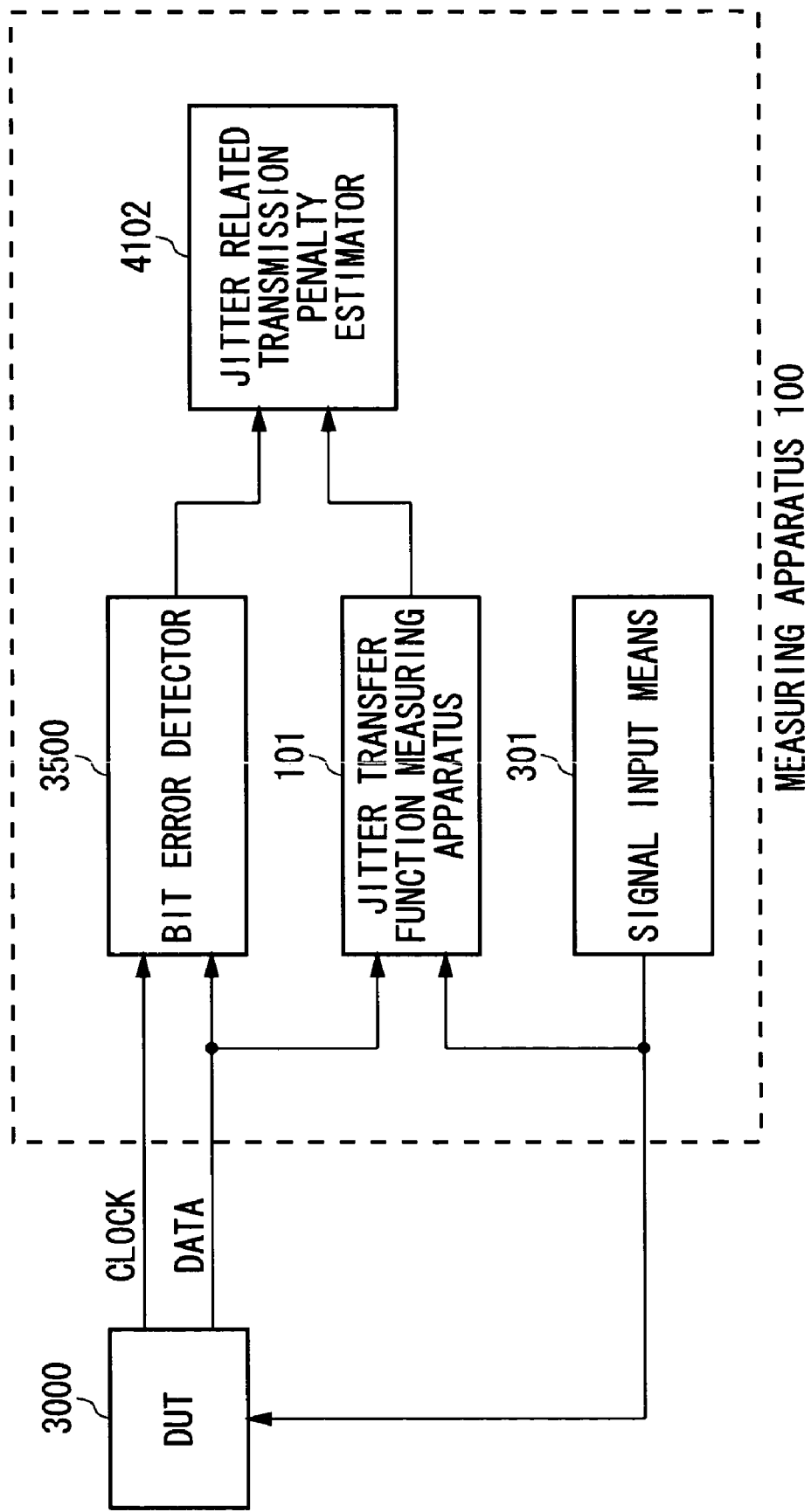
FIG. 71 shows yet another example of a configuration of the measuring apparatus 100.

FIG. 71 shows yet another example of a configuration of the measuring apparatus 100. First, the measuring apparatus 100 according to this example measures a coarse value of jitter tolerance of the DUT 3000 based on the gain estimate of jitter transfer function. Then, an input timing jitter, having amplitude in the vicinity of the amplitude value of the input timing jitter which is determined in accordance with the value of the jitter tolerance, is applied to modulate input pattern signals one after another. Bit value of the input signal and an bit value of the reference pattern signal is compared with each other, and amplitude of the input timing jitter is estimated as a jitter tolerance in detecting a bit error.

In addition to the configuration of the measuring apparatus 100 explained in FIG. 62, the measuring apparatus 100 further includes the bit error detector 3500. In FIG. 71, the composition which bears the same reference numeral as FIG. 62 has the same or similar function and configuration as/to the function and configuration explained in reference with FIG. 62. Moreover, in this example, the jitter related transmission penalty estimator 4102 includes the jitter tolerance estimator 302, and estimates the jitter tolerance of the DUT 3000.

The bit error detector 3500 detects a bit error in the output signal of the DUT 3000 by comparing each of the bit of the output signal output from the DUT 3000 with each of the bit of the reference pattern signal which the DUT 3000 is to output.

For example, when the DUT 3000 is a deserializer as shown in FIG. 47, the bit error detector 3500 receives at least one of parallel data signals output from the DUT 3000 and recovered clock output from the DUT 3000, and digitizes them. The sampling rate is preferably three or more times of the frequency of the digitized signal (parallel data signal or recovered clock).

Next, the digitized data signal is binarized by a comparator means or the like, and the binarized data signal is sampled at the rising edge of the digitized recovered clock. A generated binary series and the reference pattern signal are compared with each other, and then the bit error is detected.

Incidentally, in a 15-stage PRBS (pseudo random binary sequence), there exists at least one portion where consecutive "1" bits form the run, which has length 15, in a serial bit stream. Therefore, the binary series and the standard PRBS are aligned with each other by pattern matching the portion corresponding to such maximum length. Finally, the error of the binary series is detected by comparing them bit by bit.

Next, an example of operation of the measuring apparatus 100 is explained using a flow chart.

Figure 72:
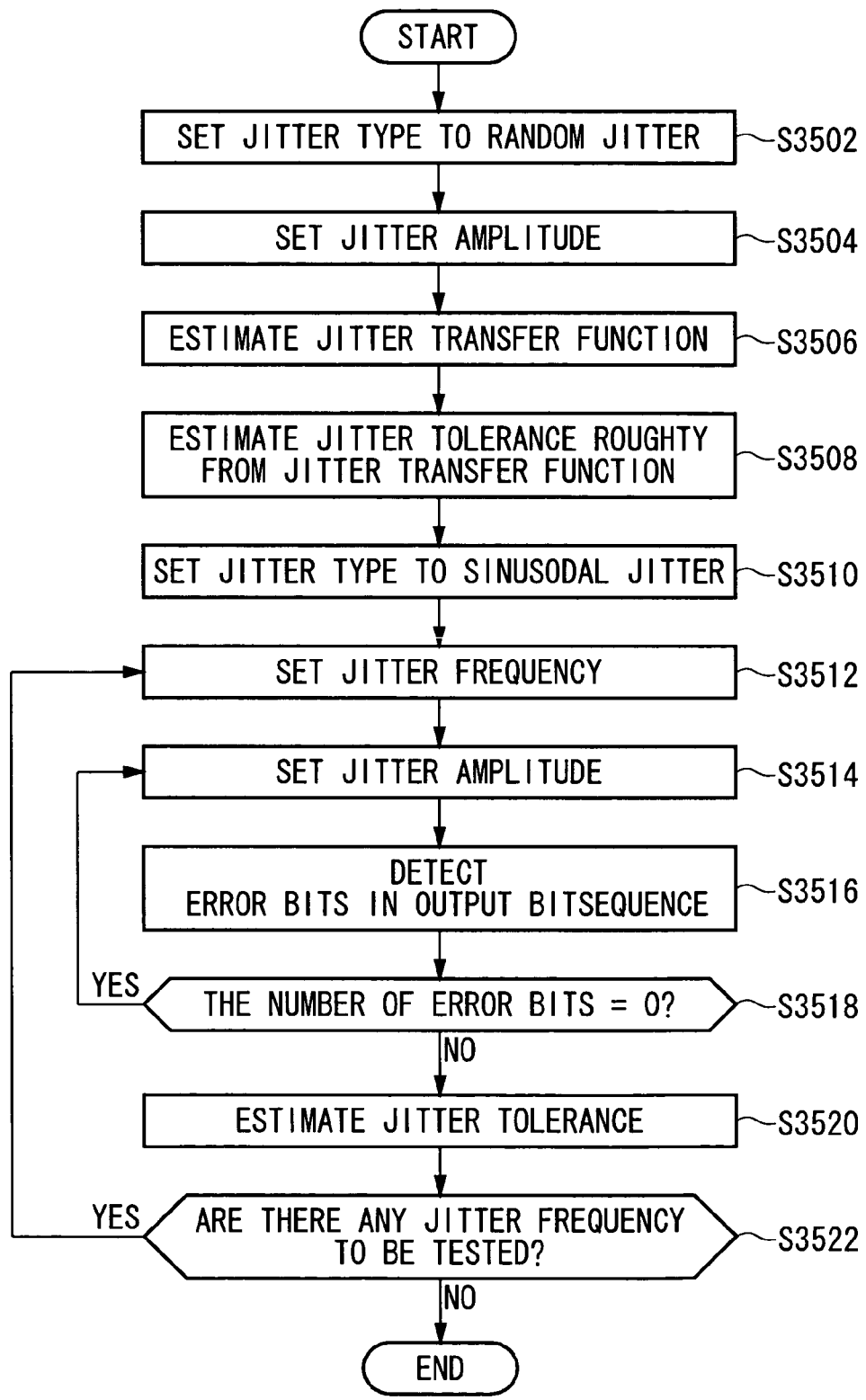
FIG. 72 is a flow chart exemplary showing operation of the measuring apparatus 100.

FIG. 72 is a flow chart exemplary showing operation of the measuring apparatus 100. First, in S3502, the signal input means 301 sets up a type of the input timing jitter which is applied to the input signal. Here, a random jitter is selected as the input timing jitter.

Next, in S3504, the signal input means 301 sets up amplitude of the input timing jitter. Then, the signal input means 301 inputs into the DUT 3000 the input pattern signal to which the input timing jitter is applied.

The jitter transfer function measuring apparatus 101 receives the input pattern signal input to the DUT 3000, and the output signal output from the DUT 3000 in response to the input pattern signal. Then in S3506, the jitter transfer function measuring apparatus 101 measures the jitter transfer function of the DUT 3000 based on the received input and output signals, as the same method as described above.

Next, in S3508, the jitter related transmission penalty estimator 4102 estimates the coarse value of the jitter tolerance of the DUT 3000 based on the gain estimates and phase estimates of the jitter transfer function. That is, the jitter related transmission penalty estimator 4102 estimates the jitter tolerance values which are estimated based on the jitter transfer function by the method mentioned above to be an approximated values of the jitter tolerance. Moreover, as mentioned above, since the jitter tolerance is estimated based on the jitter transfer function in S3508, the coarse values of the jitter tolerance over all the frequencies of the input timing jitter can be estimated.

Next, in S3510, the signal input means 301 sets up the type of the input timing jitter which is applied to the input signal. Here, a sinusoidal jitter is selected as the input timing jitter. Then in S3512, the signal input means 301 sets up frequency of the input timing jitter of which the jitter tolerance is to be measured. Next, in S3514, the signal input means 301 sets up amplitude of the input timing jitter at the amplitude in accordance with the value of the jitter tolerance estimated by the jitter related transmission penalty estimator 4102. For example, the signal input means 301 sets up the amplitude of the input timing jitter in the vicinity of the amplitude value of the input timing jitter corresponding to the coarse value of the jitter tolerance estimated by the jitter related transmission penalty estimator 4102, applies it to the input pattern signal, and inputs it into the DUT 3000.

The bit error detector 3500 receives the output signal output from the DUT 3000 in response to the input pattern signal. Then in S3516, the bit error detector 3500 detects the bit error in the output signal by comparing each bit of the reference pattern signal which the DUT 3000 is expected to output in response to the input signal, with each bit of the output signal which the DUT 3000 actually outputs. Alternatively, the output signal is, for example, a data signal output from the DUT 3000, and the bit error detector 3500 detects the value of each bit of the data signal by sampling the data signal at the rising edge of the clock signal which the DUT 3000 outputs synchronizing with the data signal. Moreover, in yet alternative example, the bit error detector 3500 samples the data signal at the rising edge of another clock signal. Next, in S3518, it is judged whether the number of error bits detected by the bit error detector 3500 is zero. When the number of error bits is zero, the amplitude value of the input timing jitter is increased in S3514, and transaction of the steps S3514-S3518 is repeated until the bit error detector 3500 detects a bit error. When the number of error bits is larger than zero in S3518, the jitter related transmission penalty estimator 4102 sets the amplitude of the input timing jitter as the jitter tolerance value of the DUT 3000 (S3520).

Next, in S3522, it is judged whether there remain other frequencies of the input timing jitter which are to be tested, and if there remains a frequency band which is to be tested, the frequency of the input timing jitter is changed in S3512, and transaction of the steps S3512-S3522 is repeated. The transaction is ended after all the frequencies have been tested.

By such transactions, the measuring apparatus 100 measures the coarse value of the jitter tolerance rapidly based on the jitter transfer function, and measures the jitter tolerance value accurately based on the rough jitter tolerance estimate. For this reason, the measuring apparatus 100 can measure the jitter tolerance rapidly and accurately.

Figure 73:
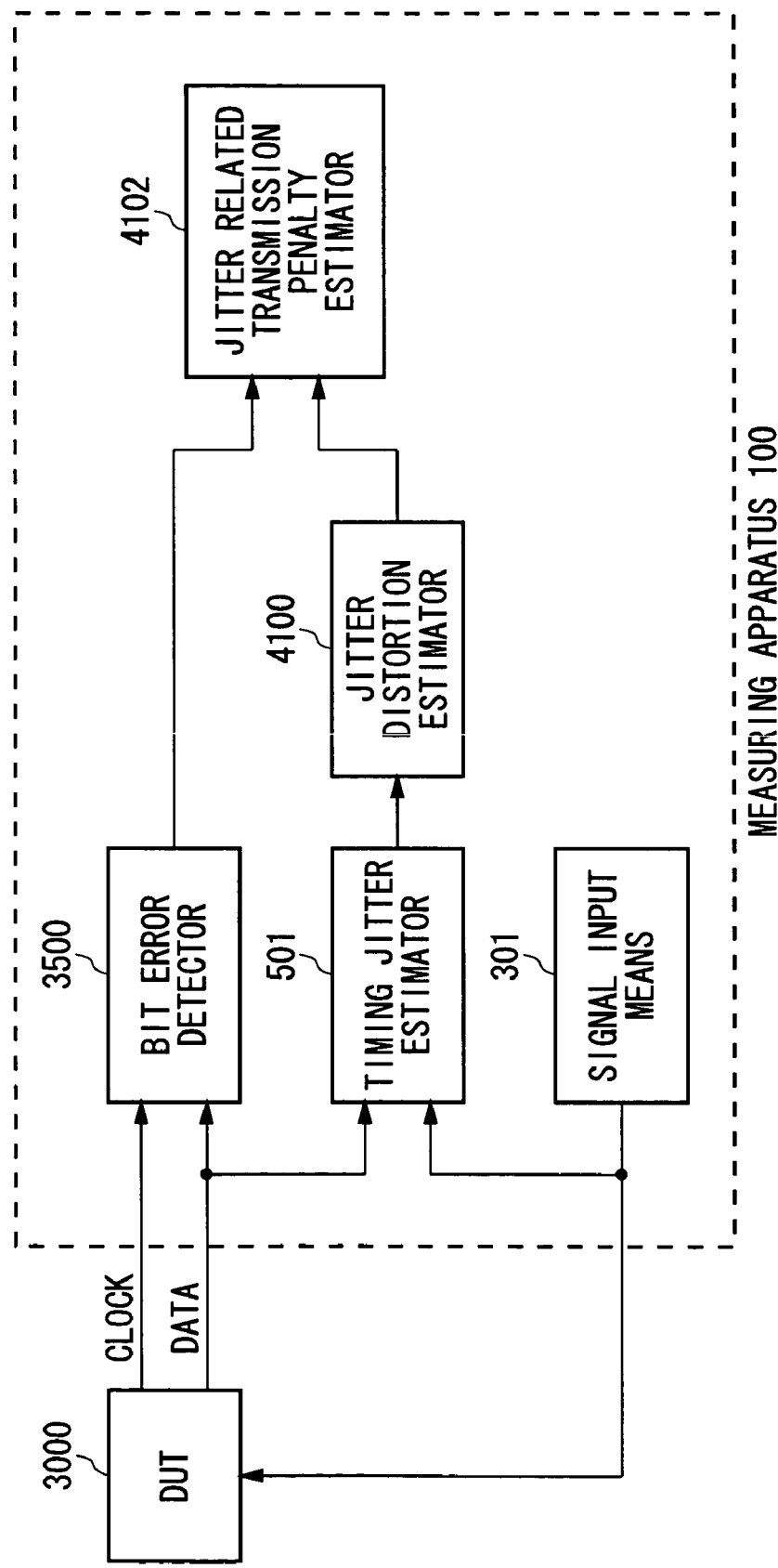
FIG. 73 shows yet another example of a configuration of the measuring apparatus 100.

FIG. 73 shows yet another example of a configuration of the measuring apparatus 100. The measuring apparatus 100 in this example includes the timing jitter estimator 501 and the jitter distortion estimator 4100, instead of the jitter transfer function measuring apparatus 101 in the configuration of the measuring apparatus 100 explained in reference with FIG. 71. The timing jitter estimator 501 and the jitter distortion estimator 4100 have the same or similar function and configuration as/to that of the timing jitter estimator 501 and the jitter distortion estimator 4100 explained in reference with FIG. 62.

Like the measuring apparatus 100 explained in FIG. 71, the measuring apparatus 100 in this example measures a coarse value of the jitter tolerance of the DUT 3000 based on spectrum of the output timing jitter, and measures the jitter tolerance value accurately based on the coarse value of the measured jitter tolerance.

As for the measuring apparatus 100 in this example in S3506 of FIG. 72, the timing jitter estimator 501 estimates the output timing jitter. Then, the jitter distortion estimator 4100 estimates distortion of the output timing jitter based on the spectrum of the output timing jitter. Then, in S3508, the jitter related transmission penalty estimator 4102 estimates the coarse value of the jitter tolerance based on the jitter distortion. These transactions are the same as those of the measuring apparatus 100 explained in FIG. 62. Moreover, as for the steps S3502-S3504 and S3512-S3522 explained in FIG. 72, the same transactions as the measuring apparatus 100 explained in FIG. 71 are performed. Also, by the measuring apparatus 100 in this example, the jitter tolerance is measured rapidly and accurately.

Moreover, the jitter related transmission penalty estimator 4102 in this example may change the amplitude of the input timing jitter until the bit error detector 3500 detects a bit error, and estimates peak-to-peak value of the input timing jitter, above which the bit error detector starts to detect a bit error, to be the jitter tolerance. Or the jitter tolerance can be calculated based on the jitter distortion of the output timing jitter.

For example, the jitter related transmission penalty estimator 4102 determines which method is to be chosen for calculating the jitter tolerance in accordance with the control band of the PLL in the DUT 3000. Here, the control band of the PLL is the band of the jitter frequency where the jitter is corrected by the PLL. That is, since there is high possibility that the bit error in the output signal is caused by the jitter in the PLL when the frequency of the input timing jitter is the frequency in the control band of the PLL, the jitter related transmission penalty estimator 4102 calculates the jitter tolerance based on the jitter distortion of the output timing jitter. Moreover, since there is high possibility that the bit error in the output signal is caused by the sampling error of the data signal or the like when the frequency of the input timing jitter is the frequency outside the control band of the PLL, the jitter tolerance is calculated based on the bit error detection result of the bit error detector 3500.

Although the present invention has been described by way of exemplary embodiments, it should be understood that those skilled in the art might make many changes and substitutions without departing from the spirit and the scope of the present invention which is defined only by the appended claims. Also, it should be understood that the measuring apparatus and measuring method of the present invention might also measure or test network system including optical devices. That is, network system including circuits, electronic devices, optical devices, and other systems maybe included in the scope of the electronic device of the present invention which is defined only by the appended claims. Moreover, circuits, electronic devices, and systems, which include devices such as optical devices inside, may be included in the scope of the electronic device of the present invention which is defined only by the appended claims.

As is apparent from the above, according to the present invention, the bit error rate and the jitter tolerance of the DUT can be calculated efficiently. According to the measuring apparatus and the measuring method of the present invention, the test time can be minimized because the bit error rate is estimated from the timing jitter sequence and therefore no histogram operation is required. Therefore, the cost of the bit error rate test can be greatly reduced.

What is claimed is:

1. A measuring apparatus for measuring jitter transfer function of an electronic device, comprising:
   a timing jitter estimator operable to calculate an output timing jitter sequence of an output signal based on said output signal output from said electronic device; and
   a jitter transfer function estimator operable to calculate jitter transfer function of said electronic device based on said output timing jitter sequence.

2. A measuring apparatus as claimed in claim 1, wherein said timing jitter estimator comprises:
   an instantaneous phase noise estimator operable to calculate an instantaneous phase noise of said output signal based on said output signal; and
   a resampler operable to generate said output timing jitter sequence obtained by resampling said instantaneous phase noise at predetermined timings.

3. A measuring apparatus as claimed in claim 2, wherein said resampler resamples said instantaneous phase noise at timings approximately same as zero-crossing timings of said output signal.

4. A measuring apparatus as claimed in claim 1, wherein said electronic device receives a plurality of input signals having different jitter amounts and outputs said plurality of output signals respectively corresponding to said plurality of input signals,
   said timing jitter estimator calculates said output timing jitter sequences corresponding to said output signals respectively, and
   said jitter transfer function estimator calculates said jitter transfer function further based on said information indicating a plurality of input timing jitter sequences corresponding to said plurality of input signals.

5. A measuring apparatus as claimed in claim 1, wherein said electronic device receives a plurality of input signals having different jitter amounts one after another and outputs a plurality of said output signals respectively corresponding to said input signals,
   said timing jitter estimator receives said plurality of input signals one after another and calculates a plurality of input timing jitter sequences of said plurality of input signals, and receives said plurality of output signals one after another and calculates said output timing jitter sequences of said output signals respectively, and
   said jitter transfer function estimator calculates said jitter transfer function further based on said input timing jitter sequences.

6. A measuring apparatus as claimed in claim 4 or 5, further comprising a frequency-domain transformer operable to transform said input timing jitter sequences and said output timing jitter sequences to frequency domain signals.

7. A measuring apparatus claimed in claim 6, wherein said jitter transfer function estimator comprises a jitter gain estimator operable to calculate a gain $|H_J(f_J)|$ of said jitter transfer function based on the following Equation:

$$|H_J(f_J)| = \left|\frac{\Delta\Phi[f_J]}{\Delta\Theta[f_J]}\right| \text{ or } |H_J(f_J)| = \left|\frac{\Delta\Phi(f_J)}{\Delta\Theta(f_J)}\right|$$

where $\Delta\Phi[f_J]$ is an output timing jitter spectra of the output signal; $\Delta\Theta[f_J]$ is an input timing jitter spectra of the input signal; $\Delta\Phi(f_J)$ is a phase noise spectra of the output signal; and $\Delta\Theta(f_J)$ is a phase noise spectra of the input signal.

8. A measuring apparatus as claimed in claim 5, wherein said jitter transfer function estimator comprises a jitter gain estimator operable to calculate a gain of said jitter transfer function based on said plurality of input timing jitter sequences and said plurality of output timing jitter sequences.

9. A measuring apparatus as claimed in claim 8, wherein said jitter gain estimator calculates said gain of said jitter transfer function based on a result of linear fitting of a relationship between a peak-to-peak value of an input timing jitter of said plurality of input timing jitter sequences and a peak-to-peak value of an output timing jitter of said plurality of output timing jitter sequences, or a root-mean-square (RMS) value of said output timing jitter of said output timing jitter sequences and a root-mean-square value of an input timing jitter of said plurality of input timing jitter sequences.

10. A measuring apparatus as claimed in claim 6, wherein said jitter transfer function estimator comprises a jitter phase estimator operable to calculate a phase $\angle H_J(f_J)$ of said jitter transfer function based on the following Equation:

$$< H_J(f_J) = \tan^{-1}\frac{\text{Im}[H_J(f_J)]}{\text{Re}[H_J(f_J)]}$$

where $\Delta\Phi[f_J]$ is an output timing jitter spectra of the output signal; $\Delta\Theta[f_J]$ is an input timing jitter spectra of the input signal; $\Delta\Phi(f_J)$ is a phase noise spectra of the output signal; and $\Delta\Theta(f_J)$ is a phase noise spectra of the input signal.

11. A measuring apparatus as claimed in claim 5 or 8, further comprising a jitter applying unit operable to supply a signal, which is obtained by applying said desired input timing jitter to said input signal, to said electronic device,
wherein said jitter gain estimator estimates said gain of said jitter transfer function based on said input timing jitter applied to said input signal by said jitter applying unit and said output timing jitter in said output signal.

12. A measuring apparatus as claimed in claim 11, wherein said jitter applying unit applies a sinusoidal jitter to said input signal as said input timing jitter.

13. A measuring apparatus as claimed in claim 12, wherein said jitter applying unit applies said input timing jitter by modulating a phase of said input signal.

14. A measuring apparatus as claimed in claim 12, wherein said jitter applying unit applies said input timing jitter by modulating a frequency of said input signal.

15. A measuring apparatus as claimed in claim 1, further comprising a clock recovery unit operable to generate a recovered clock signal of said output signal based on said output signal,
wherein said timing jitter estimator estimates said output timing jitter based on said recovered clock signal.

16. A measuring apparatus as claimed in claim 2, wherein said instantaneous phase noise estimator comprise:
an analytic signal transformer operable to transform said output signal to a complex analytic signal;
an instantaneous phase estimator operable to estimate an instantaneous phase of said analytic signal based on said analytic signal;
a linear instantaneous phase estimator operable to estimate a linear instantaneous phase of said output signal based on an instantaneous phase of said analytic signal; and
a linear trend remover operable to calculate an instantaneous phase noise obtained by removing said linear instantaneous phase from said instantaneous phase based on said instantaneous phase and said linear instantaneous phase.

17. A measuring apparatus as claimed in claim 16, wherein said timing jitter estimator further comprises a low frequency phase noise remover operable to receive said instantaneous phase noise, removes low frequency components of said instantaneous phase noise and supplies said instantaneous phase noise with no low frequency component to said resampler.

18. A measuring apparatus as claimed in claim 16, wherein said timing jitter estimator further comprises an analog-to-digital converter operable to convert said output signal to a digital signal and supplies said digital signal to said analytic signal transformer,
wherein said analytic signal transformer generates said analytic signal based on said digital signal.

19. A measuring apparatus as claimed in claim 1, wherein
said timing jitter estimator estimates a timing jitter sequence of input data clock signal for generating input data signal given to said electronic device, and a timing jitter sequence of output data signal output from said electronic device in response to said input data signal, and
said jitter transfer function measuring apparatus measures jitter transfer function between said input data clock signal and said output data signal based on said timing jitter sequence estimated by said timing jitter estimator.

20. A measuring apparatus as claimed in claim 1, wherein
said timing jitter estimator estimates a timing jitter sequence of an input data signal given to said electronic device and an output data signal output from said electronic device in response to said input data signal, and
said jitter transfer function measuring apparatus measures a jitter transfer function between said input data signal and said output data signal based on said timing jitter sequence estimated by said timing jitter estimator.

21. A measuring apparatus as claimed in claim 1, wherein
said timing jitter estimator estimates timing jitter sequence of input data signal given to said electronic device and recovered clock signal output from said electronic device in response to said input data, and
said jitter transfer function measuring apparatus measures a jitter transfer function between said input data signal and said recovered clock signal based on said timing jitter sequence estimated by said timing jitter estimator.

22. A measuring apparatus as claimed in claim 1, wherein
said timing jitter estimator estimates a timing jitter sequence of an input data clock signal for generating the input data signal given to said electronic device, and a recovered clock signal output from said electronic device in response to said input data, and
said jitter transfer function measuring apparatus measures a jitter transfer function between said input data clock signal and said recovered clock signal based on said timing jitter sequence estimated by said timing jitter estimator.

23. A measuring apparatus as claimed in any of claims 19-22, wherein
said electronic device receives serial data as said input data signal, and outputs a parallel data as said output data signal from output pins, the number of output pins being predetermined,
said timing jitter estimator estimates said output timing jitter sequence of said output data signal according to data output from a certain output pin out of said output pins, and
said input unit supplies said input data signal to said electronic device, in which a bit of the pattern data corresponding to the certain output pin out of said output pins repeats 1 (high) and 0 (low) by turns.

24. A measuring apparatus as claimed in claim 23, wherein said input unit supplies said input data signal to said electronic device, in which bits of the pattern data repeats 1 and 0 every bits same number as said output pins.

25. A measuring apparatus for measuring a bit error rate of an electronic device, comprising a bit error rate estimator operable to estimate said bit error rate of said electronic device based on a gain of jitter transfer function of said electronic device.

26. A measuring apparatus as claimed in claim 25, wherein said bit error rate estimator estimates said bit error rate further based on a phase of said jitter transfer function.

27. A measuring apparatus for measuring jitter tolerance of an electronic device, comprising a jitter tolerance estimator operable to estimate said jitter tolerance of said electronic device based on a gain of jitter transfer function of said electronic device.

28. A measuring apparatus as claimed in claim 27, wherein said jitter tolerance estimator estimates said jitter tolerance further based on a phase of said jitter transfer function.

29. A measuring apparatus as claimed in claim 27 or 28, wherein
said jitter tolerance estimator estimates a coarse value of the jitter tolerance based on the gain estimate of the jitter transfer function, and
the measuring apparatus further comprises
a signal input means operable to input into the electronic device the plurality of input signals to which timing jitter having different amplitudes in the vicinity of an amplitude value in accordance with the coarse value of the jitter tolerance are applied one after another, and
a bit error detector operable to detect bit error in the output signal by comparing each bit of a reference signal, which the electronic device is to output in response to the input signal to which the timing jitter is applied, with each bit of the output signal which the electronic device outputs in accordance with the input signal, and
said jitter tolerance estimator estimates peak-to-peak value of the input timing jitter, above which said bit error detector starts to detect the bit error in the output signal, the input timing jitter corresponding to the jitter tolerance.

30. The measuring apparatus as claimed in claim 29, wherein
said bit error detector samples data signal output from the electronic device at the edge of the clock signal output from the electronic device, converts the data signal into a logic valued sequence (data sequence), and compares each bit of the detected data sequence with each bit of the given reference pattern signal.

31. A measuring apparatus as claimed in claim 27 or 28, further comprising:
a jitter applying unit operable to supply a first check signal, to which a timing jitter is applied, to said electronic device, the timing jitter having amplitude according to said jitter tolerance estimated by said jitter tolerance estimator;
a jitter distortion estimator operable to estimate jitter distortion of an output timing jitter of said output signal output from said electronic device according to said first check signal, against an ideal timing jitter of said output signal which said electronic device is to output according to said first check signal; and
a judging unit operable to judge whether said jitter tolerance is a right value based on said jitter distortion.

32. A measuring apparatus as claimed in claim 31, wherein when said judging unit judges that said jitter tolerance estimated by said jitter tolerance estimator is not a right value,
said jitter applying unit supplies a second check signal, to which a timing jitter is applied, to said electronic device, the timing jitter having smaller amplitude than said first check signal,
said jitter distortion estimator estimates jitter distortion of an output timing jitter of said output signal output from said electronic device according to said second check signal, against an ideal timing jitter of said output signal which said electronic device is to output according to said second check signal, and
said judging unit newly estimates said jitter tolerance based on said jitter distortion, estimated by said jitter distortion estimator, and corresponding to said second check signal.

33. A measuring apparatus for measuring a bit error rate of an electronic device, comprising:
a timing estimator operable to estimate an input timing sequence of an input signal for testing said electronic device and an output timing sequence of an output signal output from said electronic device in response to said input signal;
a timing difference estimator operable to calculate timing differences between said input timing sequence and said output timing sequence; and
a bit error rate estimator operable to estimate said bit error rate of said electronic device based on said timing differences.

34. A measuring apparatus as claimed in claim 33, wherein said timing estimator estimates said input timing sequence and said output timing sequence based on a zero-crossing timing sequence of rising edges or falling edges of said input signal and said output signal.

35. A measuring apparatus as claimed in claim 33, wherein said timing estimator comprises:
an analytic signal transformer operable to transform said input signal and said output signal into complex analytic signals;
an instantaneous phase estimator operable to calculate instantaneous phases of said analytic signals; and
a resampler operable to resample said instantaneous phase to generate timing sequences of said input signal and said output signal.

36. A measuring method for measuring jitter transfer function of an electronic device, comprising:
a timing jitter estimation step of calculating an output timing jitter sequence, which indicates a plurality of output timing jitter of an output signal, based on said output signal output from said electronic device; and a jitter transfer function estimation step of calculating jitter transfer function of said electronic device based on said output timing jitter sequence.

37. A measuring method for measuring a bit error rate of an electronic device, comprising a bit error rate estimation step of estimating said bit error rate of said electronic device based on a gain of jitter transfer function of said electronic device.

38. A measuring method for measuring jitter tolerance of an electronic device, comprising a jitter tolerance estimation step of estimating said jitter tolerance of said electronic device based on a gain of jitter transfer function of said electronic device.

39. A measuring method for measuring a bit error rate of an electronic device, comprising:
 estimating an input timing sequence of an input signal for testing said electronic device and an output timing sequence of an output signal output from said electronic device in response to said input signal;
 calculating timing differences between said input timing sequence and said output timing sequence; and
 estimating said bit error rate of said electronic device based on said timing differences.

40. A measuring apparatus for measuring reliability of an electronic device against jitter, comprising:
 a timing jitter estimator operable to estimate an output timing jitter sequence of an output signal based on said output signal output from said electronic device in response to an input signal to which an input timing jitter is applied;
 a jitter distortion estimator operable to estimate jitter distortion of an output timing jitter of said output signal output from said electronic device in response to said input signal, against an ideal timing jitter of said output signal which said electronic device is to output in response to said input signal based on said output timing jitter sequence; and
 a jitter related transmission penalty estimator operable to estimate said reliability of said electronic device against jitter based on said jitter distortion.

41. A measuring apparatus as claimed in claim 40, further comprising a jitter applying unit operable to apply said input timing jitter, having a desired amplitude, to said input signal, and to supply said input signal to said electronic device, wherein
 said jitter related transmission penalty estimator estimates said reliability of said electronic device against jitter about amplitude of said input timing jitter.

42. A measuring apparatus as claimed in claim 41, wherein said jitter applying unit supplies said plurality of input signals, having different amplitudes of said input timing jitter, to said electronic device, and
 said jitter related transmission penalty estimator estimates jitter tolerance of said electronic device based on jitter distortion of each of said output timing jitter against said plurality of input signals.

43. A measuring apparatus as claimed in claim 40, wherein said jitter tolerance estimator estimates a coarse value of the jitter tolerance based on jitter distortion of the output timing jitter, and
 the measuring apparatus further comprises
 a signal input means operable to input into the electronic device the input signals to which timing jitter having different amplitudes in the vicinity of an amplitude value in accordance with the coarse value of the jitter tolerance are applied one after another, and
 a bit error detector operable to detect bit error in the output signal by comparing each bit of a reference pattern signal, which the electronic device is to output in response to the input signal to which the timing jitter is applied, with each bit of the output signal which the electronic device outputs in accordance with the input signal, and
 said jitter tolerance estimator estimates peak-to-peak value of the input timing jitter, above which said bit error detector starts to detect the bit error in the output signal, the input timing jitter corresponding to the jitter tolerance.

44. A measuring apparatus as claimed in claim 42, further comprising
 a signal input means operable to apply an input timing jitter to the input signal and
 a bit error detector operable to detect bit error in the output signal by comparing each bit of a reference pattern signal, which the electronic device is to output in response to the input signal to which the timing jitter is applied, with each bit of the output signal which the electronic device outputs in accordance with the input signal, and
 said jitter related transmission penalty estimator selectively changes an amplitude of the input timing jitter until said bit error detector detects the bit error, and estimates peak-to-peak value of the input timing jitter, above which said bit error detector starts to detect the bit error, the input timing jitter giving the jitter tolerance, or selectively calculates the jitter tolerance based on the jitter distortion of the output timing jitter.

45. The measuring apparatus as claimed in claim 44, wherein
 said bit error detector samples data signal output from the electronic device at the edge of the clock signal output from the electronic device, converts the data signal into a logic valued sequence (data sequence), and compares each bit of the detected data sequence with each bit of the given reference pattern signal.

46. A measuring apparatus as claimed in claim 41 or 42, wherein
 said jitter applying unit applies a sinusoidal jitter to said input signal, and
 said jitter distortion estimator generates a jitter histogram of said output timing jitter sequence, and calculates jitter distortion of said output timing jitter based on said jitter histogram.

47. A measuring apparatus as claimed in claim 41 or 42, wherein
 said jitter applying unit applies a sinusoidal jitter to said input signal, and
 said jitter distortion estimator estimates a jitter spectrum of said output timing jitter sequence, and calculates jitter distortion of said output timing jitter based on said jitter spectrum.

48. A measuring apparatus as claimed in claim 47, wherein said jitter distortion estimator estimates jitter distortion of said output timing jitter based on ratio of fundamental frequency content of said jitter spectrum, having the same frequency as said sinusoidal jitter, and harmonic content of said fundamental frequency content in said jitter spectrum.

49. A measuring apparatus as claimed in claim 42, wherein
 said jitter distortion estimator estimates amplitude of said output timing jitter against said plurality of sinusoidal jitters having different amplitude, and
 said jitter related transmission penalty estimator estimates said jitter tolerance based on amplitude of said sinusoidal jitter, where the amplitude of said output timing jitter, in response to amplitude of said sinusoidal jitter, becomes nonlinear.

50. A measuring apparatus as claimed in claim 41, wherein
said jitter applying unit supplies said input signal to said electronic device, where said plurality of sinusoidal jitters having different frequency are applied to said input signal, and said jitter related transmission penalty estimator estimates said reliability of said electronic device against jitter about every frequency of said sinusoidal jitter.

51. A measuring apparatus as claimed in claim 1 or 40, wherein said timing jitter estimator comprises:

a period jitter estimator operable to estimate period jitter sequence of said output signal;

an ideal edge timing estimator operable to estimate average period of said period jitter sequence; and an edge timing error estimation unit operable to estimate said output timing jitter sequence based on said average period of said period jitter sequence and said period jitter sequence.

52. A measuring method for measuring reliability of an electronic device against jitter, comprising:

a timing jitter estimation step for estimating an output timing jitter sequence of an output signal based on said output signal output from said electronic device in response to an input signal to which an input timing jitter is applied;

a jitter distortion estimation step for estimating jitter distortion of an output timing jitter of said output signal output from said electronic device in response to said input signal, against an ideal timing jitter of said output signal which said electronic device is to output in response to said input signal based on said output timing jitter sequence; and a jitter related transmission penalty estimation step for estimating said reliability of said electronic device against jitter based on said jitter distortion.

53. A measuring apparatus for measuring jitter transfer function of an electronic device, comprising:

a timing jitter estimator operable to estimate an output instantaneous phase noise of said output signal based on an output signal output from said electronic device; and a jitter transfer function measuring apparatus operable to measure a jitter transfer function in said electronic device based on said output instantaneous phase noise.

* * * * *